US007947421B2

(12) United States Patent
Kanda

(10) Patent No.: US 7,947,421 B2
(45) Date of Patent: May 24, 2011

(54) POSITIVE RESIST COMPOSITION FOR IMMERSION EXPOSURE AND PATTERN-FORMING METHOD USING THE SAME

(75) Inventor: Hiromi Kanda, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 572 days.

(21) Appl. No.: 11/335,735

(22) Filed: Jan. 20, 2006

(65) Prior Publication Data

US 2006/0166136 A1 Jul. 27, 2006

(30) Foreign Application Priority Data

Jan. 24, 2005 (JP) .............................. P.2005-015903

(51) Int. Cl.
*G03F 7/004* (2006.01)
*G03F 7/30* (2006.01)

(52) U.S. Cl. ..................... 430/270.1; 430/326; 430/905; 430/907; 430/910

(58) Field of Classification Search ............... 430/270.1, 430/905, 910, 326, 907
See application file for complete search history.

(56) References Cited

U.S. PATENT DOCUMENTS

| | | | | |
|---|---|---|---|---|
| 6,579,659 | B2 * | 6/2003 | Uetani et al. | 430/270.1 |
| 6,602,646 | B1 * | 8/2003 | Sato et al. | 430/270.1 |
| 7,195,856 | B2 * | 3/2007 | Mizutani et al. | 430/270.1 |
| 2002/0048720 | A1 | 4/2002 | Sasaki et al. | |
| 2003/0068573 | A1 * | 4/2003 | Takata et al. | 430/270.1 |
| 2003/0180659 | A1 * | 9/2003 | Takata et al. | 430/270.1 |
| 2003/0232277 | A1 * | 12/2003 | Sasaki et al. | 430/270.1 |
| 2004/0005512 | A1 * | 1/2004 | Mizutani et al. | 430/270.1 |
| 2005/0048402 | A1 * | 3/2005 | Mizutani et al. | 430/281.1 |
| 2005/0227174 | A1 * | 10/2005 | Hatakeyama et al. | 430/270.1 |
| 2006/0094817 | A1 | 5/2006 | Harada et al. | |
| 2007/0190448 | A1 | 8/2007 | Ishiduka et al. | |
| 2008/0032241 | A1 | 2/2008 | Momose et al. | |

FOREIGN PATENT DOCUMENTS

| | | | |
|---|---|---|---|
| EP | 0930541 | A1 | 7/1999 |
| JP | 57-153433 | A | 9/1982 |
| JP | 7-220990 | A | 8/1995 |
| JP | 2004-220009 | A | 8/2004 |
| JP | 2004-226559 | A | 8/2004 |
| JP | 2005-284238 | A | 10/2005 |
| JP | 2006-124314 | A | 5/2006 |
| WO | WO 2004/068242 | A1 | 8/2004 |
| WO | WO 2004/077158 | A1 | 9/2004 |
| WO | 2006/028071 | A1 | 3/2006 |

OTHER PUBLICATIONS

J. A. Hoffnagle, "Liquid Immersion Deep-Ultraviolet Interferometric Lithography", J. Vac. Sci. Technol. B 17(6), Nov./Dec. 1999 pp. 3306-3309.
B.J. Lin, "Semiconductor Foundry, Lithography, and Partners", Proceedings of SPIE vol. 4688 (2002) pp. 11-24.
Extended European Search Report in Application 06001309.1 dated Aug. 2, 2010 8 pages.
Japanese Office Action issued on Oct. 5, 2010 in the corresponding Japanese Patent Application No. 2006-015347.

* cited by examiner

*Primary Examiner* — John S Chu
(74) *Attorney, Agent, or Firm* — Sughrue Mion, PLLC

(57) ABSTRACT

A positive resist composition for immersion exposure comprising: (A) a resin having an alicyclic hydrocarbon structure, wherein the resin is capable of increasing a solubility of the resin (A) in an alkaline developer by an action of an acid; and (B) a compound capable of generating an acid upon irradiation with one of an actinic ray and radiation, wherein the resin (A) includes a component having a molecular weight of 1,000 or less in an area ration of 20% or less to an entire area in a pattern area by gel permeation chromatography, and a pattern-forming method using the same.

12 Claims, No Drawings

POSITIVE RESIST COMPOSITION FOR IMMERSION EXPOSURE AND PATTERN-FORMING METHOD USING THE SAME

BACKGROUND OF THE INVENTION

1. Field of the Invention

The present invention relates to a resist composition for use in a manufacturing process of semiconductor devices, such as IC, manufacture of circuit substrates for liquid crystals, thermal heads and the like, and lithographic processes of other photo-fabrication, and also the invention relates to a pattern-forming process using the same. In particular, the invention relates to a resist composition suitable for exposure by an immersion projection exposure apparatus with far ultraviolet rays of the wavelength of 300 nm or less as the light source, and a pattern-forming process using the same.

2. Description of the Related Art

With the progress of fining of semiconductor elements, shortening of the wavelengths of exposure light source and increasing of the numerical aperture (high NA) of projection lens have advanced, and now exposure apparatus of NA 0.84 using an ArF excimer laser having the wavelength of 193 nm as the light source have been developed, which can be expressed by the following expressions as generally known:

$$(\text{Resolution})=k_1\cdot(\lambda/NA)$$

$$(\text{Depth of focus})=\pm k_2\lambda/NA^2$$

wherein λ is the wavelength of exposure light source, NA is the numerical aperture of the projection lens, and $k_1$ and $k_2$ are the coefficients concerning the process.

For further higher resolution by the shortening of wavelengths, an exposure apparatus with an $F_2$ excimer laser having the wavelength of 157 nm as the light source has been studied, but the materials of lens for use in the exposure apparatus for the shortening of wavelengths and the materials of resist are extremely restricted, so that the realization of the reasonable manufacturing costs of the apparatus and materials and quality stabilization are very difficult, as a result, there are possibilities of missing an exposure apparatus and a resist having sufficient performances and stabilities within a required period of time.

As a technique for increasing resolution in optical microscopes, a so-called immersion method of filling a liquid of high refractive index (hereinafter also referred to as "immersion liquid") between a projection lens and a sample has been conventionally known.

As "the effect of immersion", the above resolution and depth of focus can be expressed by the following expressions in the case of immersion, with $\lambda_0$ as the wavelength of the exposure light in the air, n as the refractive index of immersion liquid to the air, and $NA_0$=sin θ with θ as convergence half angle of the ray of light:

$$(\text{Resolution})=k_1\cdot(\lambda_0/n)/NA_0$$

$$(\text{Depth of focus})=\pm k_2\cdot(\lambda_0/n)/NA_0^2$$

That is, the effect of immersion is equivalent to the case of using exposure wavelength of the wavelength of 1/n. In other words, in the case of the projection optical system of the same NA, the depth of focus can be made n magnifications by immersion. This is effective for every pattern form, further, this can be combined with super resolution techniques such as a phase shift method and a deformation lighting method now under discussion.

As the example of apparatus applying this effect to the transfer of a micro-fine pattern of a semiconductor element, JP-A-57-153433, the term "JP-A" as used herein refers to an "unexamined published Japanese patent application" and JP-A-7-220990 are known, but resists suitable for immersion exposure techniques are not disclosed in these patents.

The latest technical progress of immersion exposure is reported in SPIE Proc., 4688, 11 (2002), J. Vac. Sci. Tecnol. B, 17 (1999), WO 2004/068242 and WO 2004/077158. When an ArF excimer laser is used as the light source, it is thought that pure water (having a refractive index of 1.44 at 193 nm) is most promising as the immersion liquid in the light of the safety in handling, the transmittance and the refractive index at 193 nm. When an $F_2$ excimer laser is used as the light source, a solution containing fluorine is discussed from the balance of the transmittance and the refractive index at 157 nm, but a sufficiently satisfactory solution from the viewpoint of the environmental safety and at the point of refractive index has not been found yet. From the extent of the effect of immersion and the degree of completion of resist, it is thought that immersion exposure technique will be carried on an ArF exposure apparatus earliest.

From the advent of the resist for a KrF excimer laser (248 nm) on, an image-forming method that is called chemical amplification is used as the image-forming method of the resist for compensating for the reduction of sensitivity by light absorption. To explain the image-forming method of positive chemical amplification by example, this is an image-forming method of exposing a resist to decompose an acid generator in the exposed area to thereby generate an acid, utilizing the generated acid as the reactive catalyst to change an alkali-insoluble group to an alkali-soluble group by the bake after exposure (PEB: Post Exposure Bake), and removing the exposed area by alkali development.

It is appointed that a resist layer is brought into contact with an immersion liquid at the time of exposure in immersion exposure, so that the resist layer decomposes and ingredients that adversely influence the immersion liquid ooze from the resist layer. WO 2004/068242 discloses that the resist performance decomposes by the immersion of a resist for ArF exposure in water before and after exposure and appoints this is a problem in immersion exposure.

When a chemical amplification resist that is accompanied by no problem in lithography by general exposure is subjected to immersion exposure, the resist pattern collapse and the deterioration of profile are seen as compared with the time of dry exposure, so that the improvement is necessary.

On the other hand, a radiation-sensitive resin composition containing a resin having a specific structure and small in the degree of dispersion of molecular weight (Mw/Mn) is disclosed in JP-A-2004-220009.

SUMMARY OF THE INVENTION

In view of the problems of the related art of immersion exposure as described above, an object of the invention is to provide a resist composition suitable for immersion exposure improved in pattern profile and pattern collapse.

The invention is a positive resist composition for immersion exposure comprising the following constitution, thus the above object of the invention can be achieved.

(1) A positive resist composition for immersion exposure comprising:

(A) a resin having an alicyclic hydrocarbon structure, wherein the resin is capable of increasing a solubility of the resin (A) in an alkaline developer by an action of an acid; and (B) a compound capable of generating an acid upon irradiation with one of an actinic ray and radiation, wherein the resin (A) includes a component having a molecular weight of 1,000 or less in an area ration of 20% or less to an entire area in a pattern area by gel permeation chromatography.

(2) The positive resist composition as described in (1) above, wherein the resin (A) has a weight average molecular weight of from 7,000 to 50,000, and a degree of dispersion (weight average molecular weight/number average molecular weight) of 1.5 or less.

(3) The positive resist composition as described in (1) or (2) above, wherein the resin (A) is purified by a solvent fraction.

(4) The positive resist composition as described in any of (1) to (3) above, wherein the resin (A) is obtained by living radical polymerization.

(5) The positive resist composition as described in any of (1) to (4) above, wherein the resin (A) comprises (i) a repeating unit having a lactone group and (ii) a repeating unit capable of generating a leaving group having an alicyclic structure which is eliminated from the repeating unit (ii) by an action of an acid.

(6) The positive resist composition as described in any of (1) to (5) above, wherein the resin (A) comprises a fluorine atom.

(7) The positive resist composition as described in any of (1) to (6) above, which further comprises a basic compound having a structure represented by formula (A), (B), (C), (D) or (E):

(A)

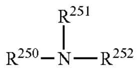

(B)

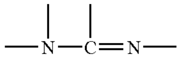

(C)

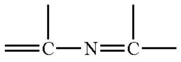

(D)

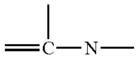

(E)

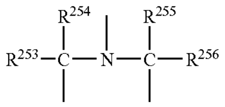

wherein in formulae (A) and (E), $R^{200}$, $R^{201}$ and $R^{202}$, which may be the same or different, each independently represents a hydrogen atom, an alkyl group having from 1 to 20 carbon atoms, a cycloalkyl group having from 1 to 20 carbon atoms or a substituted or unsubstituted aryl group having from 6 to 20 carbon atoms, and $R^{201}$ and $R^{202}$ may be bonded to each other to form a ring; and $R^{203}$, $R^{204}$, $R^{205}$ and $R^{206}$ each independently represents an alkyl group having from 1 to 6 carbon atoms or a cycloalkyl group having from 3 to 6 carbon atoms.

(8) The positive resist composition as described in any of (1) to (7) above, wherein the compound (B) capable of generating an acid has: an alkyl group having 4 or less carbon atoms substituted with a fluorine atom or an anionic structure containing an aromatic group substituted with a fluorine atom; and a triarylsulfonium cationic structure.

(9) The positive resist composition as described in any of (1) to (8) above, wherein the resist composition has a concentration of an entire solid content of from 2.0 to 6.0 mass %.

(10) The positive resist composition as described in any of (7) to (9) above, wherein a basic compound having a structure represented by formula (A), (B), (C), (D) or (E) does not comprise a hydroxyl group.

(11) A pattern-forming method comprising:

forming a resist film with a resist composition as described in any of (1) to (10) above;

immersion exposing the resist film, so as to form an exposed resist film; and developing the exposed resist film.

DETAILED DESCRIPTION OF THE INVENTION

The compounds for use in the invention will be described in detail below.

In the description of a group (an atomic group) in the specification of the invention, the description not referring to substitution or unsubstitution includes both a group not having a substituent and a group having a substituent. For example, "an alkyl group" includes not only an alkyl group having no substituent (an unsubstituted alkyl group) but also an alkyl group having a substituent (a substituted alkyl group).

(A) Resin Having an Alicyclic Hydrocarbon Structure Capable of Increasing the Solubility in an Alkaline Developer by the Action of an Acid The resist composition in the invention contains at least one repeating unit having an alicyclic hydrocarbon structure, and a resin capable of increasing the solubility in an alkaline developer by the action of an acid (hereinafter also referred to as resin (A)).

The resins capable of increasing the solubility in an alkaline developer by the action of an acid are resins having a group capable of decomposing by the action of an acid and generating an alkali-soluble group (hereinafter also referred to as "an acid-decomposable group") on the main chain or side chain, or both main chain and side chain. Of these resins, resins having an acid-decomposable group on the side chain are more preferred. Preferred acid-decomposable groups are groups obtained by substituting the hydrogen atom of a —COOH group or an —OH group with a group capable of being eliminated by the action of an acid. In the invention, acetal groups and tertiary ester groups are used as the acid-decomposable groups.

As the alicyclic hydrocarbon groups, groups having a monocyclic, bicyclic, tricyclic or tetracyclic skeleton can be exemplified. The number of carbon atoms of the alicyclic hydrocarbon groups is preferably from 6 to 30, especially preferably from 7 to 25.

As alicyclic parts in the invention, an adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group, and a cyclododecanyl group can be exemplified. More preferred groups are an adamantyl group, a decalin residue, a norbornyl group, a cedrol group, a cyclohexyl group, a cycloheptyl group, a cyclooctyl group, a cyclodecanyl group, a cyclododecanyl group and a tricyclodecanyl group.

As the substituents of these alicyclic hydrocarbon groups, an alkyl group, a halogen atom, a hydroxyl group, an alkoxyl group, a carboxyl group and an alkoxycarbonyl group are exemplified.

As the alkyl group, lower alkyl groups, e.g., a methyl group, an ethyl group, a propyl group, an isopropyl group and a butyl group are preferred, and more preferred groups are a methyl group, an ethyl group, a propyl group and an isopropyl group. As the alkoxyl group, alkoxyl groups having from 1 to 4 carbon atoms, e.g., a methoxy group, an ethoxy group, a propoxy group and a butoxy group are exemplified.

These substituents may further be substituted with a hydroxyl group, a halogen atom or an alkoxyl group.

It is preferred that resin (A) contains a repeating unit capable of generating a leaving group having an alicyclic structure, which is eliminated from the repeating unit by the action of an acid. As the repeating unit having a structure capable of generating a leaving group having an alicyclic structure, which is eliminated from the repeating unit by the action of an acid, it is preferred to contain at least one repeating unit selected from the group consisting of the repeating units having a partial structure containing alicyclic hydrocarbon represented by any of the following formulae (pI) to (pVI).

(pI)

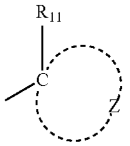

(pII)

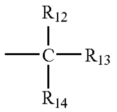

(pIII)

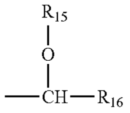

(PIV)

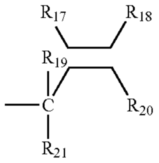

(pV)

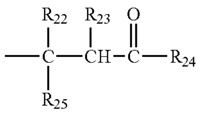

(pVI)

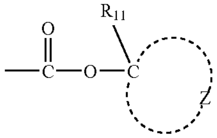

In the above formulae, $R_{11}$ represents a methyl group, an ethyl group, an n-propyl group, an isopropyl group, an n-butyl group, an isobutyl group, or a sec-butyl group; Z represents an atomic group necessary to form an alicyclic hydrocarbon group with a carbon atom; $R_{12}$, $R_{13}$, $R_{14}$, $R_{15}$ and $R_{16}$ each independently represents a straight chain or branched alkyl group having from 1 to 4 carbon atoms, or an alicyclic hydrocarbon group, provided that at least one of $R_{12}$ to $R_{14}$, or either $R_{15}$ or $R_{16}$ represents an alicyclic hydrocarbon group; $R_{17}$, $R_{18}$, $R_{19}$, $R_{20}$ and $R_{21}$ each independently represents a hydrogen atom, a straight chain or branched alkyl group having from 1 to 4 carbon atoms, or an alicyclic hydrocarbon group, provided that at least one of $R_{17}$ to $R_{21}$ represents an alicyclic hydrocarbon group, and either $R_{19}$ or $R_{21}$ represents a straight chain or branched alkyl group having from 1 to 4 carbon atoms, or an alicyclic hydrocarbon group; and $R_{22}$, $R_{23}$, $R_{24}$ and $R_{25}$ each independently represents a hydrogen atom, a straight chain or branched alkyl group having from 1 to 4 carbon atoms, or an alicyclic hydrocarbon group, provided that at least one of $R_{22}$ to $R_{25}$ represents an alicyclic hydrocarbon group, and $R_{23}$ and $R_{24}$ may be bonded to each other to form a ring In formulae (pI) to (pVI), the alkyl group represented by $R_{12}$ to $R_{25}$ may be a substituted or unsubstituted, and represents a straight chain or branched alkyl group having from 1 to 4 carbon atoms, e.g., a methyl group, an ethyl group, an n-propyl group, an isopropyl group, an n-butyl group, an isobutyl group, a sec-butyl group and a t-butyl group are exemplified.

As the examples of further substituents of the alkyl group, an alkoxyl group having from 1 to 4 carbon atoms, a halogen atom (a fluorine atom, a chlorine ion, a bromine ion, an iodine ion), an acyl group, an acyloxy group, a cyano group, a hydroxyl group, a carboxyl group, an alkoxycarbonyl group, and a nitro group can be exemplified.

The alicyclic hydrocarbon groups represented by $R_{11}$ to $R_{25}$ or the alicyclic hydrocarbon group formed by Z and carbon atoms may be monocyclic or polycyclic. Specifically, groups having a monocyclic, bicyclic, tricyclic or tetracyclic structure having 5 or more carbon atoms can be exemplified. The number of carbon atoms of these alicyclic hydrocarbon groups is preferably from 6 to 30, and especially preferably from 7 to 25. These alicyclic hydrocarbon groups may have a substituent.

Preferred alicyclic hydrocarbon group are an adamantly group, noradamantyl group, decalin residue, tricyclodecanyl group, tetracyclododecanyl group, norbornyl group, cedrol group, cyclohexyl group, cycloheptyl group, cyclooctyl group, cyclodecanyl group, and cyclododecanyl group. More preferred are the adamantly group, decalin residue, norbornyl group, cedrol group, cyclohexyl group, cycloheptyl group, cyclooctyl group, cylodecanyl group, and cyclododecanyl group.

The substituent which may be present in the alicyclic hydrocarbon groups described above includes, for example, an alkyl group, substituted alkyl group, halogen atom, hydroxyl group, alkoxy group, carboxyl group, and alkoxycarbonyl group. The alkyl group is preferably, lower alkyl groups such as methyl group, ethyl group, propyl group, isopropyl group, and butyl group and, more preferably, selected from the group consisting of a methyl group, ethyl group, propyl group and isopropyl group. The substituent which may further be present in the substituted alkyl group includes, for example, a hydroxyl group, halogen atom and alkoxy group. The alkoxyl group includes, for example, those having 1 to 4 carbon atoms such as a methoxy group, ethoxy group, propoxy group, and butoxy group.

The structure represented by the general formulae (pI) to (pVI) in the resin can be used for the protection of the alkali-soluble group. The alkali-soluble group includes various groups known in the relevant technical field.

Specifically, the alkali-soluble group includes, for example, a carboxylic acid group, sulfonic acid group, phenol group and thiol group, and the carboxylic acid group and the sulfonic acid group are preferred.

The alkali-soluble group protected by the structure represented by the general formulae (pI) to (pVI) in the resin includes, preferably, a structure in which the hydrogen atom of the carboxyl group is substituted with the structure represented by the general formulae (pI) to (pVI).

As further substituents of the alkyl, cyclic hydrocarbon and alkoxyl groups, a hydroxyl group, a halogen atom, a carboxyl group, an alkoxyl group, an acyl group, a cyano group, an acyloxy group, an alkyl group, and a cyclic hydrocarbon group can be exemplified. As the halogen atoms, a chlorine atom, a bromine atom, a fluorine atom and an iodine atom can be exemplified, as the alkoxyl groups, alkoxyl groups having from 1 to 4 carbon atoms, e.g., a methoxy group, an ethoxy group, a propoxy group and a butoxy group can be exemplified, as the acyl groups, e.g., a formyl group and an acetyl group can be exemplified, and as the acyloxy group, an acetoxy group can be exemplified.

As the alkyl groups and cyclic hydrocarbon groups, the same groups as described above can be exemplified.

In the resin according to the invention, a group capable of decomposing by the action of an acid (an acid-decomposable group) can be contained in at least one repeating unit of the repeating units having a partial structure containing alicyclic hydrocarbon represented by any of formulae (pI) to (pVI), and the repeating units of other copolymer components.

It is also preferred for the resin in the invention to have a repeating unit having a lactone structure (hereinafter also referred to as "repeating unit (a)").

As the lactone structure, any structures can be used so long as they have a lactone structure, but a 5- or 6-membered lactone structure is preferably used. The lactone structure moiety may have a substituent or may not have. As preferred substituents, an alkyl group having from 1 to 8 carbon atoms, a cycloalkyl group having from 4 to 7 carbon atoms, an alkoxyl group having from 1 to 8 carbon atoms, an alkoxycarbonyl group having from 1 to 8 carbon atoms, a carboxyl group and a cyano group are exemplified.

As preferred lactone structure, a lactone structure represented by any of the following formulae (LC1-1) to (LC1-12) can be exemplified. These lactone structures may have the above substituents.

LC1-1

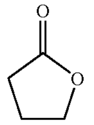

LC1-2

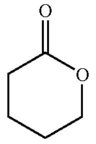

LC1-3

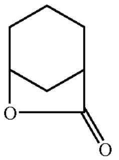

-continued

LC1-4

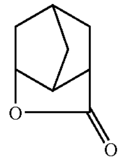

LC1-5

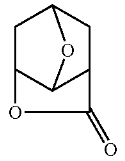

LC1-6

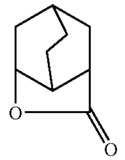

LC1-7

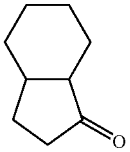

LC1-8

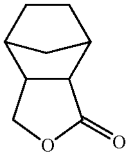

LC1-9

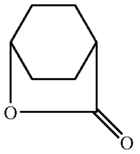

LC1-10

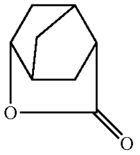

LC1-11

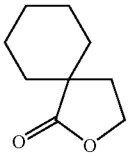

LC1-12

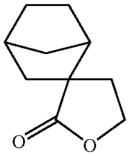

As the structure having a lactone structure, a structure represented by the following formula (I) can be preferably exemplified, and a structure represented by the following formula (I') is more preferred.

(I)

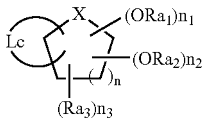

(I')

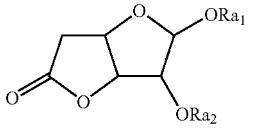

In formulae (I) and (I'), X represents $CH_2$, an oxygen atom, a sulfur atom, or —C(═O)—; Lc represents a group forming lactone; $Ra_1$ and $Ra_2$ each independently represents a hydrogen atom, an alkyl group, a cycloalkyl group, an acyl group or an acid-decomposable group; $Ra_3$ represents a carboxyl group, an alkyl group, an alkoxyl group, an acyloxy group, an alkoxycarbonyl group, or a group having an acid-decomposable group, any two of $Ra_1$, $Ra_2$ and $Ra_3$ may be bonded to each other to form a ring or an acid-decomposable group; n represents an integer of 1 or 2; $n_1$ and $n_2$ each independently represents an integer of from 0 to 3, provided that $n_1+n_2$ is an integer of from 1 to 6; and $n_3$ represents an integer of from 0 to 3.

The lactone in Lc is the same lactone structure as described above.

As the acyl group represented by $Ra_1$ and $Ra_2$, an acyl group having from 2 to 20 carbon atoms, for instance, an acyl group having a chain hydrocarbon group, e.g., an acetyl group and a propionyl group, and an acyl group having a monocyclic or polycyclic hydrocarbon group, e.g., a cyclohexanecarbonyl group and an adamantanecarbonyl group are exemplified. As the alkyl group, an alkyl group having from 1 to 20 carbon atoms, such as a straight chain or branched chain alkyl group, e.g., a methyl group, an ethyl group, a propyl group, a butyl group, an octyl group and a dodecyl group are exemplified. As the cycloalkyl group, a cycloalkyl group having from 3 to 20 carbon atoms, for instance, a monocyclic cycloalkyl group, e.g., a cyclopentyl group and a cyclohexyl group, and a polycyclic cycloalkyl group, e.g., an adamantyl group, a norbornyl group and a tetracyclodecanyl group are exemplified. As the acid-decomposable group, a group having a structure whose hydroxyl group is protected with an acid-decomposable protective group, e.g., an acetal group, a ketal group, a silyl ether group, and a tertiary alkyloxycarbonyl group are exemplified, or the hydrogen atom of the hydroxyl group may be substituted with an acid-decomposable group via a linking group.

A preferred acid-decomposable group is a group forming a cyclic acetal or a cyclic ketal structure by the bonding of the hydrogen atoms of two contiguous hydroxyl groups, a 5-membered ketal structure is more preferred, and a group forming a 2,2-dialkyl-1,3-dioxolan structure by the bonding of the hydrogen atoms of two contiguous hydroxyl groups is still more preferred. The dialkyl groups on the oxolan may be bonded to form a monocyclic or polycyclic structure.

The alkyl group represented by $Ra_3$ and the alkyl groups in the alkoxyl group and alkoxycarbonyl group represented by $Ra_3$ are the same as the above alkyl groups.

The acyl groups in the acyloxy group represented by $Ra_3$ are the same as the above acyl groups.

As the group formed by the bonding of any two of $Ra_1$, $Ra_2$ and $Ra_3$, e.g., a hydrocarbon group having from 3 to 20 carbon atoms can be exemplified, which group may have an oxygen atom.

As the repeating unit containing a group having a lactone structure represented any of formulae (LC1-1) to (LC1-12), a repeating unit represented by the following formula (AI) can be exemplified.

(AI)

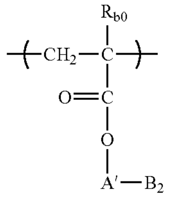

In formula (AI), $R_{b0}$ represents a hydrogen atom, a halogen atom, or a substituted or unsubstituted alkyl group having from 1 to 4 carbon atoms. As the preferred substituents that the alkyl group represented by $R_{b0}$ may have, an alkyl group having from 1 to 8 carbon atoms, a cycloalkyl group having from 4 to 7 carbon atoms, an alkoxyl group having from 1 to 8 carbon atoms, an alkoxycarbonyl group having from 1 to 8 carbon atoms, a carboxyl group and a cyano group are exemplified.

As the halogen atom represented by $R_{b0}$, a fluorine atom, a chlorine atom, a bromine atom and an iodine atom can be exemplified. $R_{b0}$ preferably represents a hydrogen atom.

A' represents a single bond, an ether group, an ester group, a carbonyl group, an alkylene group, or a divalent linking group obtained by combining these groups.

$B_2$ represents a group represented by any of formulae (LC1-1) to (LC1-12).

The specific examples of the repeating units containing a group having a lactone structure are shown below, but the invention is not restricted thereto.

(In the formulae, Rx represents H, $CH_3$ or $CF_3$.)

(IV-1)

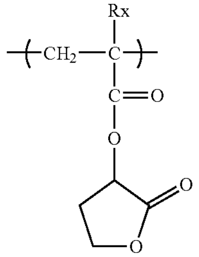

(IV-2)

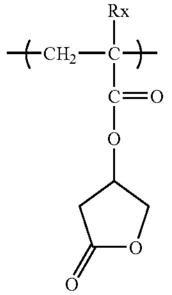

-continued
(IV-3)
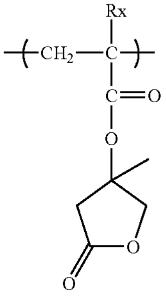
(IV-4)
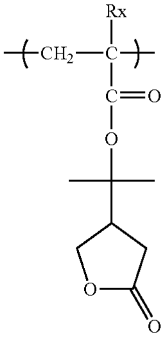
(IV-5)
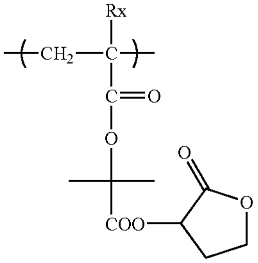
(IV-6)
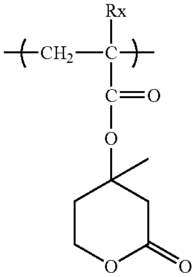
(IV-7)
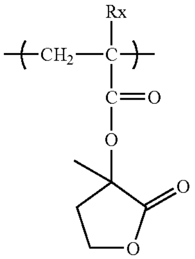
-continued
(IV-8)
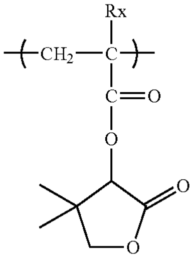
(IV-9)
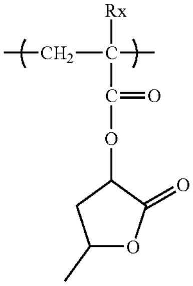
(IV-10)
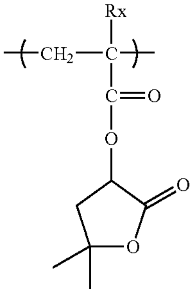
(IV-11)
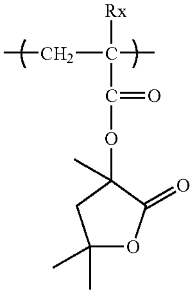
(IV-12)
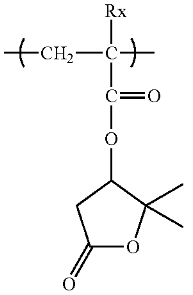

-continued
(IV-13)
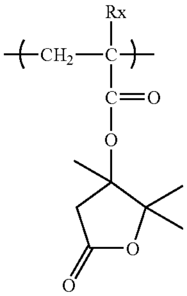
(IV-14)
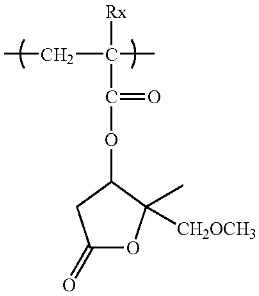
(IV-15)
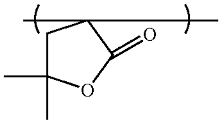
(IV-16)
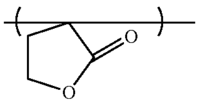
(In the formulae, Rx represents H, $CH_3$ or $CF_3$.)
(Ib-1)
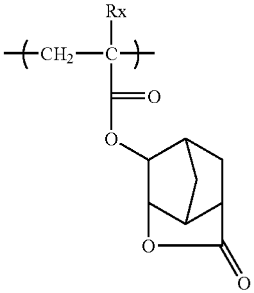
(Ib-2)
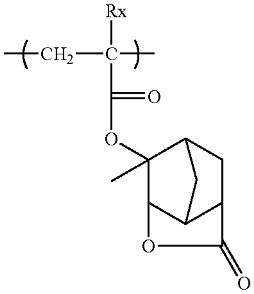
-continued
(Ib-3)
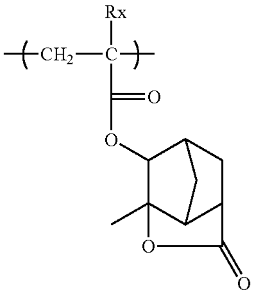
(Ib-4)
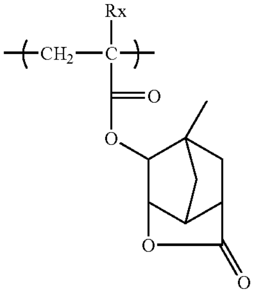
(Ib-5)
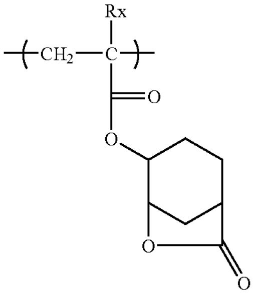
(Ib-6)
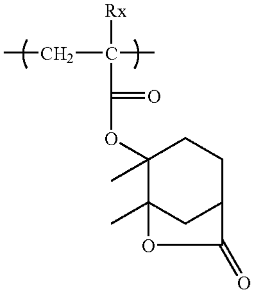
(Ib-7)
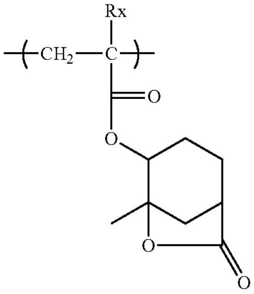

-continued (Ib-8)

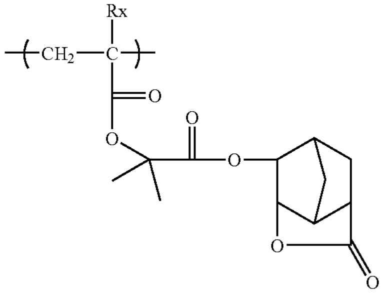

(Ib-9)

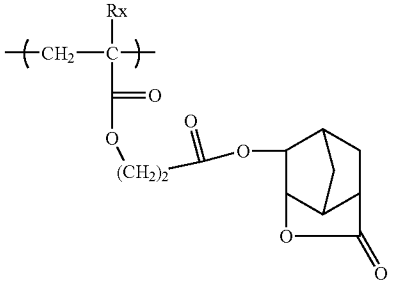

(Ib-10)

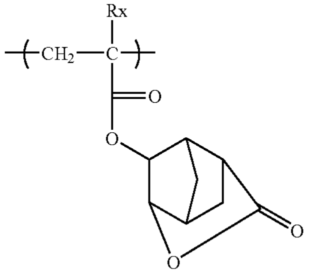

(Ib-11)

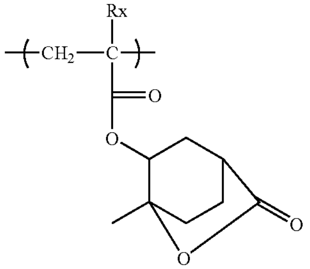

As the repeating unit having the structure represented by formula (I), a (meth)acrylic ester derivative, a (meth)-acrylamide derivative, a vinyl ether derivative, an olefin derivative and a styrene derivative each having the structure represented by formula (I) are exemplified, preferably a (meth)acrylic ester derivative, more preferably a repeating unit represented by the following formula (Ia), and still more preferably a repeating unit represented by the following formula (Ia-1).

(Ia)

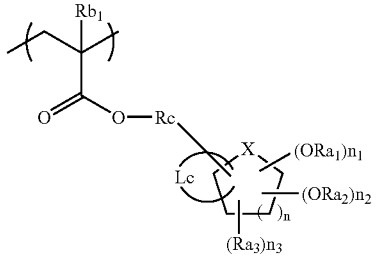

(Ia-1)

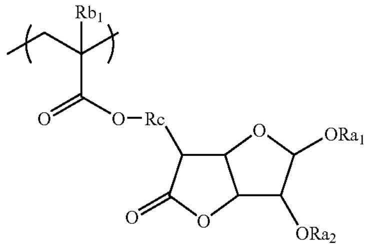

In formulae (Ia) and (Ia-1), $Rb_1$ represents a hydrogen atom, an alkyl group, or —$CH_2$—O—$Rb_2$; $Rb_2$ represents a hydrogen atom, an alkyl group, a cycloalkyl group, an acyl group, or a group having a lactone structure; Rc represents a single bond or a divalent linking group; X represents $CH_2$, an oxygen atom, a sulfur atom, or —C(═O)—; Lc represents a group forming lactone; $Ra_1$ and $Ra_2$ each independently represents a hydrogen atom, an alkyl group, a cycloalkyl group, an acyl group, or an acid-decomposable group; $Ra_3$ represents a carboxyl group, an alkyl group, an alkoxyl group, an acyloxy group, an alkoxycarbonyl group, or a group having an acid-decomposable group, and any two of $Ra_1$, $Ra_2$ and $Ra_3$ may be bonded to each other to form a ring or an acid-decomposable group; n represents an integer of 1 or 2; $n_1$ and $n_2$ each independently represents an integer of from 0 to 3, provided that $n_1+n_2$ is an integer of from 1 to 6; and $n_3$ represents an integer of from 0 to 3.

As the alkyl group represented by $Rb_1$, a straight chain or branched alkyl group having from 1 to 5 carbon atoms is preferred, e.g., a methyl group, an ethyl group, a propyl group, an n-butyl group, a sec-butyl group, and a t-butyl group are exemplified. The alkyl group represented by $Rb_1$ may have a substituent. As the substituents of the alkyl group represented by $Rb_1$, a fluorine atom, a chlorine atom, and a hydroxyl group can be exemplified.

As the alkyl group represented by $Rb_2$, an alkyl group having from 1 to 20 carbon atoms can be exemplified, for example, a straight chain or branched chain alkyl group, e.g., a methyl group, an ethyl group, a propyl group, a butyl group, an octyl group, and a dodecyl group can be exemplified. As the cycloalkyl group, a cycloalkyl group having from 3 to 20 carbon atoms can be exemplified, for example, a monocyclic cycloalkyl group, e.g., a cyclopentyl group and a cyclohexyl group, and a polycyclic cycloalkyl group, e.g., an adamantyl group, a norbornyl group, and a tetracyclodecanyl group are exemplified. As the acyl group, an acyl group having from 2 to 20 carbon atoms, for example, an acyl group having a chain hydrocarbon group, e.g., an acetyl group and a propionyl group, and an acyl group having a monocyclic or polycyclic hydrocarbon group, e.g., a cyclohexanecarbonyl group and an adamantanecarbonyl group are exemplified.

As the lactone structure in the group having a lactone structure represented by $Rb_2$, the same lactone structure as described above can be exemplified.

As the divalent linking group represented by Rc, an alkylene group, a cycloalkylene group, —$CO_2$—, and a linking group obtained by combining a plurality of these groups can be exemplified.

The alkyl group, cycloalkyl group and acyl group represented by $Rb_2$, the group having a lactone structure represented by $Rb_2$, and the divalent linking represented by Rc may have a substituent. As the substituents of the alkyl group, cycloalkyl group and acyl group represented by $Rb_2$, the group having a lactone structure represented by $Rb_2$, and the divalent linking represented by Rc, a fluorine atom, a chlorine atom, a hydroxyl group, etc., can be exemplified.

As the divalent linking represented by Rc, an alkylcarboxyl linking group or a cycloalkylcarboxyl linking group obtained by linking an alkylene group or a cycloalkylene group with a —$CO_2$— group is preferred, and a polycyclic cycloalkylcarboxyl linking group is more preferred. Specifically, an adamantylcarboxyl linking group and a norbornanecarboxyl linking group are exemplified.

Rc is especially preferably a single bond. By making Rc a single bond, the glass transition temperature of the resin can be adjusted to a proper temperature, as a result exposure latitude is improved.

The preferred specific examples of repeating unit (a) are shown below.

In the following specific examples, it is possible to have a plurality of optical isomers. A single optical isomer may be used or a mixture of a plurality of optical isomers may be used, but it is preferred to use a single optical isomer.

I-1

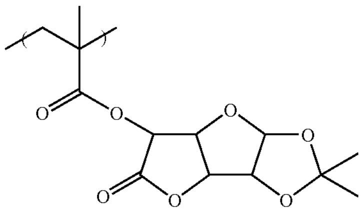

I-2

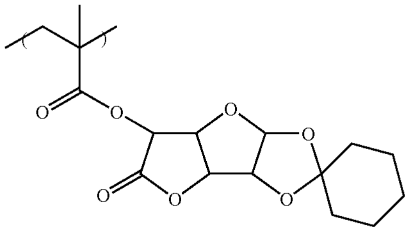

I-3

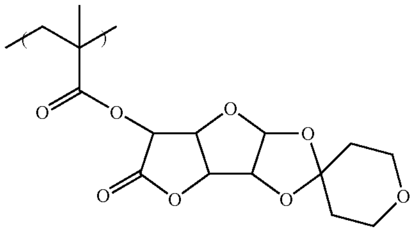

-continued

I-4

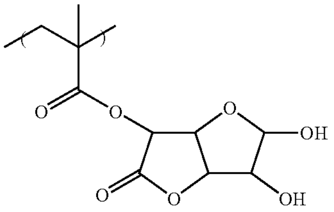

I-5

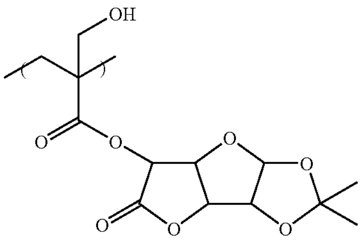

I-6

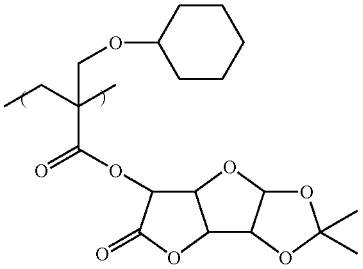

I-7

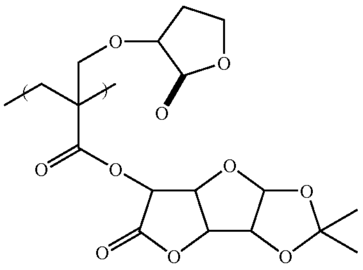

I-8

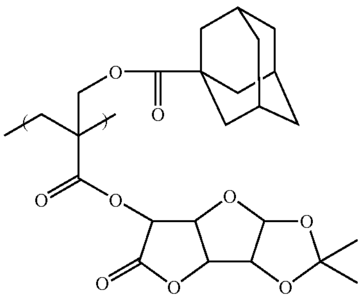

I-9

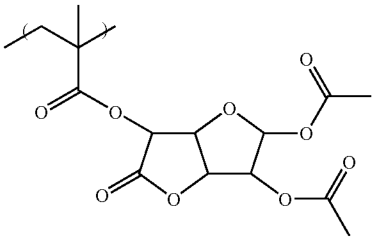

-continued

I-10

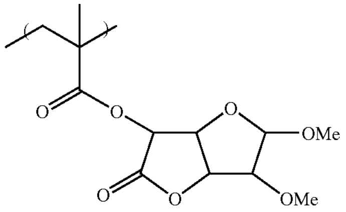

I-11

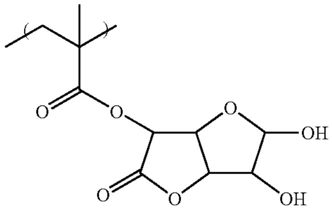

I-12

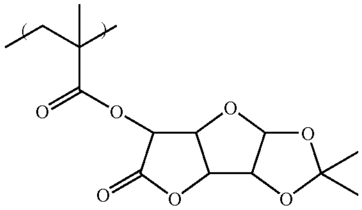

I-13

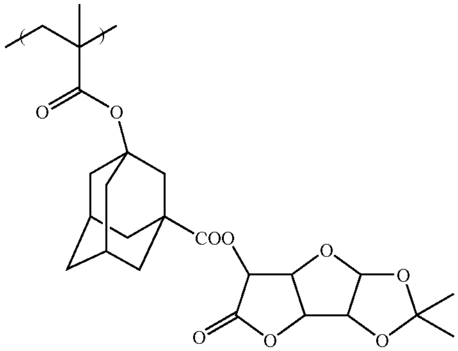

I-14

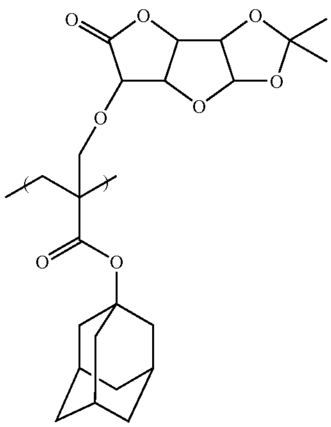

-continued

I-15

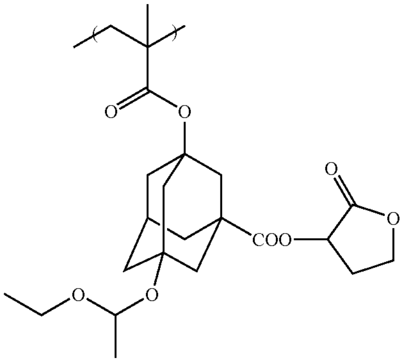

I-16

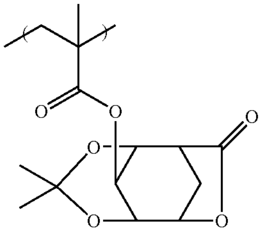

I-17

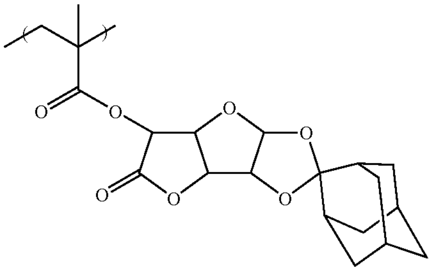

As the monomer corresponding to repeating unit (a), a monomer represented by the following formula (Ib) is preferred, and a monomer represented by the following formula (Ib') is more preferred.

(Ib)

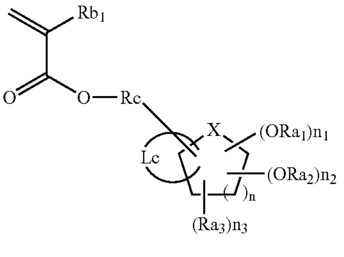

(Ib')

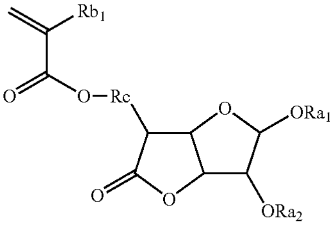

In formulae (Ib) and (Ib'), $Rb_1$ represents a hydrogen atom, an alkyl group, or $—CH_2—O—Rb_2$; $Rb_2$ represents a hydrogen atom, an alkyl group, a cycloalkyl group, an acyl group, or a group having a lactone structure; Rc represents a single bond or a divalent linking group; X represents $CH_2$, an oxygen atom, a sulfur atom, or —C(═O)—; Lc represents a group forming lactone; $Ra_1$ and $Ra_2$ each independently represents a hydrogen atom, an alkyl group, a cycloalkyl group, an acyl group, or an acid-decomposable group; $Ra_3$ represents a carboxyl group, an alkyl group, an alkoxyl group, an acyloxy group, an alkoxycarbonyl group, or a group having an acid-decomposable group, and any two of $Ra_1$, $Ra_2$ and $Ra_3$ may be bonded to each other to form a ring or an acid-decomposable group; n represents an integer of 1 or 2; $n_1$ and $n_2$ each independently represents an integer of from 0 to 3, provided that $n_1+n_2$ is an integer of from 1 to 6; and $n_3$ represents an integer of from 0 to 3.

The preferred specific examples of the monomers corresponding to repeating unit (a) are shown below.

Ib-1

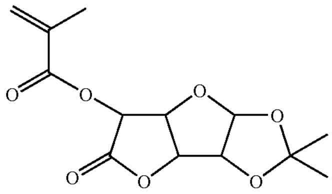

Ib-2

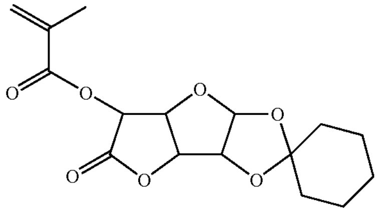

Ib-3

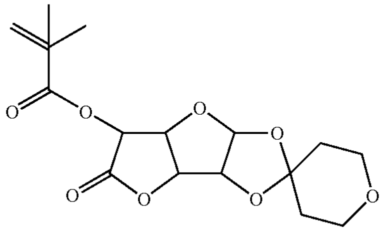

Ib-4

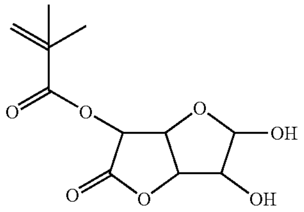

Ib-5

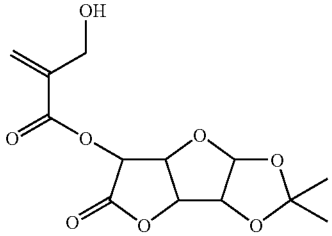

-continued

Ib-6

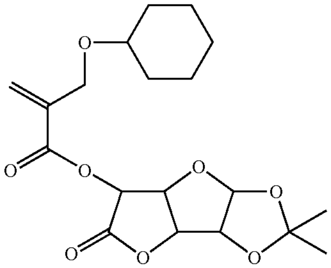

Ib-7

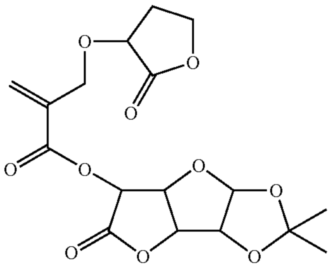

Ib-8

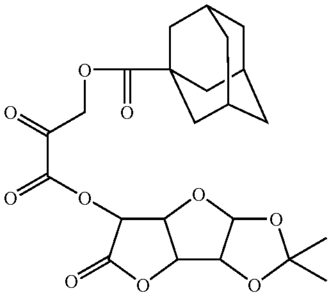

Ib-9

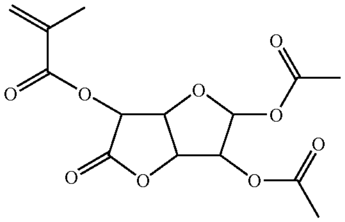

Ib-10

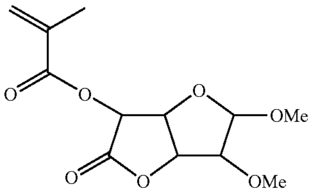

Ib-11

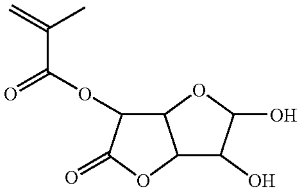

-continued

Ib-12

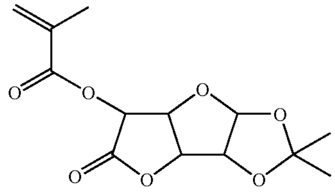

Ib-13

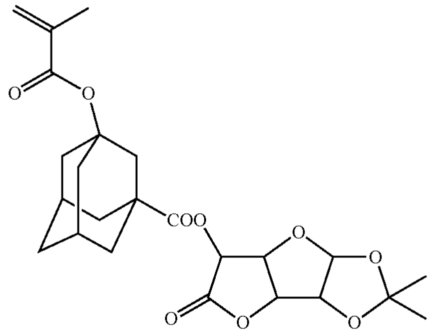

Ib-14

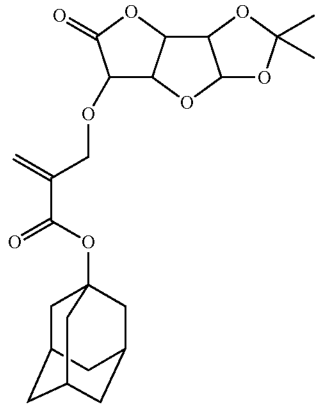

Ib-15

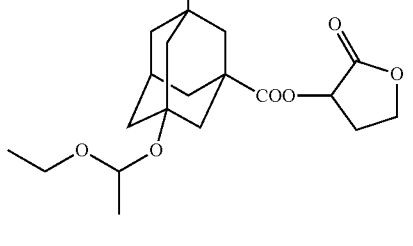

-continued

Ib-16

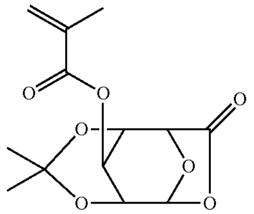

Ib-17

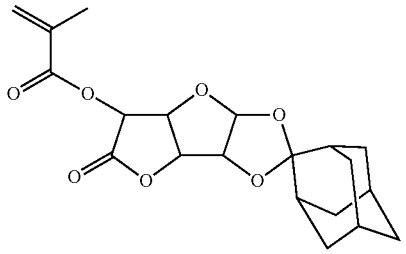

In the invention, it is also preferred to contain other repeating units having a group having a lactone structure formed by the condensation of a 5- or 6-membered ring (hereinafter referred to as "repeating unit (b)"). The condensed 5- or 6-membered ring in repeating unit (b) may have a hetero atom such as an oxygen atom or a sulfur atom as the atom forming the ring, or may contain a double bond, and specifically a cyclohexane ring, a cyclopentane ring, a tetrahydrofuran ring, a tetrahydropyran ring, a cyclohexene ring, a cyclopentene ring, a dihydrofuran ring, a dihydropyran ring, a tetrahydrothiophene ring, a dihydrothiophene ring, etc., are exemplified.

As the lactone structure comprising a condensed 5- or 6-membered ring, a structure represented by the following formula (II) or (III) can be exemplified.

(II)

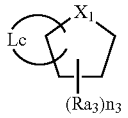

(III)

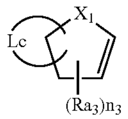

In formulae (I) and (III), Lc represents a group forming lactone; $Ra_3$ represents a carboxyl group, an alkyl group, an alkoxyl group, an acyloxy group, an alkoxycarbonyl group, or a group having an acid-decomposable group, when a plurality of $Ra_3$'s are present, any two of the plurality of $Ra_3$'s may be bonded to each other to form a ring; $X_1$ represents $—CH_2—$, $—CH_2CH_2—$, $—CH_2—$, —O—, —S— or $—CH_2S—$; and $n_3$ represents an integer of from 0 to 3.

Lc, $Ra_3$ and $n_3$ in formulae (II) and (III) respectively have the same meaning as Lc, $Ra_3$ and $n_3$ in formula (I).

The lactone structure formed by Lc is preferably a 5- or 6-membered lactone.

As the repeating unit having a structure represented by formula (II) or (III), a repeating unit represented by the following formula (IIa) or (IIIa) is preferably exemplified, and a repeating unit in which Rc and the α-position of the lactone structure is bonded is more preferred.

(IIa)

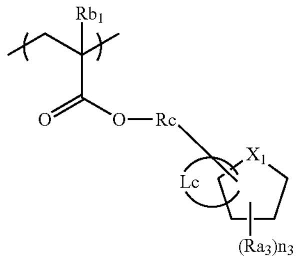

(IIIa)

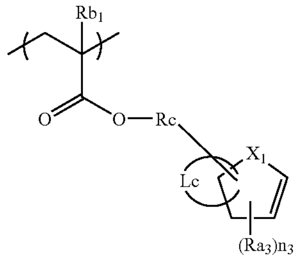

In formulae (IIa) and (IIIa), $Rb_1$ represents a hydrogen atom, an alkyl group, or —$CH_2$—O—$Rb_2$; $Rb_2$ represents a hydrogen atom, an alkyl group, a cycloalkyl group, an acyl group, or a group having a lactone structure; Rc represents a single bond or a divalent linking group; Lc represents a group forming lactone; $Ra_3$ represents a carboxyl group, an alkyl group, an alkoxyl group, an acyloxy group, an alkoxycarbonyl group, or a group having an acid-decomposable group, when a plurality of $Ra_3$'s are present, any two of the plurality of $Ra_3$'s may be bonded to each other to form a ring; $X_1$ represents —$CH_2$—, —$CH_2CH_2$—, —$CH_2O$—, —O—, —S— or —$CH_2S$—; and $n_3$ represents an integer of from 0 to 3.

Lc, $Ra_3$ and $n_3$ in formulae (IIa) and (IIIa) respectively have the same meaning as Lc, $Ra_3$ and $n_3$ in formula (I).

$Rb_1$ and Rc in formulae (IIa) and (IIIa) respectively have the same meaning as $Rb_1$ and Rc in formula (Ia).

As the repeating unit having a structure represented by formula (II) or (III), a repeating unit represented by the following formula (IIa-1) or (IIIa-1) is preferably exemplified.

(IIa-1)

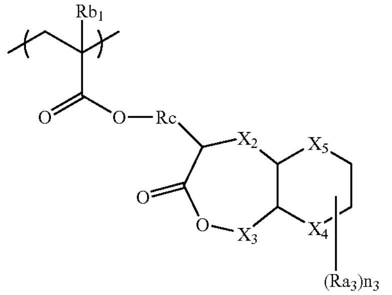

-continued (IIIa-1)

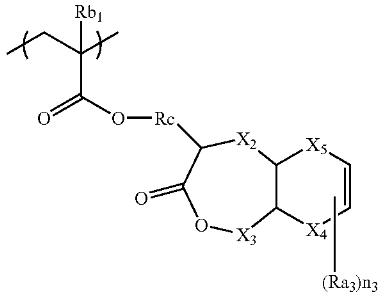

In formulae (Ia-1) and (IIIa-1), $Rb_1$ represents a hydrogen atom, an alkyl group, or —$CH_2$—O—$Rb_2$; $Rb_2$ represents a hydrogen atom, an alkyl group, a cycloalkyl group, an acyl group, or a group having a lactone structure; Rc represents a single bond or a divalent linking group; $Ra_3$ represents a carboxyl group, an alkyl group, an alkoxyl group, an acyloxy group, an alkoxycarbonyl group, or a group having an acid-decomposable group, and when a plurality of $Ra_3$'s are present, any two of the plurality of $Ra_3$'s may be bonded to each other to form a ring; $X_2$ represents a single bond or —$CH_2$—; $X_3$ represents a single bond or —$CH_2$—; $X_4$ represents a single bond, —$CH_2$—, —$CH_2CH_2$—, —$CH_2O$—, —O—, —S—, or —$CH_2S$—; $X_5$ represents a single bond, —$CH_2$—, —$CH_2CH_2$—, —$CH_2O$—, —O—, —S—, or —$CH_2S$—; the sum total of the number of carbon atoms of $X_4$ and $X_5$ exclusive of a hydrogen atom is 1 or 2; and $n_3$ represents an integer of from 0 to 3.

As the combinations of $X_2$ to $X_5$, a combination of $X_2$ to $X_4$ being a single bond and $X_5$ being —$CH_2$—, or a combination of $X_2$ to $X_4$ being a single bond and $X_5$ being —$CH_2CH_2$— is preferred.

$Ra_3$ and $n_3$ in formulae (IIa-1) and (IIIa-1) respectively have the same meaning as $Ra_3$ and $n_3$ in formula (I).

$Rb_1$ and Rc in formulae (IIa-1) and (IIIa-1) respectively have the same meaning as $Rb_1$ and Rc in formula (Ia).

The preferred examples of the repeating units having a lactone structure represented by formula (II) are shown below.

II-1

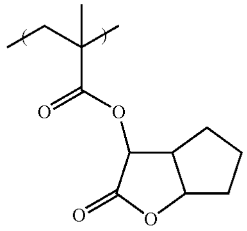

II-2

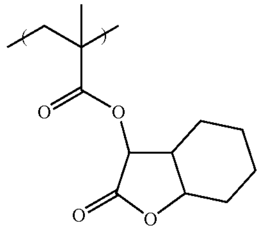

-continued
II-3
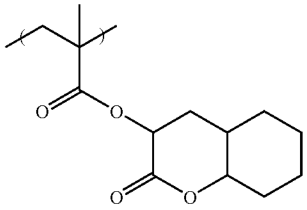
II-4
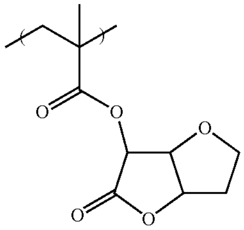
II-5
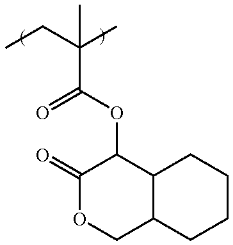
II-6
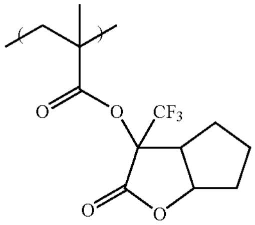
II-7
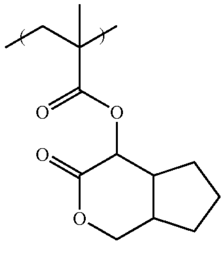
II-8
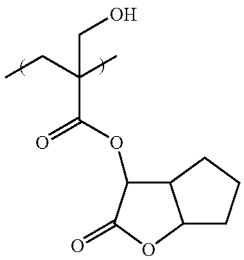
-continued
II-9
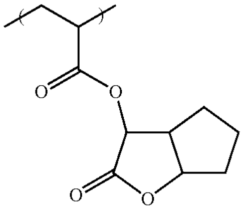
II-10
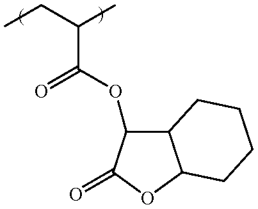
II-11
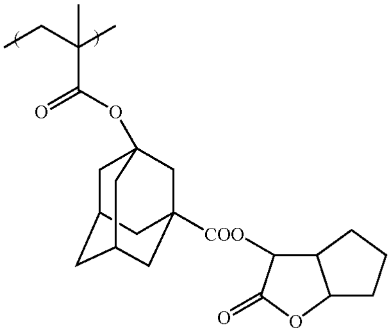
The preferred examples of the repeating units having a lactone structure represented by formula (III) are shown below.
III-1
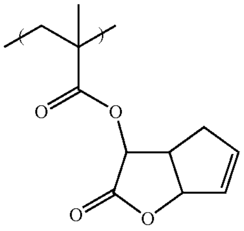
III-2
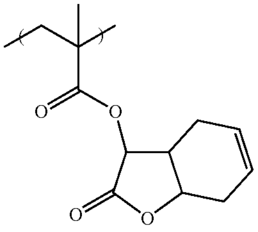
III-3
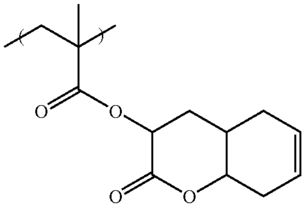

-continued

III-4

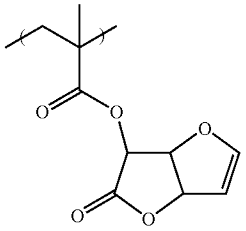

III-5

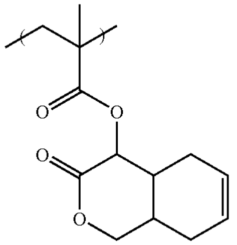

III-6

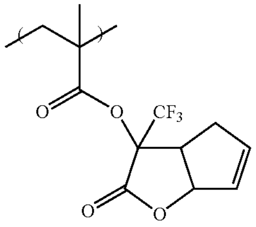

III-7

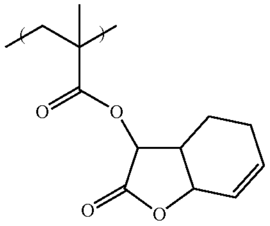

III-8

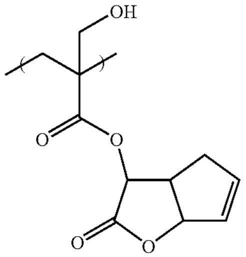

III-9

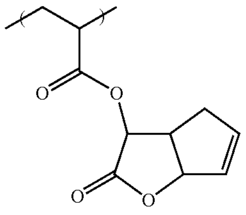

III-10

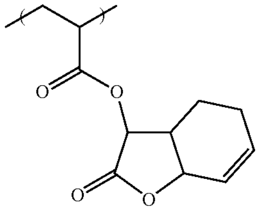

-continued

III-11

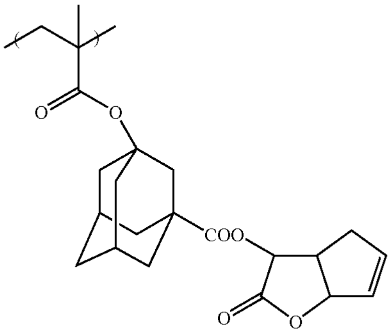

As the monomers corresponding to repeating unit (b), monomers represented by the following formula (IIb) or (IIIb) are preferred, and monomers represented by the following formula (IIb') or (IIIb') are more preferred.

(IIb)

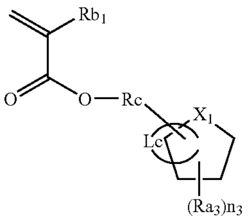

(IIIb)

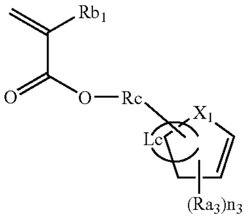

(IIb')

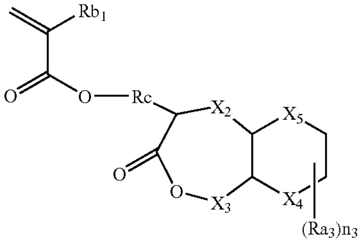

(IIIb')

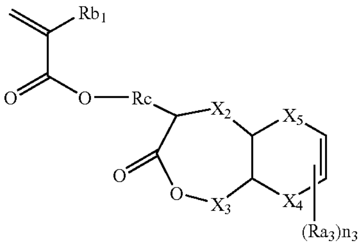

$Rb_1$, Rc, Lc, $X_1$, $Ra_3$ and $n_3$ in formulae (IIb) and (IIIb) respectively have the same meaning as $Rb_1$, Rc, Lc, $X_1$, $Ra_3$ and $n_3$ in formulae (IIa) and (IIIa).

$Rb_1$, Rc, $Ra_3$, $n_3$, $X_2$, $X_3$, $X_4$ and $X_5$ in formulae (IIb') and (IIIb') respectively have the same meaning as $Rb_1$, Rc, $Ra_3$, $n_3$, $X_2$, $X_3$, $X_4$ and $X_5$ in formulae (IIa-1) and (IIIa-1).

The specific examples of the monomers represented by formula (IIb) are shown below, but the invention is not restricted to these compounds.
IIb-1
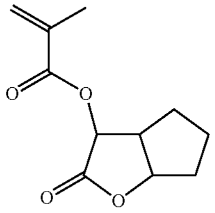
IIb-2
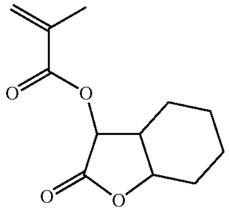
IIb-3
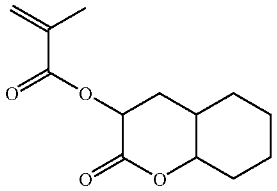
IIb-4
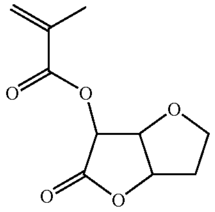
IIb-5
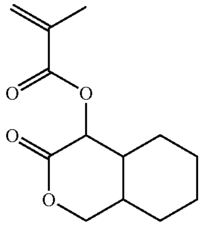
IIb-6
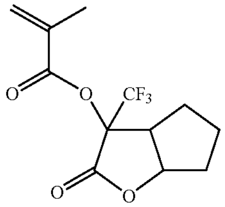
IIb-7
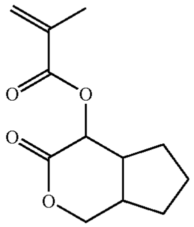
-continued
IIb-8
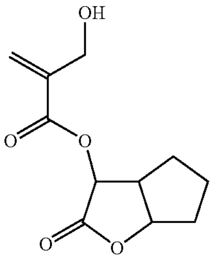
IIb-9
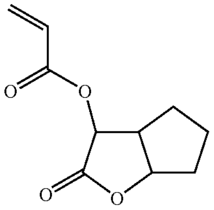
IIb-10
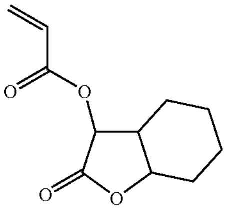
IIb-11
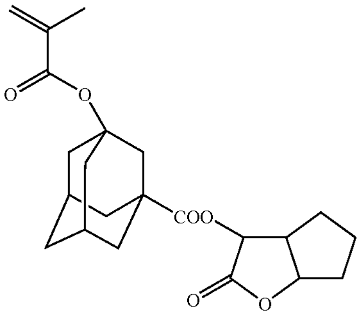
The specific examples of the monomers represented by formula (IIIb) are shown below, but the invention is not restricted to these compounds.
IIIb-1
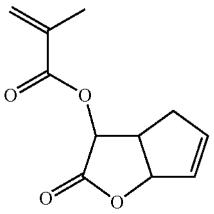
IIIb-2
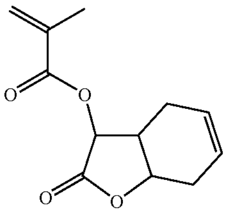

-continued

IIIb-3

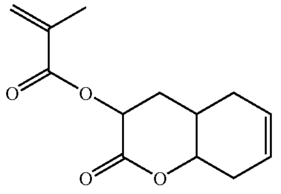

IIIb-4

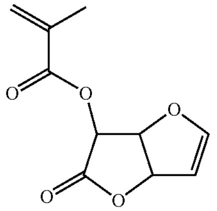

IIIb-5

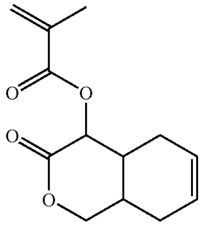

IIIb-6

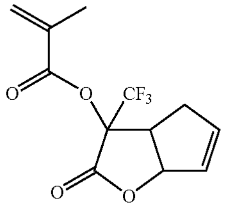

IIIb-7

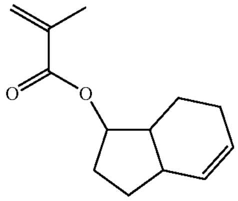

IIIb-8

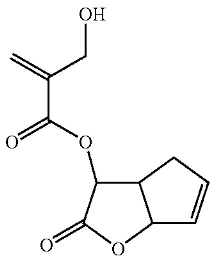

IIIb-9

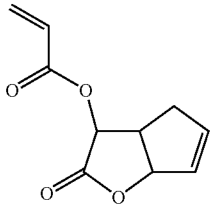

-continued

IIIb-10

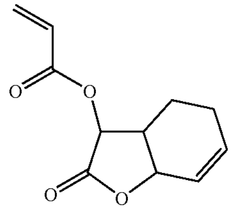

IIIb-11

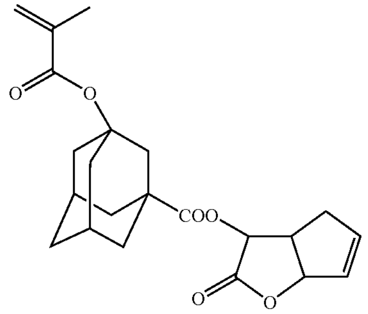

The monomers corresponding to repeating units (a) and (b) can be obtained by the reaction of the corresponding hydroxy-lactones and, e.g., (meth)acrylic anhydride or (meth)acrylic chloride, under a basic condition. Hydroxy-lactones can be synthesized by the method described, e.g., in Tetrahedron, p. 415 (1987), the method described in J. Chem. Soc., PERKIN Trans., 1, p. 313 (1993), the method described in Tetrahedron, p. 10265 (1994), and the method described in J. Org. Chem., p. 600 (1952).

It is possible that an acid-decomposable resin has a plurality of optical isomers in repeating unit (a) or (b). A single optical isomer may be used or a mixture of a plurality of optical isomers may be used, but it is preferred to use a single optical isomer.

The resin in the invention may also contain a repeating unit having a group represented by the following formula (VII).

(VII)

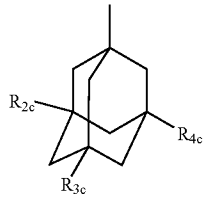

In formula (VII), $R_{2c}$, $R_{3c}$ and $R_{4c}$ each independently represents a hydrogen atom or a hydroxyl group, provided that at least one of $R_{2c}$, $R_{3c}$ and $R_{4c}$ represents a hydroxyl group.

The group represented by formula (VII) is preferably a dihydroxy form or a monohydroxy form, more preferably a dihydroxy form.

As the repeating unit having a group represented by formula (VII), e.g., a repeating unit represented by the following formula (AII) can be exemplified.

(AII)

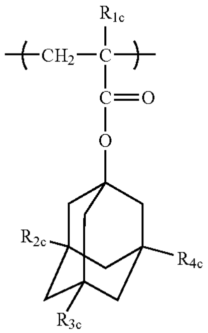

In formula (VII), $R_{1c}$ represents a hydrogen atom or a methyl group; and $R_{2c}$, $R_{3c}$ and $R_{4c}$ each independently represents a hydrogen atom or a hydroxyl group, provided that at least one of $R_{2c}$, $R_{3c}$ and $R_{4c}$ represents a hydroxyl group. It is preferred that two of $R_{2c}$, $R_{3c}$ and $R_{4c}$ represent a hydroxyl group.

The specific examples of the repeating units having a structure represented by formula (AII) are shown below, but the invention is not restricted to these compounds.

(1)

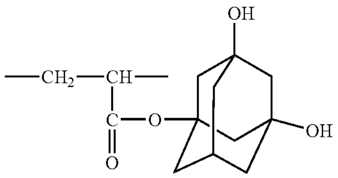

(2)

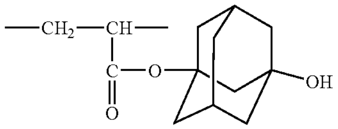

(3)

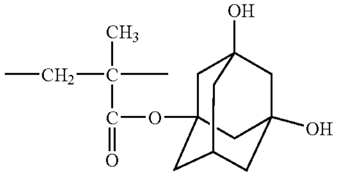

(4)

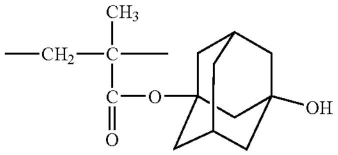

The resin in the invention may contain a repeating unit represented by the following formula (VIII).

(VIII)

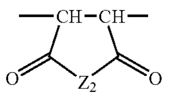

In formula (VIII), $Z_2$ represents —O— or =N($R_{41}$)—; $R_{41}$ represents a hydrogen atom, a hydroxyl group, an alkyl group, or —$OSO_2$—$R_{42}$; and $R_{42}$ represents an alkyl group, a cycloalkyl group or a camphor residue.

As the specific examples of the repeating units represented by formula (VIII), the following [I'-1] to [I'-7] are exemplified, but the invention is not restricted thereto.

[I'-1]

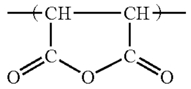

[I'-2]

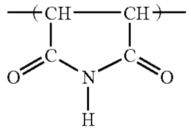

[I'-3]

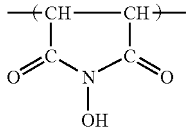

[I'-4]

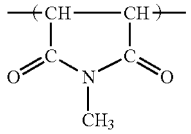

[I'-5]

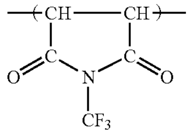

[I'-6]

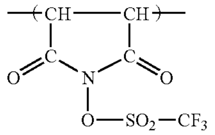

[I'-7]

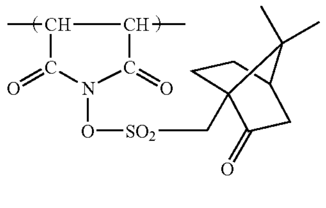

It is preferred for resin (A) to contain a fluorine atom. As the repeating unit containing a fluorine atom, it is preferred to contain at least one compound represented by the following formula (I) or (II).

(I)

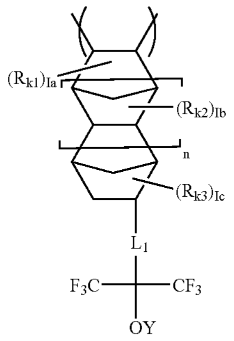

-continued (II)

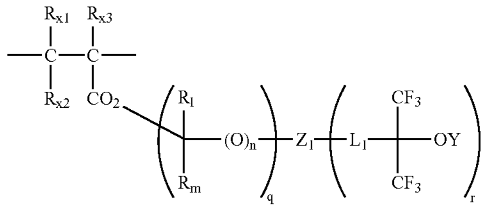

In formula (I), $R_{k1}$, $R_{k2}$ and $R_{k3}$ each independently represents a halogen atom, an alkyl group, or an alkoxyl group; la represents an integer of from 0 to 2; 1b represents an integer of from 0 to 6; and 1c represents an integer of from 0 to 7; $L_1$ represents a single bond or a divalent linking group; n represents 0 or 1; and Y represents a hydrogen atom or an organic group.

In formula (II), $R_{x1}$, $R_{x2}$ and $R_{x3}$ each independently represents a hydrogen atom, a fluorine atom, a chlorine atom, a cyano group, an alkyl group, or $-L_3-C(R_{f1})(R_{f2})Ra$; $R_{f1}$ and $R_{f2}$ each independently represents a hydrogen atom, a fluorine atom, or an alkyl group, provided that at least one of $R_{f1}$ and $R_{f2}$ represents a fluorine atom or a fluoroalkyl group; Ra represents a hydrogen atom or a hydroxyl group; $L_3$ represents a single bond, an alkylene group, $-CH_2-O-$, or $-CH_2-COO-$; $R_1$ and $R_m$ each independently represents a hydrogen atom or an alkyl group; $Z_1$ represents a single bond, an alkylene group, a cycloalkylene group, or an arylene group; $L_1$ represents a single bond or a divalent linking group; n and q each independently represents 0 or 1; r represents an integer of from 0 to 6; and Y represents a hydrogen atom or an organic group.

In formula (I), as the halogen atom represented by $R_{k1}$, $R_{k2}$ and $R_{k3}$, a fluorine atom, a chlorine atom, a bromine atom and an iodine atom can be exemplified, but a fluorine atom is preferred.

The alkyl group represented by $R_{k1}$, $R_{k2}$ and $R_{k3}$ may have a substituent, and an alkyl group having from 1 to 8 carbon atoms is preferred as the substituent, e.g., a methyl group, an ethyl group, a propyl group, an n-butyl group, a sec-butyl group and a t-butyl group are exemplified. As the alkyl group represented by $R_{k1}$, $R_{k2}$ and $R_{k3}$, an alkyl group substituted with a fluorine atom is preferred, and the carbon atom number of the alkyl group is from 1 to 8, preferably 1 or 2, and more preferably 1. A perfluoroalkyl group all the hydrogen atoms of which are substituted with hydrogen atoms is preferred.

The alkoxyl group represented by $R_{k1}$, $R_{k2}$ and $R_{k3}$ may have a substituent, and an alkoxyl group having from 1 to 8 carbon atoms is preferred as the substituent, e.g., a methoxy group, an ethoxy group, a propoxy group and an n-butoxy group are exemplified.

As the substituents that the alkyl group and the alkoxyl group represented by $R_{k1}$, $R_{k2}$ and $R_{k3}$ may have, an alkoxyl group having from 1 to 4 carbon atoms, a halogen atom (e.g., a fluorine atom, a chlorine atom, a bromine atom, an iodine atom), an acyl group, an acyloxy group, a cyano group, a hydroxyl group, a carboxyl group, an alkoxycarbonyl group and a nitro group can be exemplified.

$R_{k1}$, $R_{k2}$ and $R_{k3}$ each independently preferably represents a halogen atom and a fluorine-substituted alkyl group, and a fluorine atom and a trifluoromethyl group are especially preferred.

1a represents an integer of from 0 to 2, preferably 0; 1b represents an integer of from 0 to 6, preferably 0; and 1c represents an integer of from 0 to 7, preferably an integer of from 0 to 3.

As the divalent linking group represented by $L_1$, e.g., an alkylene group, a cycloalkylene group, an alkenylene group, an arylene group, $-O-$, $-S-$, $-O-R_{22a}-$, $-O-C(=O)-R_{22b}-$, $-C(=O)-O-R_{22c}-$, and $-C(=O)-N(R_{22d})-R_{22e}-$ can be exemplified. $R_{22a}$, $R_{22b}$, $R_{22c}$ and $R_{22e}$ each independently represents a divalent alkylene group, cycloalkylene group, alkenylene group or arylene group that may have a single bond, an ether group, an ester group, an amido group, a urethane group or a uriedo group. $R_{22d}$ represents a hydrogen atom, an alkyl group (preferably having from 1 to 5 carbon atoms), a cycloalkyl group (preferably having from 3 to 10 carbon atoms), an aralkyl group (preferably having from 7 to 10 carbon atoms), or an aryl group (preferably having from 6 to 10 carbon atoms).

As the alkylene, a straight chain or branched alkylene group having from 1 to 8 carbon atoms is preferred, e.g., a methylene group, an ethylene group, a propylene group, a butylene group, a hexylene group, and an octylene group are exemplified.

As the cycloalkylene group, a cycloalkylene group having from 5 to 12 carbon atoms is preferred, and a monocyclic residue e.g., a cyclopentylene group and a cyclohexylene group, and a polycyclic residue, e.g., a normomane skeleton and an adamantane skeleton are exemplified.

As the alkenylene group, an alkenylene group having from 2 to 6 carbon atoms is preferred, e.g., an ethenylene group, a propenylene group and a butenylene group are exemplified.

As the arylene group, an arylene group having from 6 to 15 carbon atoms is preferred, e.g., a phenylene group, a tolylene group and a naphthylene group are exemplified.

As the substituents that the divalent linking group represented by $L_1$ may have, a halogen atom, e.g., a fluorine atom and a chlorine atom, and a cyano group are exemplified, of which a fluorine atom is preferred.

$L_1$ preferably represents a single bond, a methylene group or an $-O-$ group.

As the alkylene represented by X, an alkylene group having from 1 to 8 carbon atoms, e.g., a methylene group, an ethylene group, a propylene group, a butylene group, a hexylene group, and an octylene group are exemplified.

As the alkenylene group represented by X, an alkenylene group having from 2 to 6 carbon atoms, e.g., an ethenylene group, a propenylene group and a butenylene group are exemplified.

As the cycloalkylene group represented by X, a cycloalkylene group having from 5 to 8 carbon atoms, e.g., a cyclopentylene group and a cyclohexylene group are exemplified.

As the arylene group represented by X, an arylene group having from 6 to 15 carbon atoms, e g., a phenylene group, a tolylene group and a naphthylene group are exemplified.

The organic groups represented by Y include both an acid-decomposable group and a non-acid-decomposable group, and an organic group having from 1 to 30 carbon atoms is preferred. As the acid-decomposable organic groups represented by Y, e.g., $-C(R_{11a})(R_{12a})(R_{13a})$, $-C(R_{14a})(R_{15a})(OR_{16a})$, and $-Xa-COO-C(R_{11a})(R_{12a})(R_{13a})$ are exemplified.

$R_{11a}$, $R_{12a}$, $R_{13a}$ and $R_{16a}$ each independently represents an alkyl group, a cycloalkyl group, an alkenyl group, an aralkyl group, or an aryl group.

$R_{14a}$ and $R_{15a}$ each independently represents a hydrogen atom or an alkyl group.

Incidentally, two of $R_{11a}$, $R_{12a}$ and $R_{13a}$, and two of $R_{14a}$, $R_{15a}$ and $R_{16a}$ may be bonded to each other to form a ring.

Xa represents a single bond, an alkylene group, a cycloalkylene group, an alkenylene group or an arylene group.

As the alkyl group represented by $R_{11a}$, $R_{12a}$, $R_{13a}$, $R_{14a}$, $R_{15a}$ and $R_{16a}$, an alkyl group having from 1 to 8 carbon atoms that may have a substituent is preferred, e.g., a methyl group, an ethyl group, a propyl group, an n-butyl group, a sec-butyl group, a hexyl group, a 2-ethylhexyl group, an octyl group, a fluoroalkyl group (e.g., a monofluoromethyl group, a difluoromethyl group, a trifluoromethyl group, a pentafluoro-ethyl group, etc.) can be exemplified. Of these fluoroalkyl groups, a trifluoromethyl group is most preferred.

The cycloalkyl group represented by $R_{11a}$, $R_{12a}$, $R_{13a}$ and $R_{16a}$ may have a substituent, and may be monocyclic or polycyclic. As a monocyclic group, a cycloalkyl group having from 3 to 8 carbon atoms is preferred, e.g., a cyclopropyl group, a cyclopentyl group, a cyclohexyl group, a cyclobutyl group, and a cyclooctyl group can be exemplified. As a polycyclic group, a cycloalkyl group having from 6 to 20 carbon atoms is preferred, e.g., an adamantyl group, a norbornyl group, an isoboronyl group, a camphanyl group, a dicyclopentyl group, an α-pinel group, a tricyclodecanyl group, a tetracyclododecyl group, and an androstanyl group can be exemplified. Incidentally, the carbon atoms in the cycloalkyl group may be partially substituted with hetero atoms such as an oxygen atom.

The aryl group represented by $R_{11a}$, $R_{12a}$, $R_{13a}$ and $R_{16a}$ is preferably an aryl group having from 6 to 10 carbon atoms that may have a substituent, e.g., a phenyl group, a tolyl group, a dimethylphenyl group, a 2,4,6-trimethylphenyl group, a naphthyl group, an anthryl group, and a 9,10-dimethoxyanthryl group can be exemplified.

The aralkyl group represented by $R_{11a}$, $R_{12a}$, $R_{13a}$ and $R_{16a}$ is preferably an aralkyl group having from 7 to 12 carbon atoms that may have a substituent, e.g., a benzyl group, a phenethyl group, and a naphthylmethyl group can be exemplified.

The alkenyl group represented by $R_{11a}$, $R_{12a}$, $R_{13a}$ and $R_{16a}$ is preferably an alkenyl group having from 2 to 8 carbon atoms that may have a substituent, e.g., a vinyl group, an allyl group, a butenyl group, and a cyclohexenyl group can be exemplified.

As the examples of the substituents that $R_{11a}$, $R_{12a}$, $R_{13a}$, $R_{14a}$, $R_{15a}$ and $R_{16a}$ may have, e.g., an alkyl group, a cycloalkyl group, an aryl group, an amino group, an amido group, a ureido group, a urethane group, a hydroxyl group, a carboxyl group, a halogen atom, an alkoxyl group, a thioether group, an acyl group, an acyloxy group, an alkoxycarbonyl group, a cyano group and a nitro group can be exemplified.

As the preferred examples of the acid-decomposable groups represented by Y, a tertiary alkyl group, e.g., a t-butyl group, a t-amyl group, a 1-alkyl-1-cyclohexyl group, a 2-alkyl-2-adamantyl group, a 2-adamantyl-2-propyl group, and a 2-(4-methylcyclohexyl)-2-propyl group, an acetal group, e.g., a 1-alkoxy-1-ethoxy group, a 1-alkoxy-1-methoxy group, and a tetrahydropyranyl group, and a t-alkylcarbonyl group and a t-alkylcarbonylmethyl group are preferably exemplified.

The non-acid-decomposable organic group represented by Y is an organic group incapable of decomposing by the action of an acid, e.g., an alkyl group, a cycloalkyl group, an aryl group, an aralkyl group, an alkoxyl group, an alkoxycarbonyl group, an amido group and a cyano group that are incapable of decomposing by the action of an acid can be exemplified. As the alkyl group, a straight chain or branched alkyl group having from 1 to 10 carbon atoms is preferred, e.g., a methyl group, an ethyl group, a propyl group, an n-butyl group, a sec-butyl group, a hexyl group, a 2-ethylhexyl group and an octyl group can be exemplified. As the cycloalkyl group, a cycloalkyl group having from 3 to 10 carbon atoms is preferred, e.g., a cyclopropyl group, a cyclobutyl group, a cyclohexyl group and an adamantyl group can be exemplified. As the aryl group, an aryl group having from 6 to 14 carbon atoms is preferred, e.g., a phenyl group, a naphthyl group and an anthracenyl group can be exemplified. As the aralkyl group, an aralkyl group having from 6 to 12 carbon atoms is preferred, e.g., a benzyl group, a phenethyl group and a cumyl group can be exemplified. As the alkoxyl group in the alkoxyl group and the alkoxycarbonyl group, an alkoxyl group having from 1 to 5 carbon atoms is preferred, e.g., a methoxy group, an ethoxy group, a propoxy group, an n-butoxy group and an isobutoxy group can be exemplified.

The preferred specific examples of the repeating units represented by formula (I) are shown below, but the invention is not restricted thereto.

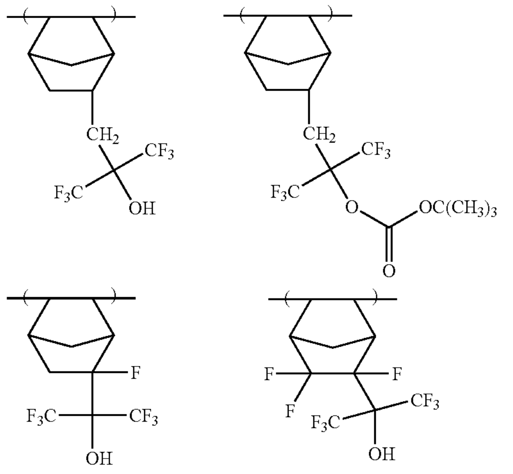

In formula (II), as the alkyl group represented by $R_{x1}$, $R_{x2}$ and $R_{x3}$, the same alkyl group as the alkyl group represented by $R_{k1}$, $R_{k2}$ and $R_{k3}$ in formula (I) can be exemplified.

When $R_{x1}$, $R_{x2}$ and $R_{x3}$ each is a group represented by $-L_3-C(R_{f1})(R_{f2})Ra$, as the alkyl group represented by $R_{f1}$ and $R_{f2}$, the same alkyl group as the alkyl group represented by $R_{k1}$, $R_{k2}$ and $R_{k3}$ in formula (I) can be exemplified.

As the alkylene group represented by $L_3$, the same alkylene group as the divalent alkylene group represented by $L_1$ in formula (I) can be exemplified.

As the alkyl group represented by $R_1$ and $R_m$, an alkyl group having from 1 to 3 carbon atoms is preferred, specifically a methyl group, an ethyl group, a propyl group, an isopropyl group and a fluoroalkyl group are exemplified. Of unsubstituted alkyl groups, a methyl group is most preferred. A fluoroalkyl group having from 1 to 4 carbon atoms is preferred as the fluoroalkyl group, specifically a monofluoromethyl group, a difluoromethyl group, a trifluoromethyl group, a pentafluoro-ethyl group, a heptafluoropropyl group, and a nonafluorobutyl group are exemplified, and a trifluoromethyl group is most preferred.

As the alkylene group represented by $Z_1$, the same alkylene group as the divalent alkylene group represented by $L_1$ in formula (I) can be exemplified.

The cycloalkylene group represented by $Z_1$ may have a substituent, may be monocyclic, or may be polycyclic. As the examples of the substituents, e.g., an alkyl group, an alkoxyl group, a halogen atom and a cyano group are exemplified. The monocyclic cycloalkylene group is preferably a cycloalkylene group having from 3 to 8 carbon atoms, e.g., a cyclopropylene group, a cyclopentylene group, a cyclohexylene group, a cycloheptylene group and a cyclooctylene group are preferably exemplified. The polycyclic cycloalkylene group is preferably a cycloalkylene group having from 6 to 20 carbon atoms, e.g., an adamantyl residue, a norbornyl residue, an isoboronyl residue, a camphenyl residue, a dicyclopentyl residue, an a-pinel residue, a tricyclodecanyl residue, a tetracyclododecyl residue, and an androstanyl residue can be exemplified as preferred examples. The carbon atoms in the above monocyclic or polycyclic cycloalkylne group may be substituted with hetero atoms such as an oxygen atom. As the substituent of the cycloalkylene group, a fluorine atom is preferred, and as the cycloalkylene group substituted with a fluorine atom (the cycloalkylene group at least one hydrogen atom of which is substituted with a fluorine atom), e.g., a perfluorocyclopropylene group, a perfluorocyclopentylene group, a perfluorocyclohexylene group, a perfluorocycloheptylene group, and a perfluorocyclooctylene group can be exemplified.

As the arylene group represented by $Z_1$, an arylene group having from 4 to 20 carbon atoms is preferred, e.g., a phenylene group, a tolylene group and a naphthylene group are exemplified.

As the divalent linking group represented by $L_1$, the same divalent linking group as represented by $L_1$ in formula (I) can be exemplified.

As the organic group represented by Y, the same organic group as represented by Y in formula (I) can be exemplified.

The specific examples of the repeating units represented by formula (II) are shown below, but the invention is not limited thereto.

(X=H, $CH_3$, $CF_3$, F or $CH_2OH$)

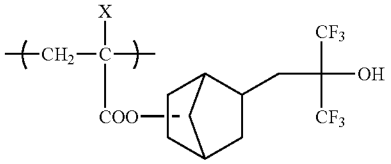

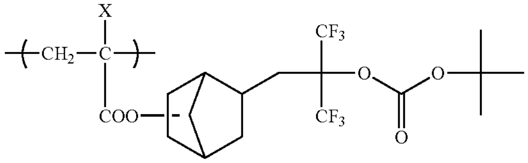

It is also preferred for the resin in the invention to contain a fluorine-containing repeating unit represented by any of the following formulae (IV), (V), (VI), (VII), (VIII) and (IX).

(IV)

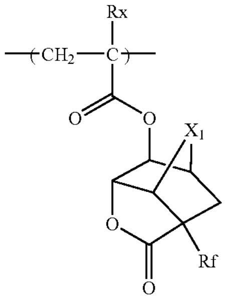

-continued (V)

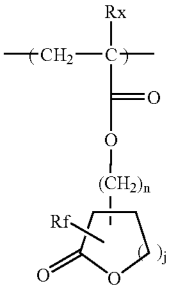

(VI)

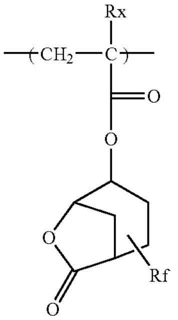

(VII)

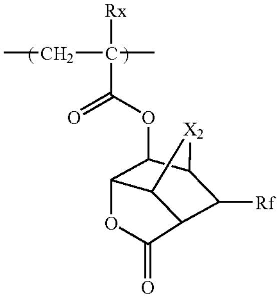

(VIII)

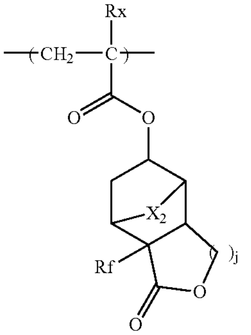

(IX)

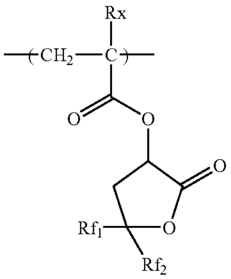

In the above formulae, $X_1$ represents an oxygen atom or a sulfur atom; $X_2$ represents a methylene group, an oxygen atom or a sulfur atom; Rx represents a hydrogen atom, a fluorine atom, a chlorine atom, a cyano group, an alkyl group, or -$L_3$-CRa; $L_3$ represents an alkylene group, —$CH_2O$—, —$CH_2(C{=}O)$—; and Ra represents a hydroxyl group, a lactone group or a fluoroalkyl group; Rf, $Rf_1$ and $Rf_2$ each independently represents a group having at least one or more fluorine atom, $Rf_1$ and $Rf_2$ may be bonded to each other to form a ring having —$(CF_2)_{n1}$—; $n_1$ represents an integer of 1 or more; and j represents an integer of 1 to 3.

In formulae (IV) to (IX), as the alkyl group, the same alkyl group as represented by $R_{k1}$, $R_{k2}$ and $R_{k3}$ in formula (I) can be exemplified, and as the alkylene group, the same divalent alkylene group represented by $L_1$ in formula (I) can be exemplified.

The lactone group has a lactone structure represented by any of formulae (LC1-1) to (LC1-12).

As the fluoroalkyl group, a fluoroalkyl group having from 1 to 4 carbon atoms is preferred, and specifically a monofluoro-methyl group, a difluoromethyl group, a trifluoromethyl group, a pentafluoroethyl group, a heptafluoropropyl group, a nonafluorobutyl group, a hexafluoroisopropyl group, a nonafluoro-t-butyl group, and a trifluoroisopropyl group are exemplified.

$n_1$ represents an integer of 1 or more, preferably from 3 to 6.

The specific examples of the repeating units represented by formula (IV) are shown below, but the invention is not limited thereto.

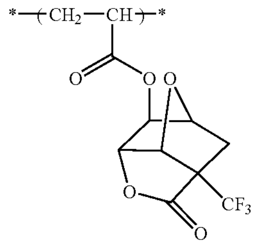
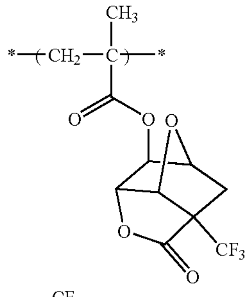
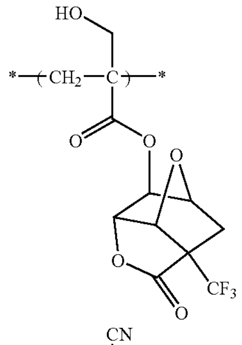
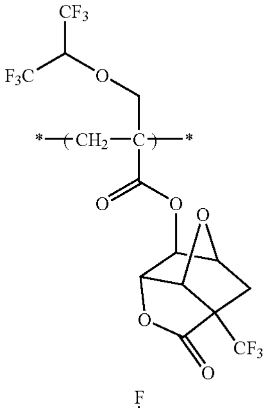
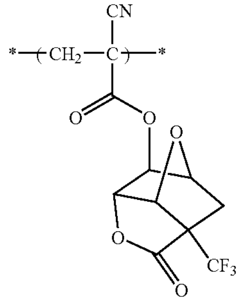
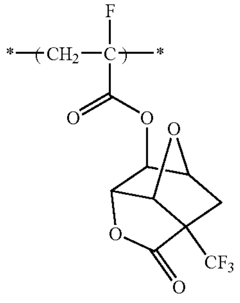

-continued

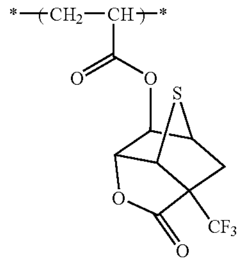
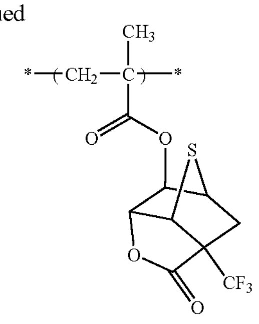
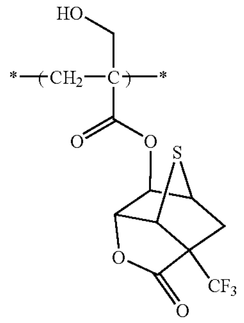

The specific examples of the repeating units represented by formula (V) are shown below, but the invention is not limited thereto.

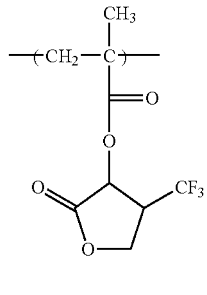
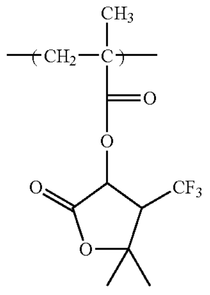
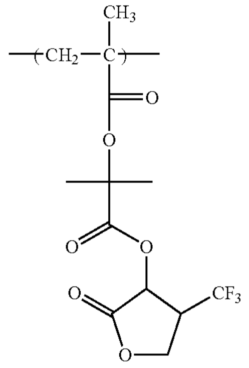
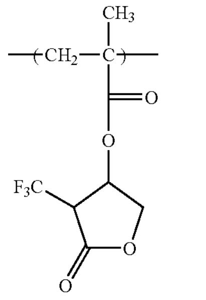

-continued
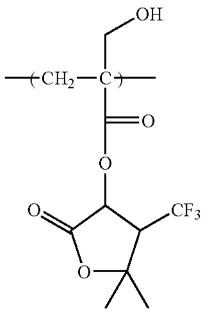
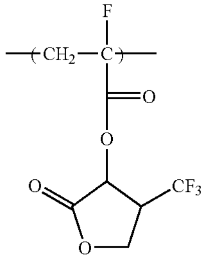
The specific examples of the repeating units represented by formula (VI) are shown below, but the invention is not limited thereto.
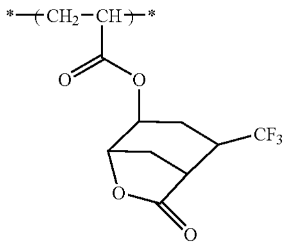
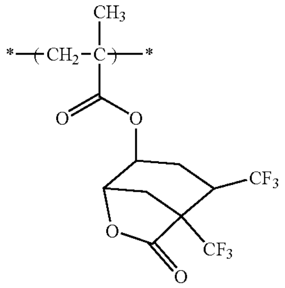
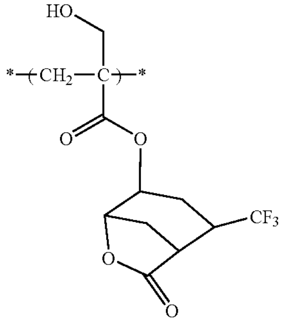
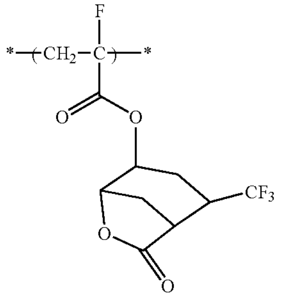
-continued
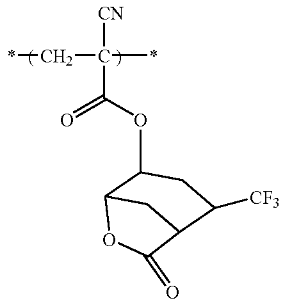
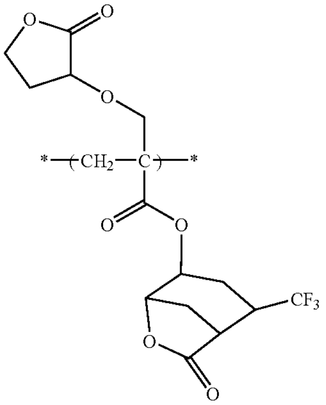
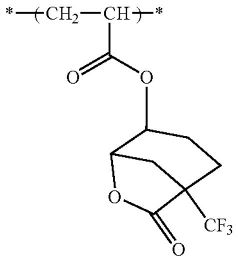
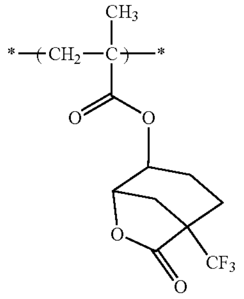
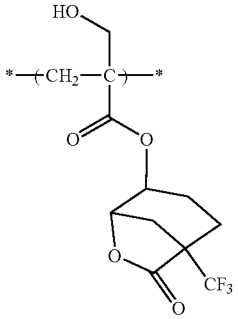
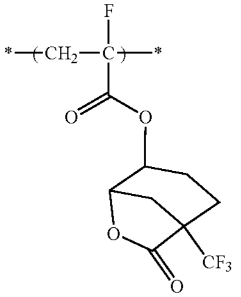

-continued
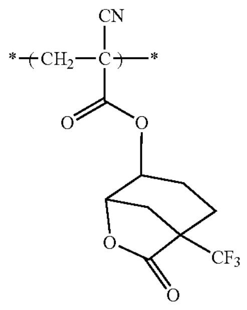
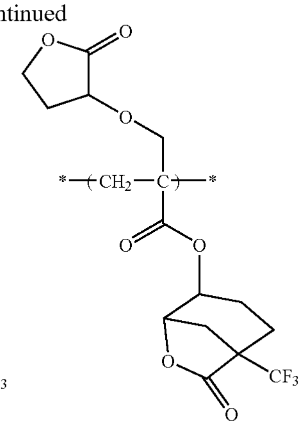
The specific examples of the repeating units represented by formula (VII) are shown below, but the invention is not limited thereto.
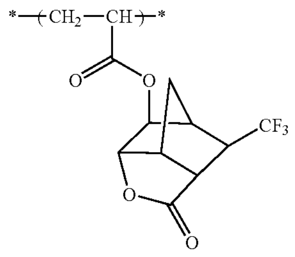
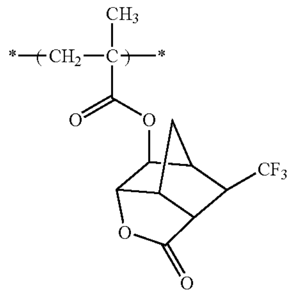
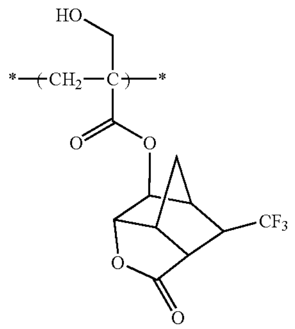
-continued
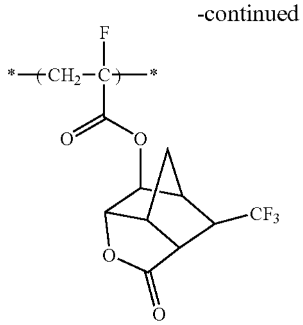
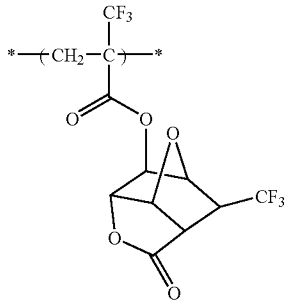
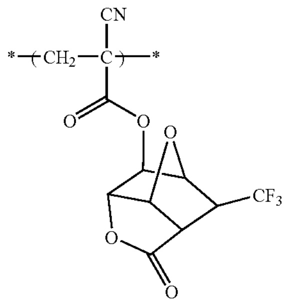
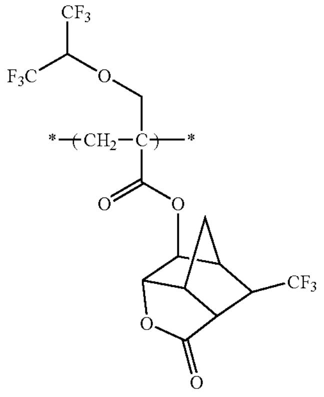
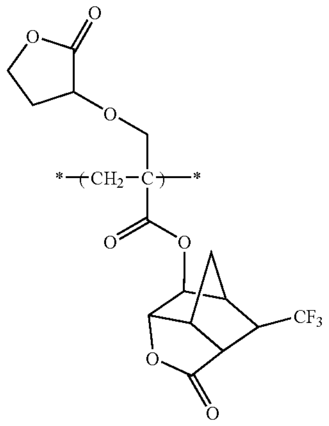

-continued

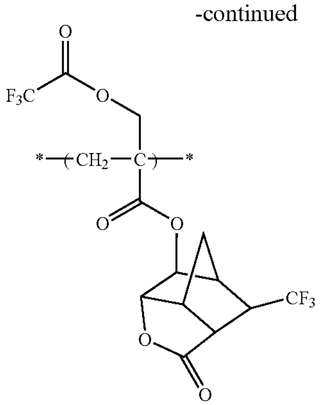

The specific examples of the repeating units represented by formula (VIII) are shown below, but the invention is not limited thereto.

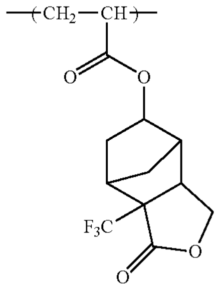

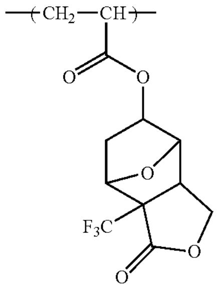

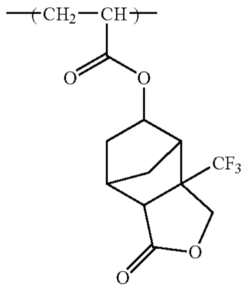

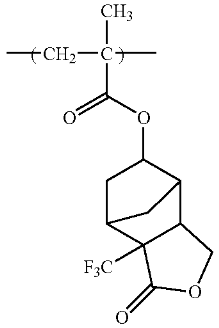

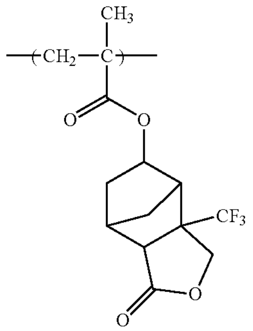

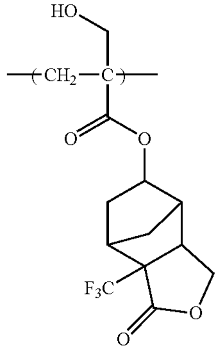

-continued

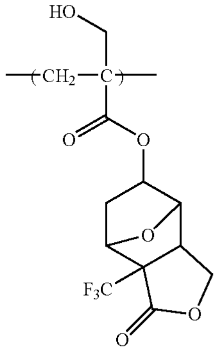

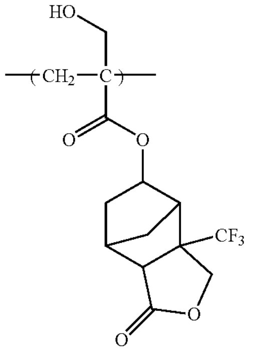

The specific examples of the repeating units represented by formula (IX) are shown below, but the invention is not limited thereto.

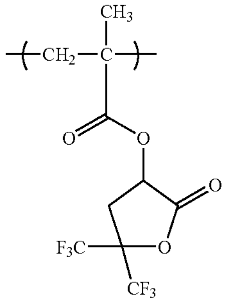

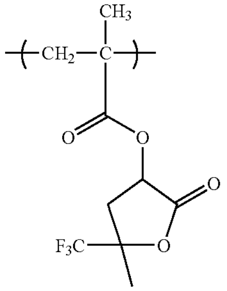

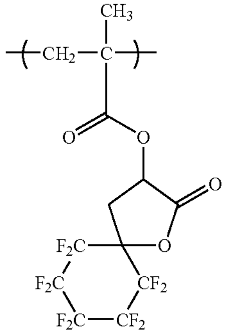

The resin in the invention may contain a fluorine-containing repeating unit represented by any of the following formulae (XI), (XII), (XIII), (XIV) and (XV).

(XI)

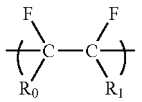

(XII)

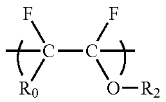

(XIII)

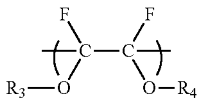

-continued (XIV)

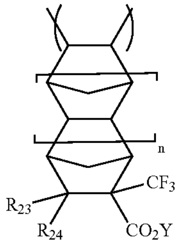

(XV)

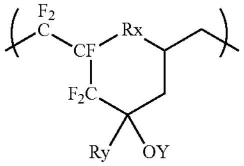

In formulae (XI) to (XIII), $R_0$ and $R_1$ each independently represents a hydrogen atom, a fluorine atom, or an alkyl, cycloalkyl or aryl group each of which may have a substituent; $R_2$, $R_3$ and $R_4$ each independently represents an alkyl, cycloalkyl or aryl group each of which may have a substituent; $R_0$ and $R_1$, $R_0$ and $R_2$, and $R_3$ and $R_4$ may be bonded to each other to form a ring.

As the alkyl group represented by $R_0$ to $R_4$, the same group as the fluoroalkyl group represented by $R_{x1}$ to $R_{x3}$ in formula (II) can be exemplified.

The cycloalkyl group represented by $R_0$ to $R_4$ may have a substituent, and may be monocyclic or polycyclic. As the monocyclic group, a cycloalkyl group having from 3 to 8 carbon atoms is preferred, e.g., a cyclopropyl group, a cyclopentyl group, a cyclohexyl group, a cyclobutyl group, and a cyclooctyl group can be exemplified. As the polycyclic group, a cycloalkyl group having from 6 to 20 carbon atoms is preferred, e.g., an adamantyl group, a norbornyl group, an isoboronyl group, a camphanyl group, a dicyclopentyl group, an α-pinel group, a tricyclodecanyl group, a tetracyclododecyl group and an androstanyl group can be exemplified. Incidentally, the carbon atoms in the cycloalkyl group may be partially substituted with hetero atoms such as an oxygen atom.

The aryl group represented by $R_0$ to $R_4$ is preferably an aryl group having from 6 to 10 carbon atoms that may have a substituent, e.g., a phenyl group, a tolyl group, a dimethylphenyl group, a 2,4,6-trimethylphenyl group, a naphthyl group, an anthryl group, and a 9,10-dimethoxyanthryl group can be exemplified.

The specific examples of the repeating units represented by formulae (XI) to (XIII) are shown below, but the invention is not limited thereto.

(F-1)

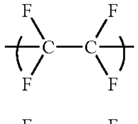

(F-2)

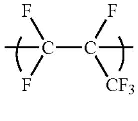

-continued (F-11)

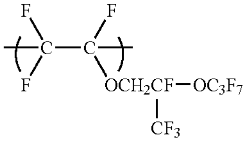

(F-13)

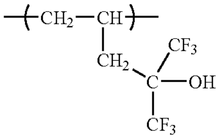

In formula (XIV), $R_{23}$ and $R_{24}$, which may be the same or different, each independently represents a hydrogen atom, a halogen atom, a cyano group, an alkyl group, a fluoroalkyl group, or an alkoxyl group; and Y represents a hydrogen atom or an organic group.

As the alkyl group represented by $R_{23}$ and $R_{24}$, the same alkyl group as represented by $R_{k1}$ in formula (I) can be exemplified.

As the alkoxyl group represented by $R_{23}$ and $R_{24}$, the same alkoxyl group as represented by $R_{k1}$ in formula (I) can be exemplified.

As the organic group represented by Y, the same organic group as represented by Y in formula (I) can be exemplified.

The specific examples of the repeating units represented by formula (XIV) are shown below, but the invention is not limited thereto.

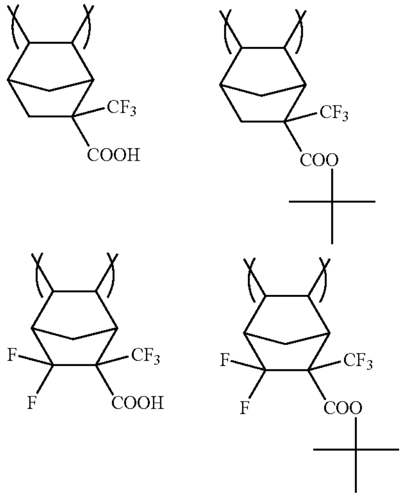

In formula (XV), Rx represents a single bond or a divalent-alkylene group; Ry represents a hydrogen atom, a fluorine atom or an alkyl group; and Y represents a hydrogen atom or an organic group.

In formula (XV), the divalent alkylene group represented by Rx is preferably a divalent alkylene having from 1 to 6 carbon atoms, and a methylene group, an ethylene group and a propylene group are more preferred.

As the alkyl group represented by Ry, the same alkyl group as represented by $R_{x1}$ to $R_{x3}$ in formula (II) can be exemplified.

As the organic group represented by Y, the same organic group as represented by Y in formula (I) can be exemplified.

The specific examples of the repeating units represented by formula (XV) are shown below, but the invention is not limited thereto.

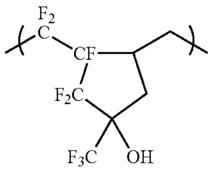

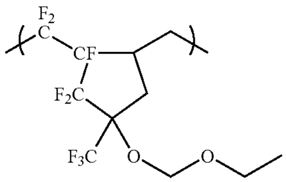

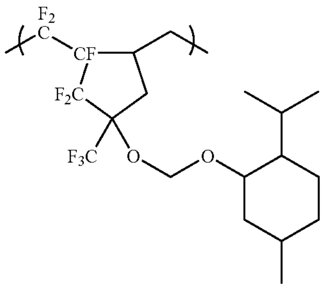

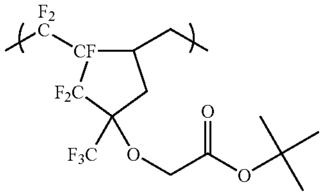

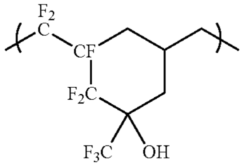

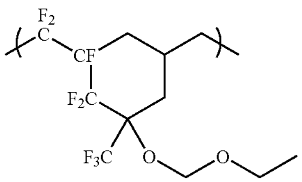

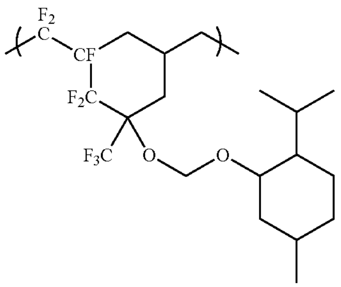

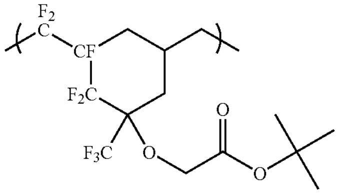

Commercially available products can be used as these fluorine-containing repeating units, or they can be synthesized according to ordinary methods.

For instance, monomer (IV-a) shown below can be synthesized by the esterification of the following shown compound (a). Further, compound (a) can be synthesized from the following shown compound (b) that is obtained by Diels-Alder reaction of furan and trifluoromethylacrylic acid.

(IV-a)

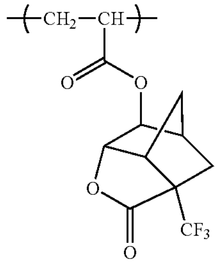

(a)

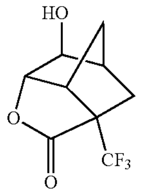

(b)

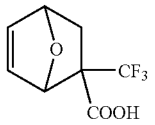

The content of the fluorine-containing repeating units described above in the resin of the invention is generally from 0 to 80 mol % in resin (A), preferably from 0 to 30 mol %, and more preferably from 5 to 20 mol %.

Besides the above repeating structural units, the resin in the invention can contain various repeating structural units for the purpose of adjusting dry etching resistance, the suitability for standard developer, adhesion to substrates, resist profile, in addition, general requisite characteristics of the resist, such as resolution, heat resistance, and sensitivity.

As such repeating structural units, repeating structural units corresponding to the monomers shown below can be exemplified, but the invention is not restricted thereto.

By containing these various repeating structural units, fine adjustment of performances required of the resins, in particular fine adjustment of the following performances becomes possible, that is, (1) Solubility in a coating solvent, (2) A film-forming property (a glass transition point), (3) Alkali developability, (4) Decrease of layer thickness (selection of hydrophobic-hydrophilic property and alkali-soluble groups), (5) Adhesion of an unexposed area to a substrate, and (6) Dry etching resistance.

The examples of such monomers include compounds having one addition polymerizable unsaturated bond selected from acrylates, methacrylates, acrylamides, methacrylamides, allyl compounds, vinyl ethers and vinyl esters.

In addition to these compounds, addition polymerizable unsaturated compounds copolymerizable with the monomers corresponding to the above various repeating structural units may be used for copolymerization.

In the resin of the invention, the molar ratio of the content of each repeating structural unit is arbitrarily selected to adjust dry etching resistance, the suitability for standard developer, adhesion to the substrate, and profile of the resist, in addition to these, to adjust general requisite characteristics of the resist, e.g., resolution, heat resistance and sensitivity.

It is preferred that resin (A) in the invention contains each of a monomer containing a fluorine atom, a monomer containing a lactone group, a monomer containing a hydroxyl group, and a monomer containing an acid-decomposable group, and it is more preferred to contain each of a lactone group-containing monomer containing a fluorine atom, a monomer containing a hydroxyl group, and a monomer containing an acid-decomposable group.

In the resin of the invention, the content of a repeating unit containing an acid-decomposable group is preferably from 20 to 60 mol % in all the repeating structural units, more preferably from 30 to 60 mol %, and still more preferably from 30 to 50 mol %.

In the resin of the invention, the content of a repeating unit having a lactone structure is preferably from 20 to 60 mol %, more preferably from 30 to 60 mol %, and the content of a repeating unit having a partial structure containing the alicyclic hydrocarbon represented by any of formulae (pI) to (pVI) is preferably from 20 to 60 mol % in all the repeating structural units, more preferably from 30 to 60 mol %, and still more preferably from 30 to 50 mol %.

The content of the repeating structural units on the basis of the monomers of the further copolymer components in the resin can also be optionally set according to the desired resist performances, and the content is generally preferably 99 mol % or less based on the total mol number of a repeating structural unit having a partial structure containing the alicyclic hydrocarbon represented by any of formulae (pI) to (pVI), more preferably 90 mol % or less, and still more preferably 80 mol % or less.

The resin for use in the invention can be synthesized according to ordinary methods (e.g., radical polymerization). For example, as ordinary methods, a monomer seed is put in a reaction vessel at a time or in parts during the course of the reaction, and, according to necessity, the monomer is dissolved in a reaction solvent such as cyclic ethers, e.g., tetrahydrofuran or 1,4-dioxane, ketones, e.g., methyl ethyl ketone, methyl isobutyl ketone or cyclohexanone, or the later-described solvents capable of dissolving the composition of the invention, e.g., propyelne glycol monomethyl ether acetate or propyelne glycol monomethyl ether, to make the monomer homogeneous. The solution is then heated, if necessary, under an inert gas atmosphere such as nitrogen or argon, and polymerization is initiated with a commercially available radical polymerization initiator (e.g., an azo initiator, peroxide and the like). If necessary, the initiator is further added at a time or in parts, and after completion of the reaction, the reaction system is put into a solvent, and a desired polymer is recovered as powder or solid. The reaction concentration is 10 mass % or more, preferably 15 mass % or more, and more preferably 20 mass % or more. (In this specification, mass % is equal to weight %.) The reaction temperature is from 10 to 150° C., preferably from 30 to 130° C., and more preferably from 50 to 110° C.

The repeating structural unit in the above specific example may be used one kind alone, or a plurality of repeating units may be used as mixture.

Further, a resin may be used one kind alone in the invention, or a plurality of resins may be used in combination.

In the invention, the proportion of the amount of the component having a molecular weight of 1,000 or less in resin (A) is 20% or less of the entire area in the pattern area by gel permeation chromatography (GPC), preferably from 0 to 10%, and more preferably from 0 to 5%. To be more precise, the proportion of the component having a molecular weight of 1,000 or less is a value obtained by $\{(A)/[(A)+(B)]\}\times 100(\%)$, taking the monodispersed PHS (polystyrene) having a molecular weight (Mw) of 1,000 as standard, a pattern area detected on the side lower than the molecular weight of 1,000 measured by RI of GPC as (A), and a pattern area detected on the higher molecular weight side as (B).

The detailed conditions of the above measurement in the present invention are as follows.

Type of column:

TSKgel GMH (XL), TSKgel G4000H (XL), TSKgel G3000H (XL), TSKgel G2000H (XL) (all produced by TOSOH CORPORATION)

Developing solvent: Tetrahydrofuran

Flow rate: 1 μL/min

Temperature: 40° C.

Sample concentration: 40 g/L

Injection amount of sample: 100 μL

Commercially available products can be used as the resin that is little in unpolymerized residual monomer component of low molecular weight as above, or such a resin can be synthesized with a living radical polymerization initiator, or the resin can also be manufactured by removing a low molecular weight component with the purification by the solvent fraction.

In the first place, the purification by the solvent fraction is explained. Ordinary methods can be applied to the purification by the solvent fraction, e.g., a method of liquid-liquid extraction of removing residual monomer and oligomer components by combining water washing and appropriate solvent, a method of purification in a state of solution, such as ultrafiltration, of removing only residual monomers having a molecular weight lower than a specific molecular weight by extraction, a reprecipitation method of removing residual monomers by dropping a resin solution to a poor solvent to thereby solidify the resin in the solvent, and a method of purification in a solid state by washing filtered resin slurry with a poor solvent can be used. For example, after radical polymerization reaction, the reaction solution is brought into contact with a hardly soluble or insoluble solvent (poor solvent) of the acid-decomposable resin in an amount of less than 5 times the volume of the reaction solution, preferably from 4.5 to 0.5 times, more preferably from 3 to 0.5 times, and still more preferably from 1 to 0.5 times, whereby a resin is precipitated as a solid.

The solvents for use in precipitation or reprecipitation from a polymer solution (precipitation or reprecipitation solvents) should be sufficient so long as they are poor solvents of the polymer, and according to the kind of polymer the solvent can be used arbitrarily selected from, e.g., hydrocarbons (aliphatic hydrocarbons, e.g., pentane, hexane, heptane, octane, etc.; alicyclic hydrocarbons, e.g., cyclohexane, methylcyclohexane, etc.; aromatic hydrocarbons, e.g., benzene, toluene, xylene, etc.), halogenated hydrocarbons (halogenated aliphatic hydrocarbons, e.g., methylene chloride, chloroform, carbon tetrachloride, etc.; halogenated aromatic hydrocarbons, e.g., chlorobenzene, dichlorobenzene, etc.), nitro compounds (nitromethane, nitroethane, etc.), nitrites (acetonitrile, benzonitrile, etc.), ethers (chain ethers, e.g., diethyl ether, diisopropyl ether, dimethoxyethane, etc.; cyclic ethers, e.g., tetrahydrofuran, dioxane, etc.), ketones (acetone, methyl ethyl ketone, diisobutyl ketone, etc.), esters (ethyl acetate, butyl acetate, etc.), carbonates (dimethyl carbonate, diethyl carbonate, ethylene carbonate, propylene carbonate, etc.), alcohols (methol, ethanol, propanol, isopropyl alcohol, butanol, etc.), carboxylic acids (acetic acid), and mixed solvents containing these solvents. Of these solvents, solvents containing at least hydrocarbon (especially, aliphatic hydrocarbon such as hexane, etc.) are preferred as the precipitation or reprecipitation solvents. In these solvents containing at least hydrocarbon, the proportion of the hydrocarbon (for example, aliphatic hydrocarbon, e.g., hexane) and other solvents (for example, ester, e.g., ethyl acetate, alcohols, e.g., methanol, ethanol, etc.) is the former/the latter (volume ratio, at 25° C.) of from 10/90 to 99/1, preferably the former/the latter (volume ratio, at 25° C.) of from 30/70 to 98/2, and more preferably the former/the latter (volume ratio, at 25° C.) of from 50/50 to 97/3 or so.

The use amount of a precipitation or reprecipitation solvent can be arbitrarily selected taking efficiency and yield into consideration, but generally the amount is from 100 to 10,000 weight parts per 100 weight parts of the polymer solution, preferably from 200 to 2,000 weight parts, and more preferably from 300 to 1,000 weight parts.

The caliber of a nozzle in supplying a polymer solution to a precipitation or reprecipitation solvent (a poor solvent) is preferably 4 mmφ or less (e.g., from 0.2 to 4 mmφ). The supplying rate (the dropping rate) of a polymer solution to a poor solvent is, for example, from 0.1 to 10 m/sec in linear velocity, preferably from 0.3 to 5 m/sec.

It is preferred that precipitation or reprecipitation operation is carried out with stirring. As stirring blades for use in stirring, a desk turbine, a fan turbine (including a paddle), a bent blade turbine, a blade turbine, a faudler type, a bull margin type, an angled blade fan turbine, a propeller, a multi-stage type, an anchor type (or a horseshoe type), a gate type, a double ribbon, and a screw can be used. It is preferred to continue stirring after completion of the supply of a polymer solution for further 10 minutes or more, especially preferably for 20 minutes or more. When stirring time is short, there are cases where the content of monomer in polymer particles cannot be sufficiently reduced. It is also possible to mix and stir a polymer solution and a poor solvent with a line mixer in place of a stirring blade.

The temperature in carrying out precipitation or reprecipitation can be arbitrarily selected taking efficiency and workability into consideration, but the temperature is generally from 0 to 50° C. or so, preferably around room temperature (e.g., from 20 to 35° C. or so). Precipitation or reprecipitation can be carried out according to well-known methods such as a batch system and a continuous system with generally used mixers, e.g., a stirring tank.

A precipitated or reprecipitated particulate polymer is generally subjected to filtration, ordinary solid-liquid separation such as centrifugation, drying, and offered to use. Filtration is performed with a filter resisting to solvents preferably under pressure. Drying is generally carried out under atmospheric pressure or reduced pressure (preferably under reduced pressure), at a temperature of from 30 to 100° C. or so, preferably from 30 to 50° C. or so.

Incidentally, a resin may be dissolved in a solvent after once being precipitated and separated, and then may be brought into contact with a hardly soluble or insoluble solvent of the resin.

That is, a method comprising the following processes can be used: after completion of radical polymerization reaction, the polymer solution is brought into contact with a hardly soluble or insoluble solvent of the acid-decomposable resin to precipitate a resin (process a), the resin is separated from the solution (process b), the resin is again dissolved in a solvent to prepare resin solution A (process c), a resin as a solid is precipitated by bringing resin solution A into contact with a hardly soluble or insoluble solvent of the resin in an amount of less than 5 times the volume of resin solution A, preferably 3 times or less (process d), and the precipitated resin is separated (process e).

As the solvent for use in preparing resin solution A, the same solvent as the solvent used for dissolving a monomer in polymerization reaction can be used, that is, the solvent used for the preparation of resin solution A may be the same with or different from the solvent used in polymerization reaction.

Living radical polymerization is described below.

Living radical polymerization using a living radical polymerization initiator is radical polymerization capable of maintaining the activity of polymer terminals, and pseudo living polymerization wherein polymer terminal inactivity and terminal activity are in equilibrium condition is also included in living radical polymerization. As the examples of living radical polymerizations, polymerization using a chain transfer agent such as polysulfide, polymerization using a radical scavenger (Macromolecules, 1994, 27, 7228) such as cobalt porphyrin complex (J. Am. Chem. Soc., 1994, 116, 7943), and a nitroxide compound, atomic transfer radical polymerization using an organic halogen compound and the like as an initiator and a transition metal complex as a catalyst (JP-A-2002-145972, JP-A-2002-80523, JP-A-2001-261733, JP-A-2000-264914), and polymerization having RCSS at growing terminals (WO 9801478A1, WO 9858974A1, WO 9935177A1, WO 9931144, U.S. Pat. No. 6,380,335 B1) are exemplified.

Of the living radical polymerizations for manufacturing acid-decomposable group-containing resins, in the example of using a thermal radical generator and a nitroxide compound as polymerization initiators, a method of using a radical scavenger in the nitroxide compound of living radical polymerization initiator is described in the first place. In this polymerization, stable nitroxy free radical (=N—O.) is generally used as a radical capping agent. As such compounds, although not limitative, nitroxy free radicals from cyclic hydroxylamine, e.g., 2,2,6,6-substituted-1-piperidinyloxy radical and 2,2,5,5-substituted-1-pyrrolidinyloxy radical, are preferred. As the substituents, an alkyl group having 4 or less carbon atoms, e.g., a methyl group or an ethyl group, is preferred.

As specific examples of nitroxy free radicals, although not limitative, 2,2,6,6-tetramethyl-1-piperidinyloxy radical (TEMPO), 2,2,6,6-tetraethyl-1-piperidinyloxy radical, 2,2,6,6-tetramethyl-4-oxo-1-piperidinyloxy radical, 2,2,5,5-tetramethyl-1-pyrrolidinyloxy radical, 1,1,3,3-tetramethyl-2-isoindolinyloxy radical, and N,N-di-t-butylamineoxy radical are exemplified. It is possible to use a stable radical such as a galvinoxyl free radical in place of a nitroxy free radical.

These radical capping agents are used in combination with a thermal radical generator. It is thought that the reaction product of a radical capping agent and a thermal radical generator becomes a polymerization initiator to advance the polymerization of an addition polymerizable monomer. The proportions of both compounds are not especially restricted, but it is suitable to use from 0.1 to 10 mols of a thermal radical generator to 1 mol of a radical capping agent.

Various compounds can be used as a thermal radical generator, but peroxides and azo compounds capable of generating radicals under the polymerization temperature condition are preferred. As such peroxides, although not limitative, diacyl peroxides, e.g., benzoyl peroxide and lauroyl peroxide; dialkyl peroxides, e.g., dicumyl peroxide and di-t-butyl peroxide; peroxycarbonates, e.g., diisopropyl peroxydicarbonate and bis(4-t-butylcyclohexyl) peroxy-dicarbonate; and alkyl peresters, e.g., t-butyl peroxyoctoate and t-butyl peroxybenzoate are exemplified. Benzoyl peroxide is especially preferred. As the azo compounds, 2,2'-azobis-isobutyronitrile, 2,2'-azobis(2,4-dimethylvaleronitrile), 2,2'-azobis(4-methoxy-2,4-dimethylvaleronitrile), and azobisisodimethyl butyrate are exemplified, and azobisiso-dimethyl butyrate and 2,2'-azobis-isobutyronitrile are especially preferred.

As reported in Macromolecules, Vol. 28, p. 2993 (1995), alkoxylamine compounds represented by formulae (9) and (10) as shown below can be used as polymerization initiators in place of using a thermal radical generator and a radical capping agent.

(9)

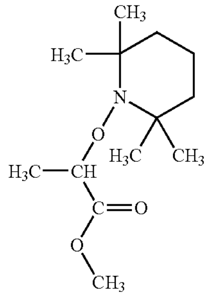

(10)

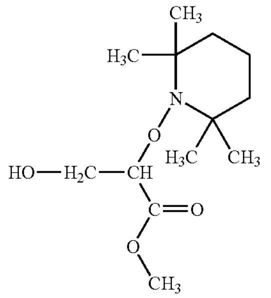

In a case where alkoxylamine compounds are used as polymerization initiators, a polymer having functional groups at terminals can be obtained by using a compound having a functional group such as a hydroxyl group as shown in formula (10).

Polymerization conditions of monomers, solvents and polymerization temperature used in the polymerization of using a radical scavenger such as the above nitroxide compounds are not restricted and these conditions may be the same as the conditions used in the atomic transfer radical polymerization described below.

As living radical polymerization initiators, polymerization initiators comprising a transition metal complex and an organic halogen compound, and Lewis acid or amine can be used.

As the central metal constituting the transition metal complex, the elements belonging to seventh to eleventh groups of the Periodic Table (according to the Periodic Table described in Kagaku Binran Kisohen I (Chemical Handbook, Elementary Course I), Revised $4^{th}$ Edition, compiled by Nippon Kagaku-Kai (1993)), such as iron, copper, nickel, rhodium, ruthenium and rhenium are preferably exemplified. Ruthenium and copper are especially preferred of these elements.

As the specific examples of the transition metal complexes having ruthenium as the central metal, dichlorotris-(triphenylphosphine)ruthenium, dichlorotris(tributyl-phosphine) ruthenium, dichloro(cyclooctadiene)ruthenium, dichlorobenzeneruthenium, dichloro-p-cymeneruthenium, dichloro(norboraadiene)ruthenium, cis-ichlorobis(2,2'-bipyridine)ruthenium, dichlorotris(1,10-phenanthroline)-ruthenium, carbonylchlorohydridetris(triphenylphosphine)-ruthenium, chlorocyclopentadienylbis(triphenylphosphine)-ruthenium, chloropentamethylcyclopentadienylbis (triphenyl-phosphine)ruthenium, and chloroindenylbis (triphenyl-phosphine)ruthenium are exemplified. Of these compounds, dichlorotris(triphenylphosphine)ruthenium, chloropenta-methylcyclopentadienylbis(triphenylphosphine)ruthenium, and chloroindenylbis(triphenylphosphine) rutheniuim are especially preferred.

Organic halogen compounds function as polymerization initiators. As such organic halogen compounds, an α-halogeno-carbonyl compound or an α-halogenocarboxylate can be used, and α-halogenocarboxylate is especially preferred. The specific examples thereof include ethyl 2-bromo-2-methylpropanoate, 2-hydroxyethyl 2-bromopropionate and dimethyl 2-chloro-2,4,4-trimethylglutarate.

Lewis acids or amines function as activating agents. As such Lewis acids, aluminum trialkoxides, e.g., aluminum triisopropoxide and aluminum tri(t-butoxide); bis-(substituted aryloxy)alkylaluminum, e.g., bis(2,6-di-t-butylphenoxy)methylaluminum and bis(2,4,6-tri-t-butyl-phenoxy) methylaluminum; tris(substituted aryloxy)aluminum, e.g., tris(2,6-iphenylphenoxy)aluminum; and titanium tetraalkoxide, e.g., titanium tetraisopropoxide can be exemplified. Aluminum trialkoxide is preferred, and aluminum triisopropoxide is especially preferred.

As amines, aliphatic amines such as aliphatic primary amines, e.g., methylamine, ethylamine, propylamine, isopropylamine and butylamine, aliphatic secondary amines, e.g., dimethylamine, diethylamine, dipropylarnine, diisopropylamine and dibutylamine, and aliphatic tertiary amines, e.g., trimethylamine, triethylamine, tripropylamine, triisopropylamine and tributylamine; aliphatic polyamines, e.g., N,N,N',N'-tetramethylethylenediamine, N,N,N',N",N"-pentamethyldiethylenetriamine, and 1,1,4,7,10,10-hexamethyltriethylenetetraminne; aromatic amines such as aromatic primary amines, e.g., aniline and toluidine, aromatic secondary amines, e.g., diphenylamine, aromatic tertiary amines, e.g., triphenylamine can be exemplified. Of these amines, aliphatic amines are preferred, and butylamine, dibutylamine and tributylamine are especially preferred.

The proportion of each component in a polymerization initiator comprising a transition metal complex and an organic halogen compound, and Lewis acid or amine is not always restricted, but polymerization is liable to be lagging when the proportion of a transition metal complex to an organic halogen compound is too low, in contrast with this, the molecular weight distribution of the obtained polymer is liable to broaden when the proportion is too high. Therefore, the molar ratio of a transition metal complex/an organic halogen compound is preferably in a range of from 0.05/1 to 1/1. Further, polymerization is liable to be lagging when the proportion of Lewis acid or amine to a transition metal complex is too low, on the other hand, the molecular weight distribution of the obtained polymer is liable to broaden when the proportion is too high, so that the molar ratio of an organic halogen compound/Lewis acid or amine is preferably in a range of from 1/1 to 1/10.

The living radical polymerization initiators can be generally prepared by blending a transition metal complex, a polymerization initiator of an organic halogen compound, and an activating agent of Lewis acid or amine by ordinary methods just before use. Alternatively, a transition metal complex, a polymerization initiator and an activating agent may be preserved separately, added severally to a polymerization reaction system, and blended in the polymerization reaction system to function as a living polymerization initiator.

As other living radical polymerization initiator, a compound represented by the following formula (8) can be exemplified.

(8)

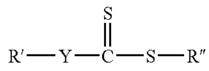

In formula (8), R' represents an alkyl group having from 1 to 15 carbon atoms or an aryl group that may contain an ester group, an ether group, an amino group or an amido group, Y represents a single bond, an oxygen atom, a nitrogen atom, or a sulfur atom, and R'' represents an alkyl group having from 1 to 15 carbon atoms or an aryl group that may contain an ester group, an ether group, or an amino group.

When Y represents a single bond, R' especially preferably represents a methyl group, an ethyl group, a propyl group, a butyl group, a cyclohexyl group, a norbornyl group, a dinorbornyl group, an adamantyl group, a phenyl group, a benzyl group, a hydroxymethyl group, a hydroxyethyl group, or a hydroxycyclohexyl group.

When Y represents an oxygen atom, R' especially preferably represents a methyl group, an ethyl group, a propyl group, a butyl group, a cyclohexyl group, a norbornyl group, a dinorbornyl group, an adamantyl group, a phenyl group, a benzyl group, a hydroxymethyl group, a hydroxyethyl group, or a hydroxycyclohexyl group.

When Y represents a nitrogen atom, R'—Y— in formula (8) is (R')(R')N—, and at that time, each R' especially preferably represents a methyl group, an ethyl group, a propyl group, a butyl group, a cyclohexyl group, a norbornyl group, a dinorbornyl group, an adamantyl group, a phenyl group, a benzyl group, a hydroxymethyl group, a hydroxyethyl group, a hydroxycyclohexyl group, a piperidinyl group, a dimethylamino group, a diethylamino group, or an acetamido group. R' may form a ring, and at that time, groups represented by any of the following formulae (8-1), (8-2) and (8-3) are exemplified as the ring.

(8-1)

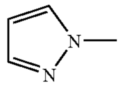

(8-2)

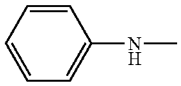

(8-3)

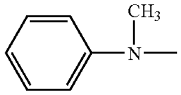

When Y represents a sulfur atom, R' especially preferably represents a methyl group, an ethyl group, a propyl group, a butyl group, a cyclohexyl group, a norbornyl group, a dinorbornyl group, an adamantyl group, a phenyl group, a benzyl group, a hydroxymethyl group, a hydroxyethyl group, or a hydroxycyclohexyl group.

As the especially preferred specific examples of R'', groups represented by any of the following formulae (8-4) to (8-8) are exemplified.

(8-4)

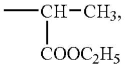

(8-5)

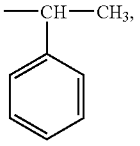

(8-6)

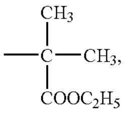

(8-7)

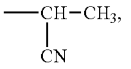

(8-8)

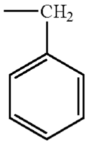

The above-shown polymerization initiators can be used in combination with thermal or photo-radical generators. As the specific examples of thermal radical generators, 2,2-azobis (isobutyronitrile), 2,2'-azobis(2-cyano-2-butane), dimethyl 2,2'-azobisdimethylisobutyrate, 4,4'-azobis(4-cyanopentanoic acid), 1,1'-azobis (cyclohexanecarbonitrile), 2-(t-butylazo)-2-cyanopropane, 2,2'-azobis[2-methyl-N-(1,1)-bis(hydroxymethyl)-2-hydroxyethyl]propionamide, 2,2'-azobis(2-methyl-N-hydroxyethyl)propionamide, 2,2'-azobis-(N,N'-dimethyleneisobutylamidine)dihydrochloride, 2,2'-azobis(2-amidinopropane)dihydrochloride, 2,2'-azobis(N,N'-dimethyleneisobutylamine), 2,2'-azobis(2-methyl-N-[1,1-bis-(hydroxymethyl)-2-hydroxyethyl]propionamide), 2,2'-azobis-(2-methyl-N-[1,1-bis(hydroxymethyl)ethyl] propionamide, 2,2'-azobis-[2-methyl-N-(2-hydroxyethyl) propionamide, 2,2'-azobis(isobutylamido)dihydrate], 2,2'-azobis(2,2,4-trimethylpentane), 2,2'-azobis(2-methylpropane), t-butyl-peroxyacetate, t-butylperoxybenzoate, t-butylperoxyoctoate, t-butylperoxyneodecanoate, t-butylperoxyisobutyrate, t-amylperoxypivalate, t-butylperoxypivalate, diisopropyl-peroxydicarbonate, dicyclohexylperoxydicarbonate, dicumyl peroxide, dibenzoyl peroxide, dilauroyl peroxide, potassium peroxydisulfate, ammonium peroxydisulfate, butyl di-t-hyponitrite, and dicumyl hyponitrite are exemplified.

The solvents for use in living radical polymerization include cycloalkanes, e.g., cyclohexane and cycloheptane; saturated carboxylic esters, e.g., ethyl acetate, n-butyl acetate, i-butyl acetate, methyl propionate, and propylene glycol monomethyl ether acetate; alkyllactones, e.g., γ-butyrolactone; ethers, e.g., tetrahydrofuran, dimethoxy-ethanes, and diethoxyethanes; alkyl ketones, e.g., 2-butanone, 2-heptanone, and methyl isobutyl ketone; cycloalkyl ketones, e.g., cyclohexanone; alcohols, e.g., 2-propanol and propylene glycol monomethyl ether; aromatic compounds, e.g., toluene, xylene and chlorobenzene; non-protonic polar solvents, e.g., dimethylformamide, dimethyl sulfoxide, dimethylacetamide, and N-methyl-2-pyrrolidone; and a solventless solvent are exemplified.

These solvents may be used alone, or two or more solvents may be used as mixture.

The reaction temperature in the above polymerization is generally from 40 to 150° C., preferably from 50 to 130° C., and the reaction time is generally from 1 to 96 hours, preferably from 1 to 48 hours.

It is preferred that each repeating unit constituting the acid-decomposable group-containing resin of the invention does not form a block, and the resin is a randomly polymerized polymer.

As a means of randomly polymerizing the monomer constituting each repeating unit, it is effective to polymerize monomers forming repeating units represented by formulae (1) to (7) at a time, or by dropping the mixture of the monomers.

It is preferred that the obtained acid-decomposable group-containing resin is of course little in impurities such as halogens or metals, in addition, the amounts of residual monomers and oligomer components are not more than the prescribed amounts, for example, 0.1 wt % by HPLC, by which not only the sensitivity, resolution, process stability and a pattern form as a resist can further be improved, but also a resist free of impurities in liquid and free of aging fluctuation of sensitivity can be obtained.

There are cases where the acid-decomposable group-containing resin obtained by living radical polymerization has residual groups derived from the polymerization initiator at molecular chain terminals. The resin may have the residual groups, but these residual groups can be removed by utilizing an excess radical polymerization initiator. The terminal treatment can be performed to a finished polymerization reaction product after completion of the living radical polymerization reaction, or polymer terminal processing can be performed after purification of a once produced polymer.

Those capable of generating radicals on the condition of the treatment of molecular chain terminal groups can be used as the radical polymerization initiators. As the radical generating conditions, high energy radiation, such as heat, light, γ-rays and electron beams are exemplified.

As the examples of the radical polymerization initiators, initiators such as peroxide and azo compounds are exemplified. As the specific examples of the radical polymerization initiators, although not limitative, t-butyl hydroperoxide, t-butyl perbenzoate, benzoyl peroxide, 2,2'-azobis(2,4-dimethylvaleronitrile), 2,2'-azobisisobutyronitrile (AIBN), 1,1'-azobis(cyclohexanecarbonitrile), dimethyl-2,2'-azobisisobutyrate (MAIB), benzoin ether, and benzophenone are exemplified.

When a thermal radical polymerization initiator is used, the temperature of the processing reaction of resin terminal groups is about 20 to 200° C., preferably from 40 to 150° C., and more preferably from 50 to 100° C. The atmosphere of the reaction is inert atmosphere such as nitrogen or argon, or atmospheric air. The reaction may be performed under atmospheric pressure or under pressure. The amount of the radical polymerization initiator that can be used is, as the radical amount that the radical polymerization initiator generates, from the mols of 1 to 800% of the total mol number of the residual groups present in the polymer to be terminal-processed, preferably from the mols of 50 to 400%, more preferably from the mols of 100 to 300%, and still more preferably from the mols of 200 to 300%.

The reaction time of the terminal processing is from 0.5 to 72 hours, preferably from 1 to 24 hours, and more preferably from 2 to 12 hours. The removal of the residual groups such as thio groups from the polymer terminals is at least 50%, preferably at least 75%, more preferably 85%, and still more preferably 95%. The terminals of the polymer having been subjected to the terminal processing are replaced with novel radical seeds, for example, fragments of the radical initiator derived from the radical initiator used in the terminal processing reaction. The thus-obtained polymer has novel groups at terminals and can be used according to uses.

The residual groups derived from a polymerization initiator can also be removed by polymer terminal processing according to the methods disclosed in WO 02/090397.

In the invention, acid-decomposable group-containing resins can be used alone, or two or more resins can be used as mixture.

The weight average molecular weight of the resins in the invention is preferably from 7,000 to 50,000 as the polystyrene equivalent by GPC method, and the degree of dispersion (weight average molecular weight/number average molecular weight, Mw/Mn) is preferably 1.5 or less.

The weight average molecular weight of the above range is preferred for compromising the heat resistance and dry etching resistance with developability and film-forming property.

A degree of dispersion of 1.5 or less is preferred in view of resolution, a resist configuration, prevention of the roughness of the sidewalls of a resist pattern, and roughness property.

In the positive resist composition in the invention, the blending amount of all the resins in the total composition is preferably from 40 to 99.99 mass % in all the solids content of the resist, more preferably from 50 to 99.97 mass %.

(B) Compound Capable of Generating an Acid Upon Irradiation with an Actinic Ray or Radiation The compound that generates an acid upon irradiation with an actinic ray or radiation to be used for the positive resist composition for immersion exposure according to the invention (hereinafter sometimes referred to as "acid generator") is to be described below.

The acid generator used in the invention can be selected from the compounds used generally as the acid generator.

That is, photoinitiator for photo-cationic polymerization, photoinitiator for photo-radical polymerization, light extinguishing agent for dyes, light discolorant, or known compounds capable of generating an acid upon irradiation with an actinic ray or radiation such as far UV-rays and X-rays used for microresist or the like, as well as mixtures thereof can be properly selected and used.

They include, for example, diazonium salt, phosphonium salt, sulfonium salt, iodonium salt, imidosulfonate, oximesulfonate, diazodisulfone, disulfone and o-nitrobenzylsulfonate.

For compounds in which the group or the compound capable of generating an acid upon irradiation with an actinic ray or radiation are introduced to the main chain or the side chains of the polymer, for example, compounds described in U.S. Pat. No. 3,849,137, GP No. 3914407, JP-A Nos. 63-26653, 55-164824, 62-69263, 63-146038, 63-163452, 62-153853, and 63-146029 can be used.

In addition, compounds generating an acid by light described in U.S. Pat. No. 3,779,778 and EP No. 126,712 can also be used.

Preferred compounds, among the acid generators, include compounds represented by the following general formulae (ZI), (ZII) and (ZIII).

ZI

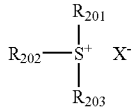

ZII

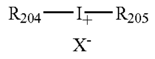

ZIII

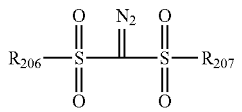

In the general formula (ZI), $R_{201}$, $R_{202}$ and $R_{203}$ each independently represents an organic group.

$X^-$ represents a non-nucleophilic anion.

The number of carbon atoms in the organic group as $R_{201}$, $R_{202}$ or $R_{203}$ is generally from 1 to 30, preferably, from 1 to 20.

Two members of $R_{201}$ to $R_{203}$ may be bonded to each other to form a ring structure, and the ring may have an oxygen atom, sulfur atom, ester bond, amide bond, or carbonyl group therein.

As the group formed by joining two members of $R_{201}$ to $R_{203}$ includes an alkylene group (for example, butylene group or pentylene group).

Specific examples of the organic group as $R_{201}$, $R_{202}$, and $R_{203}$ include, for example, groups corresponding to those in the compounds (ZI-1), (ZI-2), and (ZI-3) to be described later.

Compounds having a plurality of structures represented by the general formula (ZI) may also be adopted. For example, compounds having such a structure that at least one of $R_{201}$ to $R_{203}$ of the compounds represented by the general formula (ZI) joins with at least one of $R_{201}$ to $R_{203}$ of other compounds represented by the general formula (ZI).

Further preferred (ZI) ingredients include compounds (ZI-1), (ZI-2), and (ZI-3) to be described below.

The compound (ZI-1) is an arylsulfonium compound in which at least one of $R_{201}$ to $R_{203}$ of the general formula (ZI) is an aryl group, that is, a compound having arylsulfonium as a cation.

In the arylsulfonium compound, all of $R_{201}$ to $R_{203}$ may be an aryl group, and a portion of $R_{201}$ to $R_{203}$ may be an aryl group, and the residues may be an aryl group and a cycloalkyl group.

The arylsulfonium compound includes, for example, triarylsulfonium compounds, diarylalkyl sulfonium compounds, aryldialkyl sulfonium compounds, diarylcycloalkyl sulfonium compounds, and aryldicycloalkyl sulfonium compounds.

The aryl group of the arylsulfonium compound is, preferably, a phenyl group and a naphthyl group and more preferably, a phenyl group. In a case where the arylsulfonium compound has two or more aryl groups, the two or more aryl groups may be identical with or different from each other.

The alkyl group which is optionally present in the arylsulfonium compound is preferably a linear or branched alkyl group of from 1 to 15 carbon atoms and includes, for example, a methyl group, ethyl group, propyl group, n-butyl group, sec-butyl group or t-butyl group.

The cycloalkyl group which is optionally present in the arylsulfonium compound is, preferably, a cycloalkyl group of from 3 to 15 carbon atoms and includes, for example, a cyclopropyl group, cyclobutyl group is cyclohexyl group.

The aryl group, alkyl group, or cycloalkyl group for $R_{201}$ to $R_{203}$ may have an alkyl group (for example, of 1 to 15 carbon atoms), cycloalkyl group (for example, of 3 to 15 carbon atoms), aryl group, alkoxy group (for example, 1 to 15 carbon atoms), halogen atom, hydroxyl group or phenylthio group as a substituent. The substituent includes, preferably, a linear or branched alkyl group of 1 to 12 carbon atoms, cycloalkyl group of 3 to 12 carbon atoms, alkoxy group of 1 to 12 carbon atom, and, most preferably, an alkyl group of 1 to 4 carbon atoms, and alkoxy group of 1 to 4 carbon atoms. The substituent may be substituted on any one of three members of $R_{201}$ to $R_{203}$, and may be substituted on all of the three members. In a case where $R_{201}$ to $R_{203}$ each independently represents an aryl group, the substituent is preferably at the p-position of the aryl group.

The non-nucleophilic anion as $X^-$ includes, for example, a sulfonic acid anion, carboxylic acid anion, sulfonylimide anion, bis(alkylsulfonyl)imide anion, and tris(alkylsulfonyl) methyl anion.

The non-nucleophilic anion means an anion with extremely low effect of causing nucleophilic reaction, which is an anion capable of suppressing aging decomposition by intra-molecular nucleophilic reaction.

The sulfonic acid anion includes, for example, an aliphatic sulfonic acid anion, aromatic sulfonic acid anion, or camphor sulfonic acid anion.

The carboxylic acid anion includes, for example, an aliphatic carboxylic acid anion, aromatic carboxylic acid anion, and aralkyl carboxylic acid anion.

The aliphatic group in the aliphatic sulfonic acid anion includes, for example, an alkyl group of 1 to 3 carbon atoms, specifically, a methyl group, ethyl group, propyl group, isopropyl group, n-butyl group, isobutyl group, sec-butyl group, pentyl group, neopentyl group, hexyl group, heptyl group, octyl group, nonyl group, decyl group, undecyl group, dodecyl group, tridecyl group, tetradecyl group, pentadecyl group, hexadecyl group, heptadecyl group, octadecyl group, nonadecyl group, eicosyl group and a cycloalkyl group of 3 from 30 carbon atoms, specifically, a cyclopropyl group, cyclopentyl group, cyclohexyl group, adamantyl group, norbornyl group, and boronyl group.

The aromatic group in the aromatic sulfonic acid anion include, preferably, aryl group of 6 to 14 carbon atoms, for example, a phenyl group, tolyl group, and naphthyl group.

The alkyl group, cycloalkyl group and aryl group in the aliphatic sulfonic acid anion and aromatic sulfonic acid anion may have a substituent.

Such substituent include, for example, a nitro group, halogen atom (fluorine atom, chlorine atom, bromine atom, or iodine atom), carboxyl group, hydroxyl group, amino group, cyano group, alkoxy group (preferably of 1 to 5 carbon atoms), cycloalkyl group (preferably of 3 to 15 carbon atoms), aryl group (preferably of 6 to 14 carbon atoms), alkoxycarbonyl group (preferably of 2 to 7 carbon atoms), acyl group (preferably of 2 to 12 carbon atoms), alkoxycarbonyl oxy group (preferably of 2 to 7 carbon atoms), and alkylthio group (preferably of 1 to 15 carbon atoms). The aryl group and the ring structure which are present in each group may further include alkyl group as a substituent.

The aliphatic group in the aliphatic carboxylic acid anion includes those identical with the aliphatic group in the aliphatic sulfonic acid anion.

The aromatic group in the aromatic carboxylic acid anion includes those identical with the aromatic group in the aromatic sulfonic acid anion.

The aralkyl group in the aralkyl carboxylic acid anion includes preferably an aralkyl group of 6 to 12 carbon atoms, for example, benzyl group, phenetyl group, naphthyl methyl group, naphthyl ethyl group, and naphthyl methyl group.

The aliphatic group, aromatic group, and aralkyl group in the aliphatic carboxylic acid anion, aromatic carboxylic acid anion, and aralkyl carboxylic acid anion may have a substituent, and the substituent includes, for example, a halogen atom, alkyl group, cycloalkyl group, alkoxy group, and alkyl thio group, like those for the aliphatic sulfonic acid anion.

The sulfonylimide anion includes, for example, a saccharin anion.

The alkyl group in the bis(alkylsulfonyl)imide anion, and tris(alkylsulfonyl)methyl anion is preferably an alkyl group of 1 to 5 carbon atoms and includes, for example, methyl group, ethyl group, propyl group, isopropyl group, n-butyl group, isobutyl group, sec-butyl group, pentyl group, and neopentyl group. Those alkyl groups may have a substituent, and the substituent includes, a halogen atom, and alkyl group, alkoxy group, and alkylthio group substituted with a halogen atom, and the alkyl group substituted with a fluorine atom is preferred.

Other non-nucleophilic anions include, for example, phosphorous fluoride, boron fluoride, and antimony fluoride.

The non-nucleophilic anion for $X^-$ is preferably an aliphatic sulfonic acid anion substituted at α-position of sulfonic acid with a fluorine atom, an aromatic sulfonic acid anion substituted with a fluorine atom or a group having a fluorine atom, a bis(alkyl sulfonyl) imide anion in which the alkyl group is substituted with a fluorine atom, and a tris (alkylsulfonyl)methide anion in which the alkyl group is substituted with a fluorine atom. The non-nucleophilic anion is, particularly preferably, a perfluoro aliphatic sulfonic acid anion of 4 to 8 carbon atoms, and an aromatic sulfonic anion having a fluorine atom and, more preferably, nonafluorobutane sulfonic acid anion, perfluorooctane sulfonic acid anion, pentafluorobenzene sulfonic acid anion, and 3,5-bis(trifluoromethyl)benzene sulfonic acid anion.

Then, the compound (ZI-2) is to be described.

The compound (ZI-2) is a compound in a case where $R_{201}$ to $R_{203}$ in the general formula (ZI) each independently represents an organic group containing no aromatic ring. In this case, the aromatic ring also includes aromatic rings containing hetero atoms.

The organic group containing no aromatic ring as $R_{201}$ to $R_{203}$ has generally 1 to 30 carbon atoms, preferably, 1 to 20 carbon atoms.

$R_{201}$ to $R_{203}$ each independently represents, preferably, an alkyl group, cycloalkyl group, allyl group, or vinyl group, further preferably, a linear, branched, cyclic 2-oxoalkyl group, or alkoxycarbonyl methyl group and, most preferably, the linear or branched 2-oxoalkyl group.

The alkyl group as $R_{201}$ to $R_{203}$ may be either linear or branched, and preferably includes a branched alkyl group of 1 to 10 carbon atoms, for example, a methyl group, ethyl group, propyl group, butyl group, or pentyl group. The alkyl group is, more preferably, a 2-linear or branched oxoalkyl group, or alkoxycarbonyl methyl group.

The cycloalkyl group as $R_{201}$ to $R_{203}$ is preferably a cycloalkyl group of 3 to 10 carbon atoms and includes, for example, a cyclopentyl group, cyclohexyl group, or norbornyl group. The cycloalkyl group is, more preferably, 2-oxocycloalkyl group.

The 2-oxoalkyl group may be any of linear, branched and cyclic, and includes preferably, a group having >C=O at the 2-position of the alkyl group or cycloalkyl group.

The alkoxy group in the alkoxycarbonyl methyl group preferably includes alkyl groups of 1 to 5 carbon atoms (methyl group, ethyl group, propyl group, butyl group, and pentyl group).

$R_{201}$ to $R_{203}$ may be substituted with a halogen atom, alkoxy group (for example, of 1 to 5 carbon atoms), hydroxyl group, cyano group or nitro group).

Two of $R_{201}$ to $R_{203}$ may be bonded to each other to form a ring structure, and may have an oxygen atom, sulfur atom, ester bond, amide bond, or carbonyl group in the ring. The group formed by joining two member of $R_{201}$ to $R_{203}$ includes an alkylene group (for example, butylenes group and pentylene group).

The compound (ZI-3) is a compound represented by the following general formula (ZI-3), which is a compound having a phenacyl sulfonium salt structure.

(Z1-3)

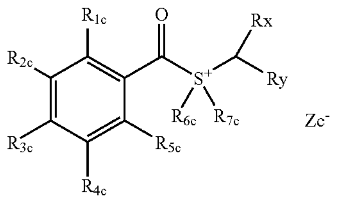

$R_{1c}$ to $R_{5c}$ each independently represents a hydrogen atom, alkyl group, cycloalkyl group, alkoxy group or halogen atom.

$R_{6c}$ and $R_{7c}$ each independently represents a hydrogen atom, alkyl group or cycloalkyl group.

$R_x$ and $R_y$ each independently represents an alkyl group, cycloalkyl group, allyl group or vinyl group.

Any two or more of $R_{1c}$ to $R_{5c}$, and $R_x$ and $R_y$ may be bonded each other to form a ring structure respectively, and the ring structure may have an oxygen atom, sulfur atom, ester bond, or amide bond.

$Zc^-$ represents a non-nucleophilic anion, and includes those identical with the non-nucleophilic anion of $X^-$ in the general formula (ZI).

The alkyl group as $R_{1c}$ and $R_{7c}$ is preferably a linear or branched alkyl group of 1 to 20 carbon atoms, for example, a methyl group, ethyl group, linear or branched propyl group, linear or branched butyl group, or linear or branched pentyl group.

The cycloalkyl group as $R_{1c}$ and $R_{7c}$ is preferably a cycloalkyl group of 3 to 8 carbon atoms, for example, a cyclopentyl group, or cyclohexyl group.

The alkoxy group as $R_{1c}$ and $R_{7c}$ may be any of linear, branched or cyclic, and includes, for example, an alkoxy group of 1 to 10 carbon atoms, and preferably, a linear or branched alkoxy group of 1 to 5 carbon atoms (for example, methoxy group, ethoxy group, linear or branched propoxy group, linear or branched butoxy group, or linear or branched pentoxy group), a cyclic alkoxy group of 3 to 8 carbon atoms (for example, cyclopentyloxy group, and cyclohexyloxy group).

Preferably, any one of $R_{1c}$ and $R_{5c}$ is linear or branched alkyl group, cycloalkyl group or linear, branched or cyclic alkoxy group, and further preferably, the sum of the number of carbon atoms in $R_{1c}$ to $R_{5c}$ is 2 to 15. This can improve the solvent-solubility and suppress generation of particles during storage.

The alkyl group and cycloalkyl group as $R_x$ and $R_y$ are the same as the alkyl group and cycloalkyl group for $R_{1c}$ to $R_{7c}$, and 2-oxoalkyl group, 2-oxocycloalkyl group and alkoxycarbonyl methyl group are more preferred.

The 2-oxoalkyl group and 2-oxocycloalkyl group include those having >C═O at the 2-position of the alkyl group and cycloalkyl group as $R_{1c}$ to $R_{7c}$.

The alkoxy group in the alkoxycarbonyl methyl group includes those identical with alkoxy groups as $R_{1c}$ to $R_{5c}$.

The group formed by joining $R_x$ and $R_y$ includes a butylenes group, pentylene group, etc.

$R_x$ and $R_y$ each independently represents, preferably, an alkyl group of 4 or more carbon atoms, more preferably, an alkyl group of 6 or more carbon atoms, further preferably, an alkyl group of 8 or more carbon atoms.

In the general formulae (ZII) and (ZIII), $R_{204}$ to $R_{207}$ each independently represents an aryl group, alkyl group, or cycloalkyl group.

The aryl group as $R_{204}$ to $R_{207}$ includes, preferably, a phenyl group and naphthyl group, further preferably, a phenyl group.

The alkyl group as $R_{204}$ to $R_{207}$ includes, preferably, linear or branched alkyl groups, for example, a methyl group, ethyl group, propyl group, butyl group, and pentyl group.

The cycloalkyl group as $R_{204}$ to $R_{207}$ includes cycloalkyl groups of 3 to 10 carbon atoms, for example, cyclopentyl group, cyclohexyl group, and norbornyl group.

The substituent which can be present in $R_{204}$ to $R_{207}$ includes, for example, alkyl groups (of, for example, 1 to 15 carbon atoms), cycloalkyl groups (of, for example, 3 to 15 carbon atoms), aryl groups (of, for example, 6 to 15 carbon atoms), alkoxy groups (of, for example, 1 to 15 carbon atoms), and halogen atom, hydroxyl group, and phenylthio group.

$X^-$ represents a non-nucleophilic anion, and includes those identical with the non-nucleophilic anion as $X^-$ in the general formula (ZI).

Preferred compound as the acid generator further includes compounds represented by the following general formulae (ZIV), (ZV), and (ZVI).

ZIV $Ar_3—SO_2—SO_2—Ar_4$

ZV

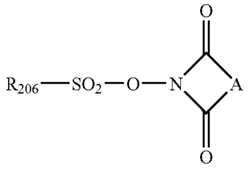

ZVI

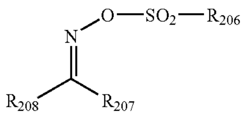

In the general formula (ZIV) to (ZVI), $Ar_3$ and $Ar_4$ each independently represents an aryl group.

$R_{206}$, $R_{207}$ and $R_{208}$ in the general formulae (ZV) and (ZVI) each independently represents an alkyl group, cycloalkyl group or aryl group, in the same manner as the alkyl group, cycloalkyl group, or aryl group as $R_{204}$ to $R_{207}$ in the general formulae (ZI) to (ZIII).

A represents an alkylene group, alkenylene group, or arylene group.

More preferred compounds among the acid generators include compounds represented by the general formulae (ZI) to (ZIII).

Acid generators especially preferably used in the invention are acid generators having an anionic structure containing a fluorine-substituted alkyl group having 4 or less carbon atoms or a fluorine-substituted aromatic group, and a triarylsulfonium cationic structure. These acid generators are preferably represented by the following formulae (B1), (B2) and (B3).

(I)

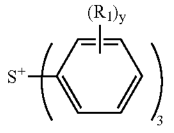

$Q_1SO_3^-$ (II)

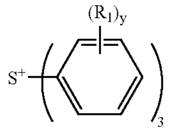

$Q_2—SO_2—N^-—SO_2—Q_2$ (III)

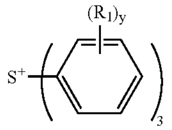

$Q_4COO^-$

In formulae (B1), (B2) and (B3), each $R_1$'s independently represents an alkyl group, an alicyclic hydrocarbon group, a hydroxyl group, a carboxyl group, an alkoxyl group or a halogen atom; each y's independently represents 0 or an integer of 1 to 5, when y is an integer of 2 or higher, two or more $R_1$'s may be the same or different; and $Q_1$, $Q_2$, $Q_3$ and $Q_4$ each independently represents an alkyl group having from 1 to 3 carbon atoms substituted with a fluorine atom, a cycloalkyl group substituted with a fluorine atom, an aryl group substituted with a fluorine atom, or an aryl group substituted with a fluorinated alkyl group.

The alkyl group represented by $R_1$ is preferably a straight chain or branched alkyl group having from 1 to 15 carbon atoms, e.g., a methyl group, an ethyl group, a propyl group, an n-butyl group, a sec-butyl group and a t-butyl group can be exemplified.

As the alicyclic hydrocarbon group represented by RI, e.g., a cyclopropyl group, a cyclobutyl group, a cyclopentyl group, a cyclohexyl group, a norbornyl group and an adamantyl group can be exemplified.

As the alkyl group substituted with a fluorine atom represented by $Q_1$, $Q_2$, $Q_3$ and $Q_4$, e.g., $—CF_3$, $—C_2F_5$, $-n-C_3F_7$, $—CF(CF_3)_2$, $—CH(CF_3)_2$, $—(CF_2)_2OCF_2CF_3$, $—(CF_2)_2O(CH_2)_3CH_3$, $—(CF_2)_2O(CH_2)_{13}CH_3$, and $—(CF_2)_2O(CF_2)_2(CH_2)_3CH_3$ can be exemplified.

As the aryl group substituted with a fluorine atom represented by $Q_1$, $Q_2$, $Q_3$ and $Q_4$, e.g., a 2,3,4,5,6-pentafluorophenyl group, a 2,3,4-trifluorophenyl group, a 2,4-difluorophenyl group, a 4-fluorophenyl group, and a 4-undecanyloxy-2,3,5,6-tetrafluorophenyl group can be exemplified.

As the aryl group substituted with a fluorinated alkyl group represented by $Q_1$, $Q_2$, $Q_3$ and $Q_4$, e.g., a 3-trifluoro-methylphenyl group, a 3,5-bis(trifluoromethyl)phenyl group, a 4-trifluoromethylphenyl group and a 4-n-nonafluorobutylphenyl group can be exemplified.

Of the compounds capable of generating an acid upon irradiation with an actinic ray or radiation, the examples of especially preferred compounds are shown below.
(z1)
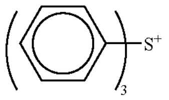
$CF_3SO_3^-$
(z2)
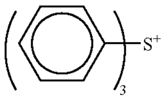
$C_4F_9SO_3^-$
(z3)
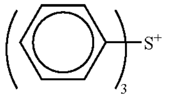
$C_8F_{17}SO_3^-$
(z4)
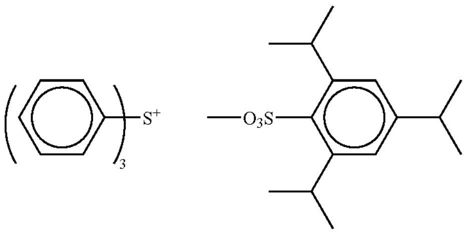
(z5)
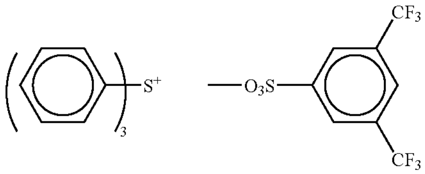
(z6)
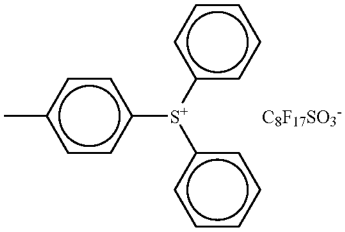
$C_8F_{17}SO_3^-$
(z7)
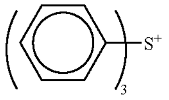
$C_{11}F_{23}COO^-$
(z8)
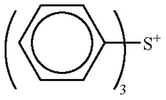
$C_2F_5—O—C_2F_4SO_3^-$
(z9)
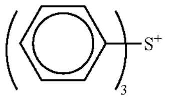
$CH_3COO^-$
(z10)
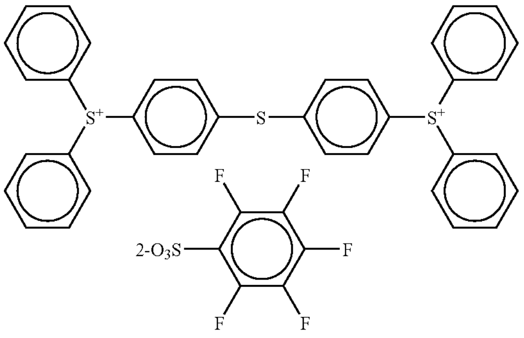
(z11)
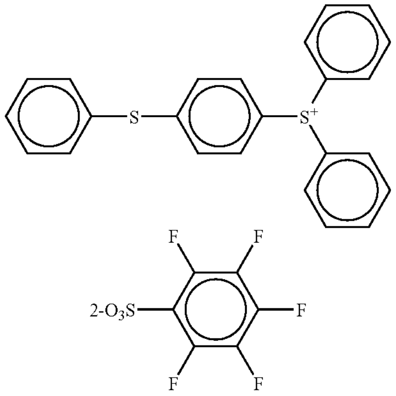
(z12)
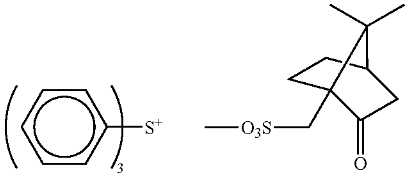

-continued
(z13)
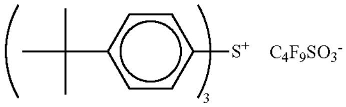
(z14)
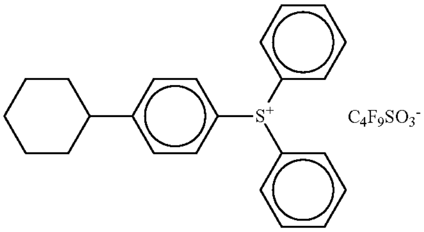
(z15)
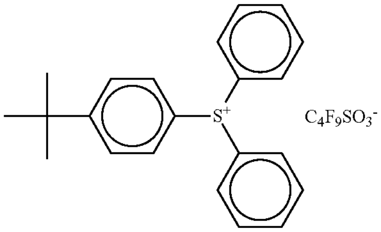
(z16)
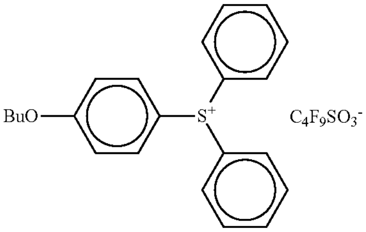
(Z17)
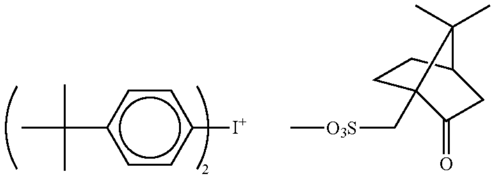
(z18)
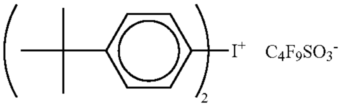
(z19)
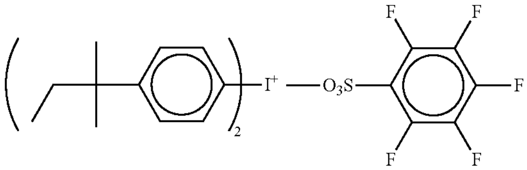
(z20)
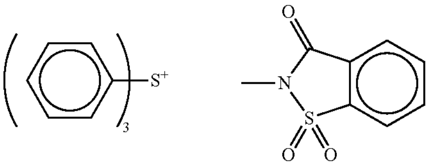
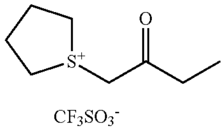
(z22)
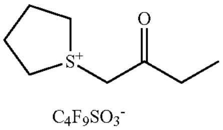
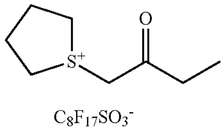
(z24)
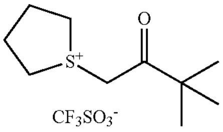
(z25)
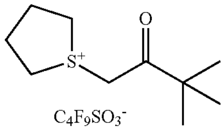
(z26)
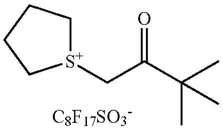
(z27)
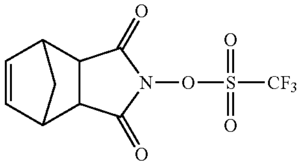
(z28)
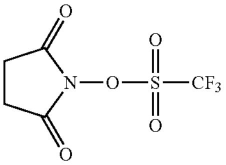

-continued
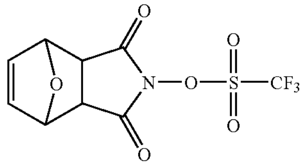
(z29)
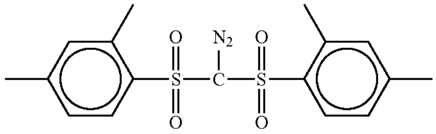
(z30)
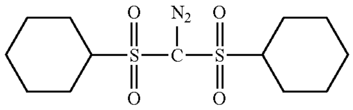
(z31)
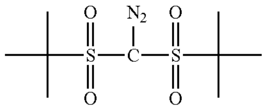
(z32)
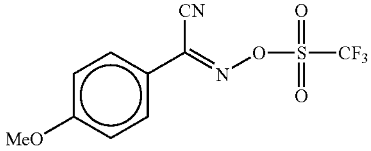
(z33)
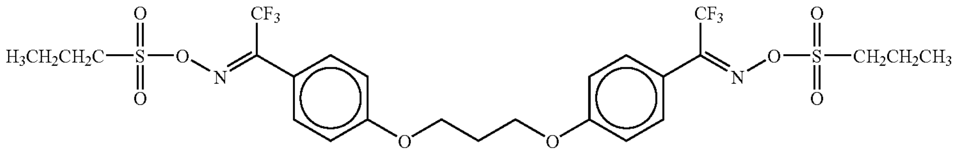
(z34)
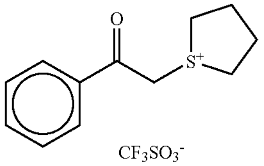
(z35)
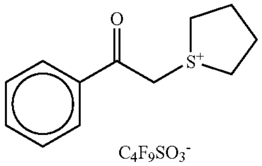
(z36)
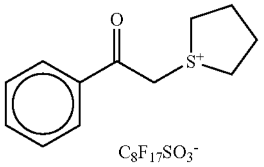
(z37)
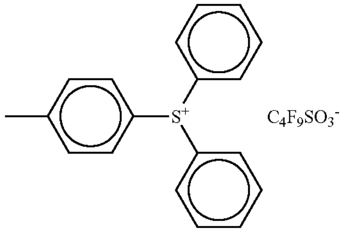
(z38)
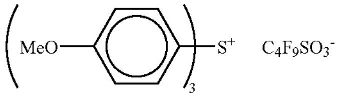
(z39)
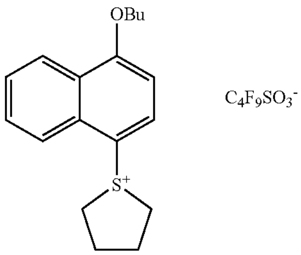
(z40)
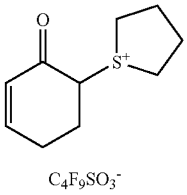
(z41)
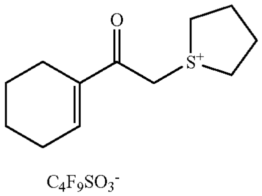
(z42)

-continued
(z43)
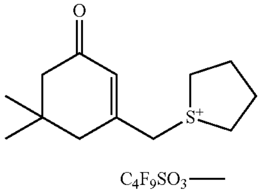
(z44)
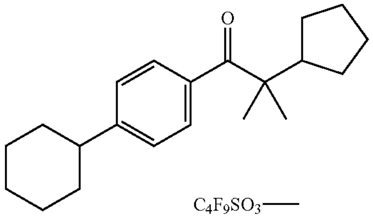
(z45)
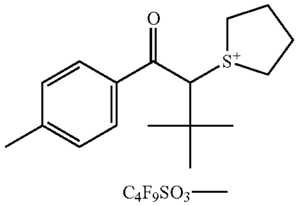
(z46)
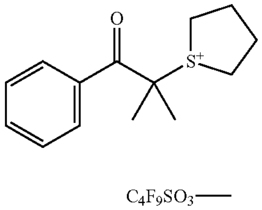
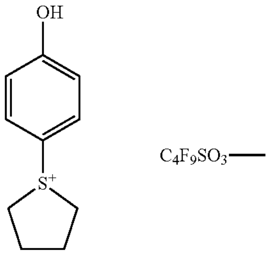
(z48)
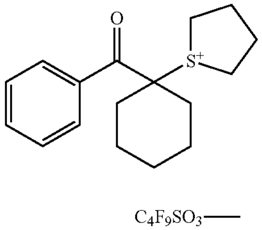
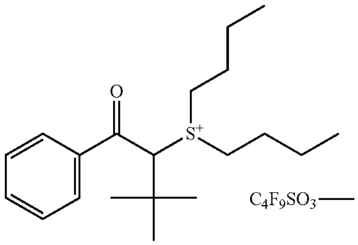
(z50)
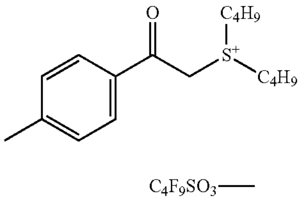
(z51)
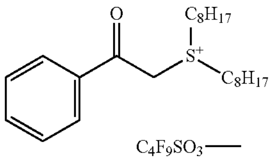
(z52)
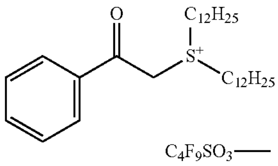
(z53)
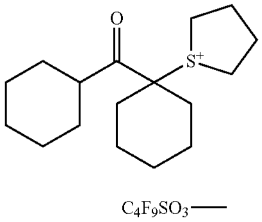
(z54)
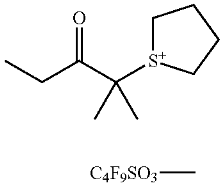
(z55)
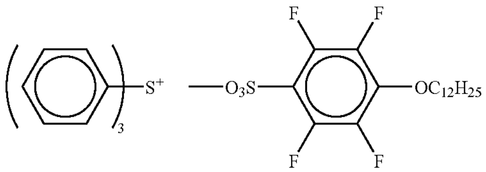
(z56)
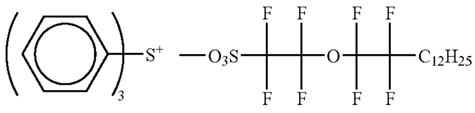

-continued (z57)

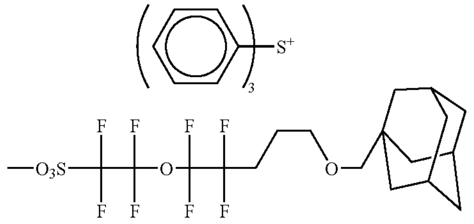

(z58)

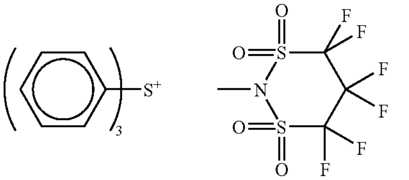

(z59)

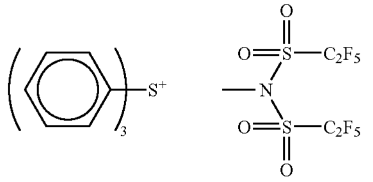

Acid generators can be used alone, or two or more in combination.

The content of an acid generator in a resist composition for immersion exposure is preferably from 0.1 to 20 mass % based on the total solids content of the resist composition, more preferably from 0.5 to 10 mass %, and still more preferably from 1 to 7 mass %.

(C) Dissolution inhibiting compound having a molecular weight of 3,000 or less capable of decomposing by the action of an acid and increasing the solubility in an alkaline developer (hereinafter also referred to as "dissolution inhibiting compound"):

It may be possible for the resist composition for immersion exposure in the invention to contain a compound having a molecular weight of 3,000 or less and capable of decomposing by the action of an acid to increase the solubility in an alkaline developer (hereinafter also referred to as "dissolution inhibitor").

As the dissolution inhibitor, not to reduce transmission of 220 nm or less, alicyclic or aliphatic compounds containing an acid-decomposable group, such as the cholic acid derivative containing an acid-decomposable group as described in Proceeding of SPIE, 2724, 355 (1996) are preferred. As the acid-decomposable groups and alicyclic structures, the same groups and structures as described in the resins in component (A) can be exemplified.

The molecular weight of the dissolution inhibitor in the invention is 3,000 or less, preferably from 300 to 3,000, and more preferably from 500 to 2,500.

The addition amount of the dissolution inhibitor is preferably from 1 to 30 mass % based on the total solids content of the resist composition for immersion exposure, more preferably from 2 to 20 mass %.

The specific examples of dissolution inhibitors are shown below, but the invention is not limited thereto.

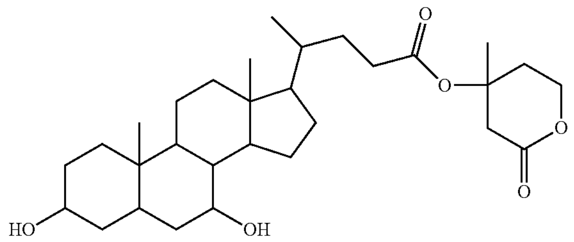

-continued

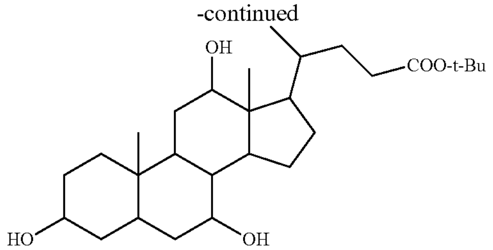

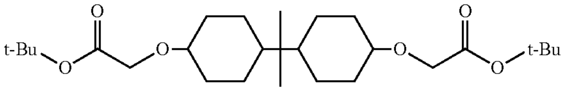

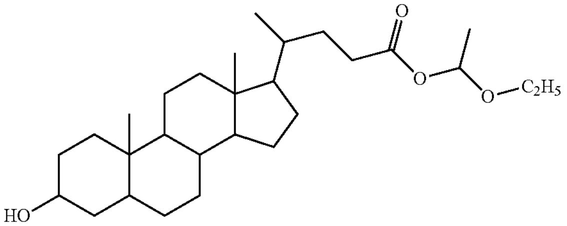

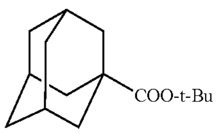

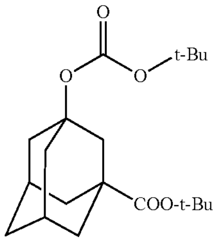

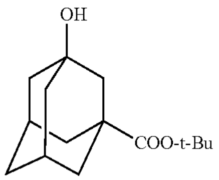

(D) Basic Compound

For reducing the fluctuation in performance due to aging from exposure to heating, it is preferred for the resist composition in the invention to contain (D) a basic compound.

As the basic compounds, e.g., nitrogen-containing compounds containing a substituted or unsubstituted, primary, secondary or tertiary aliphatic amines, aromatic amines, heterocyclic amines, amido derivatives, imide derivatives, or a cyano group are exemplified, and aliphatic amines, aromatic amines and heterocyclic amines are preferred of these. The examples of the substituents that the basic compounds may have include an amino group, an alkyl group, an alkoxyl group, an acyl group, an acyloxy group, an aryl group, an aryloxy group, a nitro group, a cyano group, an ester group, and a lactone group.

The basic compound preferably has a structure represented by any of the following formulae (A) to (E).

(A)

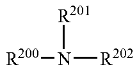

(B)

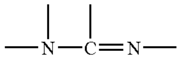

(C)

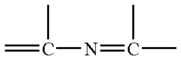

(D)

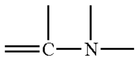

(E)

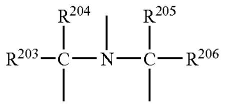

In the above formulae, $R^{200}$, $R^{201}$ and $R^{202}$, which may be the same or different, each independently represents a hydrogen atom, an alkyl group having from 1 to 20 carbon atoms, a cycloalkyl group having from 1 to 20 carbon atoms, or a substituted or unsubstituted aryl group having from 6 to 20 carbon atoms, and $R^{201}$ and $R^{202}$ may be bonded to each other to form a ring; the alkyl group may be substituted or unsubstituted, as the alkyl group having a substituent, an aminoalkyl group having from 1 to 6 carbon atoms, an alkyloxy group having from 1 to 6 carbon atoms, and a cyanoalkyl group having from 1 to 6 carbon atoms are preferred; and $R^{203}$, $R^{204}$, $R^{205}$ and $R^{206}$, which may be the same or different, each independently represents an alkyl group having from 1 to 6 carbon atoms.

The alkyl groups in formulae (A) to (E) are preferably unsubstituted alkyl groups.

It is preferred that a basic compound having a structure represented by formula (A), (B), (C), (D) or (E) does not comprise a hydroxyl group.

These basic compounds are used alone, or two or more together.

The use amount of the basic compounds not containing a hydroxyl group is generally from 0.001 to 10 mass % based on the solids content of the positive resist composition for immersion exposure, preferably from 0.01 to 5 mass %.

The total use amount of the basic compounds is generally from 0.001 to 10 mass % based on the solids content of the positive resist composition for immersion exposure, preferably from 0.01 to 5 mass %.

The proportion of the use amounts of an acid generator and an organic basic compound in the resist composition, i.e., acid generator/organic basic compound (molar ratio), is preferably from 2.5 to 300. That is, the molar ratio is preferably 2.5 or more from the aspect of sensitivity and resolution, and 300 or less is preferred in the light of prevention of the reduction of resolution due to thickening of the resist pattern by aging after exposure to heat treatment. The molar ratio of acid generator/organic basic compound is more preferably from 5.0 to 200, and still more preferably from 7.0 to 150.

(E) Surfactant

The positive resist composition for immersion exposure according to the invention can further contain a surfactant (E). The surfactant includes preferably, a fluorine-based and/or a silicon-based surfactant (a fluorine-based surfactant, a silicon-based surfactant, or a surfactant having both a fluorine atom and a silicon atom), or two or more of them.

Since the resist composition for immersion exposure according to the invention contains the surfactant (E), it has enhancing effect on the sensitivity, resolution, adhesiveness, suppression of development failure, etc. upon use of exposure light source at 250 nm or less, particularly, 220 nm or less.

The fluorine-based and/or silicon-based surfactants, can include surfactants disclosed in, for example, JP-A Nos. 62-36663, 61-226746, 61-226745, 62-170950, 63-34540, 7-230165, 8-62834, 9-54432, 9-5988, Japanese Patent Application No. 2002-277862, U.S. Pat. Nos. 5,405,720, 5,360,692, 5,529,881, 5,296,330, 5,436,098, 5,576,143, 5,294,511, and 5,824,451, and commercially available surfactants described below can also be used as they are.

Commercially available surfactants include, for example, fluorine-based or silicone-based surfactants such as F-top EF301, and EF303 (manufactured by Shin-Akita Kasei K. K.), Florad FC430 and 431 (manufactured by Sumitomo 3M, Inc.), Megafac F171, F173, F176, F189, and R08 (manufactured by Dainippon Ink and Chemicals, Inc.), Surflon S-382, SC101, 102, 103, 104, 105, and 106, (manufactured by Asahi Glass Co., Ltd.), Troysol S-366 (manufactured by Troy Chemical Industries, Inc.), GF-300, GF-150 (manufactured by Toagosei Co., Ltd.), Surflon S-393 (manufactured by Seimi Chemical Co., Ltd.), EFTOP EF121, EF122A, EF122B, RF122C, EF125M, EF135M, EF351, 352, EF801, EF802, EF601 (manufactured by Jemco Inc.), PF636, PF656, PF6320, PF6520 (manufactured by OMNOVA Solutions, Inc.), FTX-204D, 208G, 218G, 230G, 204D, 208D, 212D, 218, 222D (manufactured by Neos company limited.), etc. Further, a polysiloxane polymer KP-341 (manufactured by Shin-Etsu Chemical Co., Ltd.) can also be used as the silicon-based surfactant.

In addition to the known surfactants described above, surfactants using polymers having a fluoro aliphatic group derived from a fluoro aliphatic compound produced by a telomerization method (also referred to as a telomer method) or an oligomerization method (also referred to as oligomer method) can also be used. The fluoro aliphatic compound can be synthesized by a method described in JP-A No. 2002-90991.

As the polymer having a fluoro aliphatic group, copolymers of monomers having a fluoro aliphatic group and a (poly(oxyalkylene))acrylate and/or (poly(oxyalkyelene)) methacrylate are preferred, and they may be distributed at random or block-copolymerized. The poly(oxyalkylene) group includes poly(oxyethylene) group, poly(oxypropylene) group, poly(oxybutylene) group, etc, and, in addition, may be a unit having alkylenes of different chain length in the same chain, for example, poly(block-connected form of oxyethylene and oxypropylene and oyxethylene) and poly(block connection form of oxyethylene and oxypropylene), etc. Further, the copolymer of the monomers having a fluoro aliphatic group and (poly(oxyalkylene))acrylate (or methacrylate) includes not only binary copolymers but also ternary or higher copolymers formed by simultaneously copolymerizing monomers having two or more different fluoro aliphatic groups and two or more different (poly(oxyalkylene))acrylates (or methacrylates).

For example, the commercially available surfactants include Megafac F178, F-470, F-473, F-475, F-476, and F-472 (manufactured by Dainippon Ink and Chemicals, Inc.). In addition, they include copolymers of acrylate (or methacrylate) having a $C_6F_{13}$ group and (poly(oxyalkylene)) acrylate (or methacrylate), copolymers of acrylate (or methacryalte) having a $C_6F_{13}$ group, (poly(oxyalkylene)) acrylate (or methacrylate), and (poly(oxyalkylene)) acrylate (or methacrylate), copolymers of acrylate (or methacryalte) having a $C_8F_{17}$ group and (poly(oxyalkylene))acrylate (or methacrylate), and copolymers of acrylate (or methacrylate) having a ($C_8C_{17}$ group, (poly(oxyethylene))acrylate (or methacrylate) and (poly(oxypropylene))acrylate (or methacrylate).

In the invention, surfactants other than the fluorine-based and/or silicon-based surfactants can also be used. Specifically, they include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkyl allyl ethers such as polyoxyethylene octyl phenol ether and polyoxyethylene nonyl phenol ethers, sorbitan fatty acid esters such as polyoxyethylene polyoxypropylene block copolymers, sorbitan monolaurate, sorbitan monopalmitate, sorbitan monostearate, sorbitan monooleate, sorbitan trioleate, and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate.

These surfactants may be used alone, or a plurality of surfactants may be used in combination.

The use amount of surfactants (E) is preferably from 0.0001 to 2 mass % to the total amount of the resist composition (excluding solvents) for immersion exposure, more preferably from 0.001 to 1 mass %.

(F) Organic Solvent:

As the solvent that can be used for dissolving the above each component to prepare a resist composition, e.g., alkylene glycol monoalkyl ether carboxylate, alkylene glycol monoalkyl ether, alkyl lactate, alkyl alkoxypropionate, cyclic lactones having from 4 to 10 carbon atoms, monoketone compounds having from 4 to 10 carbon atoms which may contain a ring, alkylene carbonate, alkyl alkoxy acetate, and alkyl pyruvate can be exemplified.

As the alkylene glycol monoalkyl ether carboxylate, e.g., propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate, ethylene glycol monoethyl ether acetate are preferably exemplified.

As the alkylene glycol monoalkyl ether, e.g., propylene glycol monomethyl ether, propylene glycol monoethyl ether, propylene glycol monopropyl ether, propylene glycol monobutyl ether, ethylene glycol monomethyl ether, and ethylene glycol monoethyl ether are preferably exemplified.

As the alkyl lactate, e.g., methyl lactate, ethyl lactate, propyl lactate, and butyl lactate can be preferably used.

As the alkyl alkoxypropionate, e.g., ethyl 3-ethoxy-propionate, methyl 3-methoxypropionate, methyl 3-ethoxy-propionate, and ethyl 3-methoxypropionate are preferably exemplified.

As the cyclic lactones having from 4 to 10 carbon atoms, e.g., β-propiolactone, β-butyrolactone, γ-butyrolactone, α-methyl-γ-butyrolactone, β-methyl-γ-butyrolactone, γ-valerolactone, γ-caprolactone, γ-octanoic lactone, α-hydroxy-γ-butyrolactone are preferably exemplified.

As the monoketone compounds having from 4 to 10 carbon atoms which may contain a ring, e.g., 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonane, 3-nonane, 5-nonane, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, and 3-methylcycloheptanone are preferably exemplified.

As the alkylene carbonate, e.g., propylene carbonate, vinylene carbonate, ethylene carbonate, and butylene carbonate are preferably exemplified.

As the alkyl alkoxy acetate, e.g., 2-methoxyethyl acetate, 2-ethoxyethyl acetate, 2-(2-ethoxyethoxy)ethyl acetate, 3-methoxy-3-methylbutyl acetate and 1-methoxy-2-propyl acetate are preferably exemplified.

As the alkyl pyruvate, e.g., methyl pyruvate, ethyl pyruvate, and propyl pyruvate are preferably exemplified.

Solvents having a boiling point of 130° C. or more under room temperature and atmospheric pressure are preferably used, specifically cyclopentanone, γ-butyrolactone, cyclohexanone, ethyl lactate, ethylene glycol monoethyl ether acetate, propylene glycol monomethyl ether acetate, ethyl 3-ethoxypropionate, ethyl pyruvate, 2-ethoxyethyl acetate, 2-(2-ethoxyethoxy)ethyl acetate, and propylene carbonate are exemplified.

In the invention solvents may be used alone or two or more solvents may be used in combination.

In the invention, a mixed solvent comprising a solvent containing a hydroxyl group in the structure and a solvent not containing a hydroxyl group in the structure may be used as an organic solvent.

As the solvent containing a hydroxyl group, ethylene glycol, ethylene glycol monomethyl ether, ethylene glycol monoethyl ether, propylene glycol, propylene glycol monomethyl ether, propylene glycol monoethyl ether, and ethyl lactate can be exemplified. Of these solvents, propylene glycol monomethyl ether and ethyl lactate are particularly preferred.

As the solvent not containing a hydroxyl group, e.g., propylene glycol monomethyl ether acetate, ethylethoxy propionate, 2-heptanone, γ-butyrolactone, cyclohexanone, butyl acetate, N-methylpyrrolidone, N,N-dimethylacetamide, and dimethyl sulfoxide can be exemplified. Of these solvents, propylene glycol monomethyl ether acetate, ethylethoxy propionate, 2-heptanone, γ-butyrolactone, cyclohexanone, and butyl acetate are especially preferred, and propylene glycol monomethyl ether acetate, ethylethoxy propionate and 2-heptanone are most preferred.

The mixing ratio (by weight) of the solvent containing a hydroxyl group and the solvent not containing a hydroxyl group is from 1/99 to 99/1, preferably from 10/90 to 90/10, and more preferably from 20/80 to 60/40. A mixed solvent comprising 50 wt % or more of a solvent not containing a hydroxyl group is especially preferred in the point of coating uniformity.

(G) Alkali-Soluble Resin:

The positive resist composition in the invention can further contain (G) a resin that is water-insoluble and alkali-soluble, and not containing an acid-decomposable group. Sensitivity is improved by containing such a resin.

Novolak resins having a molecular weight of from 1,000 to 20,000 or so, and polyhydroxystyrene derivatives having a molecular weight of from 3,000 to 50,000 or so can be used as such resins. Since these resins are great in absorption to the rays of 250 nm or less, it is preferred to use them by partially hydrogenating or in an amount of 30 wt % or less of the total resin amount.

A resin containing a carboxyl group, as an alkali-soluble group, can also be used. For the purpose of improving dry etching resistance, it is preferred for the resins containing a carboxyl group to have a monocyclic or polycyclic alicyclic hydrocarbon group. Specifically, copolymers of methacrylic ester having an alicyclic hydrocarbon structure not showing acid-decomposing property and (meth)acrylic acid, and resins of (meth)acrylic ester of an alicyclic hydrocarbon group having carboxyl groups at terminals are exemplified.

(H) Carboxylic Acid Onium Salt:

As carboxylic acid onium salt (H) for use in the invention, carboxylic acid sulfonium salt, carboxylic acid iodonium salt, and carboxylic acid ammonium salt can be exemplified. As carboxylic acid onium salt (H), iodonium salt and sulfonium salt are preferred. It is preferred that the carboxylate residue of carboxylic acid onium salt (H) of the invention does not contain an aromatic group and a carbon-carbon double bond. An especially preferred anion moiety is a straight chain or branched, monocyclic or polycyclic alkylcarboxylic acid anion having from 1 to 30 carbon atoms, and the anion of a carboxylic acid in which a part or all of the alkyl groups are substituted with fluorine atoms is more preferred. An oxygen atom may be contained in the alkyl chain, by which the transparency to the lights of 220 nm or less is ensured, sensitivity and resolution are increased, and density dependency and exposure margin are improved.

As fluorine-substituted carboxylic acid anions, anions of fluoroacetic acid, difluoroacetic acid, trifluoroacetic acid, pentafluoropropionic acid, heptafluorobutyric acid, nonafluoropentanoic acid, perfluorododecanoic acid, perfluorotridecanoic acid, perfluorocyclohexanecarboxylic acid, and 2,2-bistrifluoromethylpropionic acid are exemplified.

These carboxylic acid onium salts (H) can be synthesized by reacting sulfonium hydroxide, iodonium hydroxide, or ammonium hydroxide and carboxylic acid with silver oxide in an appropriate solvent.

The content of carboxylic acid onium salt (H) in the resist composition is from 0.1 to 20 wt % to all the solids content of the composition, preferably from 0.5 to 10 wt %, more preferably from 1 to 7 wt %.

Other Additives:

If necessary, dyes, plasticizers, photosensitizers, and compounds for accelerating dissolution in a developer (e.g., phenolic compounds having a molecular weight of 1,000 or less, alicyclic or aliphatic compounds having a carboxyl group) may further be added to the resist composition for immersion exposure in the present invention.

Such phenolic compounds having a molecular weight of 1,000 or less can be easily synthesized with referring to the methods disclosed, e.g., in JP-A-4-122938, JP-A-2-28531, U.S. Pat. No. 4,916,210, and EP 219294.

As the specific examples of the alicyclic or aliphatic compounds having carboxyl groups, carboxylic acid derivatives having a steroid structure, e.g., cholic acid, deoxycholic acid, and lithocholic acid, adamantanecarboxylic acid derivatives, adamantanedicarboxylic acid, cyclohexanecarboxylic acid, and cyclohexanedicarboxylic acid are exemplified, but it should not be construed that the invention is limited to these compounds.

Use Method:

The resist composition for immersion exposure in the invention is used by dissolving each of the above components in a prescribed organic solvent, preferably dissolving in a mixed solvent as described above, and coating the solution on a prescribed support as follows.

That is, the resist composition for immersion exposure is coated on a substrate such as the one used in the production of precision integrated circuit elements (for example, silicon/silicon dioxide coating) by an appropriate coating method with a spinner or a coater in an arbitrary thickness (generally from 50 to 500 nm). After coating, the resist film is washed with an immersion liquid, if necessary. The washing time is generally from 5 seconds to 5 minutes.

Incidentally, the concentration of the solids content at the time of dissolving the resist components in a solvent is preferably from 2.0 to 6.0, more preferably from 2.0 to 5.5, still more preferably from 2.0 to 4.0, and especially preferably from 2.0 to 3.5.

Subsequently, the coated resist is dried by spin or bake to thereby form a resist film, and the resist film is subjected to exposure (immersion exposure) for pattern forming through a mask via an immersion liquid. For example, exposure is carried out in the state of filling between the resist film and the optical lens with an immersion liquid. The exposure dose can be optionally set, but is generally from 1 to 100 $mJ/cm^2$. After exposure, if necessary, the resist film is washed with the immersion liquid. The washing time is generally from 5 seconds to 5 minutes. Thereafter, the resist film is preferably subjected to spin or/and bake, development and rinsing, whereby a good pattern can be obtained. The temperature of bake is generally from 30 to 300° C. From the viewpoint of the above-described PED, the time from exposure to bake process is preferably shorter.

As the exposure rays, far ultraviolet rays having the wavelength of preferably 250 nm or less, more preferably 220 nm or less, are preferred. Specifically, a KrF excimer laser (248 nm), an ArF excimer laser (193 nm), an $F_2$ excimer laser (157 nm), and X-rays are exemplified.

The variation of performances of a resist at the time of immersion exposure is thought to be resulting from the contact of the resist surface with an immersion liquid.

An immersion liquid for use in immersion exposure is described below.

An immersion liquid for use in immersion exposure preferably has a temperature coefficient of refractive index as small as possible so as to be transparent to the exposure wavelength and to hold the distortion of optical image reflected on the resist to the minimum. In particular, when an ArF excimer laser (wavelength: 193 nm) is used as the exposure light source, it is preferred to use water for easiness of availability and easy handling property, in addition to the above described points.

When water is used as an immersion liquid, to reduce the surface tension of water and to increase the surface activity, a trace amount of additive (a liquid) that does not dissolve the resist layer on a wafer and has a negligible influence on the optical coating of the lower surface of lens elements may be added. As such an additive, aliphatic alcohols having a refractive index almost equal to the refractive index of water is preferred, specifically methyl alcohol, ethyl alcohol and isopropyl alcohol are exemplified. By adding an alcohol having a refractive index almost equal to that of water, even if the alcohol component in water is evaporated and the concentration of the content is changed, the refractive index of the liquid as a whole can be made extremely small. On the other hand, when impurities opaque to the light of 193 nm or a substance largely different from water in a refractive index are mixed, these substances bring about the distortion of the optical image reflected on the resist. Accordingly water is preferably distilled water. Alternatively, pure water filtered through an ion exchange filter may be used.

A film hardly soluble in an immersion liquid (hereinafter also referred to as "topcoat") may be provided between a resist film and an immersion liquid by the resist for immersion exposure of the invention so as not to bring a resist film into direct contact with an immersion liquid. The necessary functions required of the topcoat are the aptitude for coating on the upper layer of the resist, the transparency to radiation, especially the transparency to the light of 193 nm, and the immersion liquid-insolubility. It is preferred that the topcoat is not mixed with the resist and can be coated uniformly on the resist upper layer.

From the viewpoint of the transparency to 193 nm, polymers not containing aromatic compounds are preferred as the topcoat. Specifically, hydrocarbon polymers, acrylic ester polymers, polymethacrylic acid, polyacrylic acid, polyvinyl ether, silicon-containing polymers and fluorine-containing polymers are exemplified.

When the topcoat is peeled off, a developer may be used, or a remover may be used separately. As the remover, solvents low in penetration into a resist are preferred. In view of capable of performing peeling process at the same time with the development process of the resist, peeling by an alkaline developer is preferred. From the viewpoint of performing peeling by an alkaline developer, the topcoat is preferably acidic, but from the viewpoint of non-intermixture with the resist, it may be neutral or may be alkaline.

Resolution increases when there is no difference in the refractive indexes between the topcoat and the immersion liquid. In the case where an ArF excimer laser (wavelength: 193 nm) is used as the exposure light source, water is preferred as the immersion liquid, so that the refractive index of the topcoat for ArF immersion exposure is preferably near the refractive index of water (1.44). Further, from the viewpoint of the transparency and refractive index, a thin film is preferred.

In a development process, a developer is used as follows. As the developer of the resist composition for immersion exposure, alkaline aqueous solutions of inorganic alkalis, e.g., sodium hydroxide, potassium hydroxide, sodium carbonate, sodium silicate, sodium metasilicate and aqueous ammonia, primary amines, e.g., ethylamine and n-propylamine, secondary amines, e.g., diethylamine and di-n-butylamine, tertiary amines, e.g., triethylamine and methyldiethylamine, alcohol amines, e.g., dimethylethanolamine and triethanolamine, quaternary ammonium salts, e.g., tetramethylammonium hydroxide and tetraethylammonium hydroxide, and cyclic amines, e.g., pyrrole and piperidine, can be used.

An appropriate amount of alcohols and surfactants may be added to these alkaline aqueous solutions.

Pure water can be used as the rinsing liquid and an appropriate amount of surfactants may be added thereto.

The alkali concentration of an alkaline developer is generally from 0.1 to 20 mass %.

The pH of an alkaline developer is generally from 10.0 to 15.0.

After development process or rinsing process, a process to remove the developer or rinsing liquid on the resist pattern can be performed by supercritical fluid.

EXAMPLE

The invention will be described in further detail with reference to examples, but it should not be construed that the invention is limited thereto.

Synthesis Example 1

Synthesis of Resin (1) (Synthesis of Comparative Resin)

2-Adamantyl-2-propyl methacrylate, dihydroxy-adamantane methacrylate and norbornanelactone acrylate in proportion of 40/20/40 were put in a reaction vessel and dissolved with a mixed solvent 70/30 of propylene glycol monomethyl ether acetate/propylene glycol monomethyl ether, whereby 450 g of a solution having solid concentration of 22% was prepared. A polymerization initiator V-601 (manufactured by Wako Pure Chemical Industries) (3 mol %) was added to the above solution, and the solution was dropped to 50 g of a 70/30 mixed solution of propylene glycol monomethyl ether acetate/propylene glycol monomethyl ether heated at 80° C. under nitrogen atmosphere over 6 hours. After dropping, the reaction solution was stirred for 2 hours to obtain reaction solution (1). After conclusion of the reaction, reaction solution (1) was cooled to room temperature, crystallized in 4.5 times the amount of a mixed solvent of hexane/ethyl acetate in proportion of 90/10, and the precipitated white powder was filtered, whereby resin (1) of the object was recovered.

The compositional ratio of the polymer found by $^{13}$CNMR and oxidimetry was 39/21/41. The weight average molecular weight found by GPC measurement as the standard polystyrene equivalent was 9,800, and the degree of dispersion was 1.9.

Synthesis Example 2

Synthesis of Resin (2) (Solvent Fraction)

Twenty grams of resin (1) was dissolved in 180 g of tetrahydrofuran, and the solution was put into 200 g of a mixed solvent of 90/10 of hexane/ethyl acetate. The supernatant was removed by decantation and precipitated solid was recovered. The solid was dissolved again in 120 ml of THF, crystallized in 10 times the amount of a mixed solvent of hexane/ethyl acetate in proportion of 90/10, and resin (2) of the object was recovered.

The compositional ratio of the polymer found by $^{13}$CNMR and oxidimetry was 41/20/39. The weight average molecular weight found by GPC measurement as the standard polystyrene equivalent was 10,600, and the degree of dispersion was 1.4.

Synthesis Example 3

Synthesis of Resin (3) (Solvent Fraction)

Resin (3) was synthesized by polymerization and crystallization in the same manner as in Synthesis Example 1 except that 2-adamantyl-2-propyl methacrylate, dihydroxy-adamantane methacrylate, norbornanelactone methacrylate and methacrylic acid in proportion of 30/20/40/10 were put in a reaction vessel, and the reaction solvent was changed to a mixed solvent of 60/40 of propylene glycol monomethyl ether acetate/propylene glycol monomethyl ether, and the obtained resin was subjected to the solvent fraction in the same manner as in Synthesis Example 2.

The compositional ratio of the polymer found by $^{13}$CNMR and oxidimetry was 30/21/39/10. The weight average molecular weight found by GPC measurement as the standard polystyrene equivalent was 10,200, and the degree of dispersion was 1.5.

Synthesis Example 4

Synthesis of Resin (4) (Solvent Fraction)

Resin (4) was synthesized by polymerization and crystallization in the same manner as in Synthesis Example 1 except that 2-methyl-2-adamantyl methacrylate, hydroxy-adamantane methacrylate, and γ-butyrolactone methacrylate in proportion of 50/20/30 were put in a reaction vessel, and the reaction solvent was changed to a mixed solvent of 60/40 of propylene glycol monomethyl ether acetate/cyclohexanone, and the reprecipitation solvent to hexane/tetrahydrofuran. The obtained crystal (20 g) was dissolved in 180 g of tetrahydrofuran. When the solution was put into 2 liters of a mixed solvent of 30/70 of hexane/tetrahydrofuran, the solution was slightly turbid. After the solution was heated at 50° C. with stirring to make clear, and then cooled to 5° C. to make turbid, stirring was continued in a thermostatic bath at 25° C. for 2 hours. After allowing the solution to stand at this temperature overnight, the supernatant was removed by decantation and precipitated solid was recovered. The solid was dissolved again in 120 ml of THF, crystallized in 10 times the amount of a mixed solvent of hexane/ethyl acetate in proportion of 90/10, and resin (4) of the object was recovered.

The compositional ratio of the polymer (a/b/c) found by $^{13}$CNMR was 49/21/30. The weight average molecular weight found by GPC measurement as the standard polystyrene equivalent was 9,100, and the degree of dispersion was 1.4.

Synthesis Example 5

Synthesis of Resin (5) (Solvent Fraction)

Resin (5) was synthesized by polymerization and crystallization in the same manner as in Synthesis Example 4, except that 2-methyl-2-adamantyl methacrylate, dihydroxy-adamantane methacrylate, norbornanelactone acrylate and tricyclodecanyl methacrylate in proportion of 40/20/30/10 were put in a reaction vessel, the initiator was used in an amount of 1 mol %, the reaction solvent was changed to methyl ethyl ketone/tetrahydrofuran in proportion of 60/40, and reprecipitation solvent to hexane/ethyl acetate in proportion of 40/60, and resin (5) of the object was recovered.

The compositional ratio of the polymer (a/b/c) found by $^{13}$CNMR was 40/20/29/11. The weight average molecular weight found by GPC measurement as the standard polystyrene equivalent was 13,200, and the degree of dispersion was 1.3.

Synthesis Example 6

Synthesis of Resin (6) (Living Polymerization)

2-Ethyl-2-cyclohexyl methacrylate, hydroxyadamantene methacrylate, and norbornanelactone methacrylate (40/20/40), and 200 g of cyclohexanone had been prepared beforehand. Cyclohexanone (100 g) and 1.5 g of 2-(2,2,6,6-tetramethylpiperidin-1-yloxy)methyl propionate were mixed, heated at 110° C. with stirring under nitrogen atmosphere, and the monomer solution prepared in advance was dropped thereto with a dropping funnel over 3 hours. The starting time of dropping was taken as the starting time of polymerization, and polymerization reaction was performed for 48 hours. After the polymerization, the polymer solution was cooled with water to 30° C. or lower, put into 1 L of hexane, and precipitated white powder was filtered. The filtered white powder was washed twice over slurry with 500 ml of hexane, filtered, and dried at 50° C. for 17 hours to thereby obtain resin (6) as white powder.

The compositional ratio of the polymer (a/b/c) found by $^{13}$CNMR was 39/22/39. The weight average molecular weight found by GPC measurement as the standard polystyrene equivalent was 18,800, and the degree of dispersion was 1.5.

Synthesis Example 7

Synthesis of Resin (7) (Living Polymerization)

2-Methyl-2-adamantyl methacrylate and norbornane-lactone methacrylate (40/60), and 200 g of toluene had been prepared beforehand. Toluene (100 g), 2.71 g of 2-hydroxyethyl 2-bromopropionate, 10.63 g of chloroindenylbis-(triphenylphosphin)ruthenium, and 2.38 g of pentamethyl-diethylenetriamine were mixed, heated at 110° C. with stirring under nitrogen atmosphere, and the monomer solution prepared in advance was dropped thereto with a dropping funnel over 3 hours. The starting time of dropping was taken as the starting time of polymerization, and polymerization reaction was performed for 48 hours. After the polymerization, the polymer solution was cooled with water to 30° C. or lower, put into 2,000 g of methanol, and precipitated white powder was filtered. The filtered white powder was washed twice over slurry with 400 g of methanol, filtered, and dried at 50° C. for 17 hours to thereby obtain resin (7) as white powder.

The compositional ratio of the polymer (a/b) found by $^{13}$CNMR was 39/61. The weight average molecular weight found by GPC measurement as the standard polystyrene equivalent was 7,000, and the degree of dispersion was 1.3.

Synthesis Example 8

Synthesis of Resin (8) (Living Polymerization)

2-Norbornyl-2-propyl methacrylate, dihydroxy-adamantane methacrylate, and γ-butyrolactone methacrylate (30/20/50), and 200 g of cyclohexanone had been prepared beforehand. Cyclohexanone (100 g), 1.0 g of the compound shown below and 0.3 g of 2,2'-azobis-isobutyronitrile were mixed, heated at 110° C. with stirring under nitrogen atmosphere, and the monomer solution prepared in advance was dropped thereto with a dropping funnel over 3 hours. The starting time of dropping was taken as the starting time of polymerization, and polymerization reaction was performed for 48 hours. After the polymerization, the polymer solution was cooled with water to 30° C. or lower, put into 1 L of hexane, and precipitated white powder was filtered. The filtered white powder was washed twice over slurry with 500 ml of hexane, filtered, and dried at 50° C. for 17 hours to thereby obtain resin (8) as white powder.

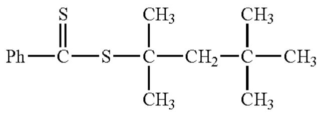

Synthesis Example 9

Synthesis of Resin (9) (Living Polymerization)

Resin (9) was synthesized by polymerization and crystallization in the same manner as in Synthesis Example 8 except that 2-adamantyl-2-propyl methacrylate, dihydroxy-adamantane methacrylate, and (7-oxynorbornane)lactone methacrylate in proportion of 35/15/50 were put in a reaction vessel, the compound shown below was used as the initiator, and the reaction solvent was changed to cyclohexanone.

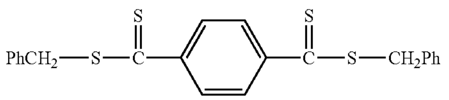

Synthesis Example 10

2-Adamantyl-2-propyl methacrylate, dihydroxyadamantene methacrylate, and norbornanelactone acrylate (50/20/30), 200 g of cyclohexanone, 0.4 mol % of 2,2'-azobis-(2,4-dimethylvaleronitrile) and 1.0 mol % of the compound shown below were mixed. The mixture was heated at 60° C. with stirring under nitrogen atmosphere, and the polymerization reaction was performed for 8 hours. After the polymerization, the polymer solution was cooled to 30° C. or lower. After that, 3 g of 2,2'-azobis-isobutyronitrile is added to the polymer solution, and the polymer solution was heated at 80° C. with stirring for 8 hours so as to subject terminals to treatment. After the reaction, the polymer solution was cooled to 30° C. or lower, and put into 2 L of hexane/ethyl acetate=90/10, and precipitated white powder was filtered. The filtered white powder was dried at 40° C. for 17 hours to thereby obtain resin (25) as white powder.

The compositional ratio of the polymer (a/b/c) found by $^{13}$CNMR was 49/20/31. The weight average molecular weight found by GPC measurement as the standard polystyrene equivalent was 8,000, and the degree of dispersion was 1.4.

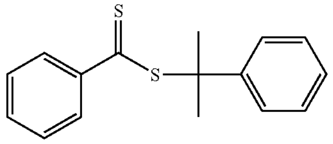

Measurement of the Proportion of a Molecular Weight of 1,000 or Less:

A molecular weight was measured according to RI of GPC. The proportion of the component having a molecular weight of 1,000 or less is a value obtained by {(A)/[(A)+(B)]}×100 (%), and this was taken as the criterion of the proportion of Mw 1,000 or less, taking the monodispersed PHS (polystyrene) having a molecular weight (Mw) of 1,000 as standard, a peak area detected on the side lower than the molecular weight of 1,000 as (A), and an area detected on the higher molecular weight side as (B).

The detailed conditions of the above measurement in the present invention are as follows.

Type of column:

TSKgel GMH (XL), TSKgel G4000H (XL),

TSKgel G3000H (XL), TSKgel G2000H (XL) (all produced by TOSOH CORPORATION)

Developing solvent: Tetrahydrofuran

Flow rate: 1 μL/min

Temperature: 40° C.

Sample concentration: 40 g/L

Injection amount of sample: 100 μL

Various resins were synthesized according to the synthesizing methods used in the above synthesis examples. The structure and composition, synthesizing method, and molecular weight of each resin are shown in Table 1 below. The composition shown is the structural number of each resin and compositional ratio (in order from the left in the structural formula).

TABLE 1

(1)

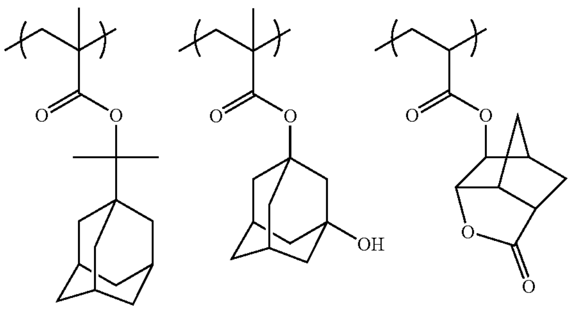

(2)

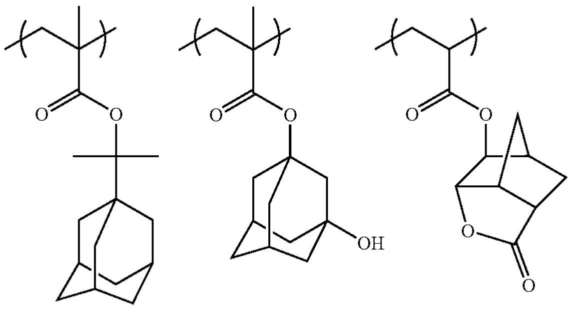

(3)

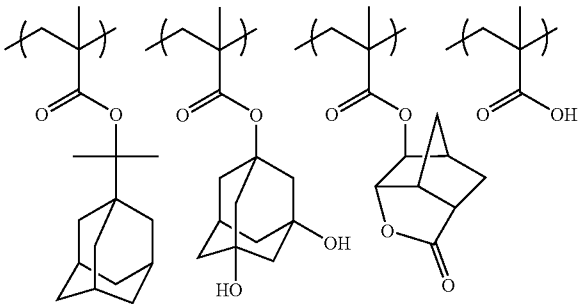

(4)
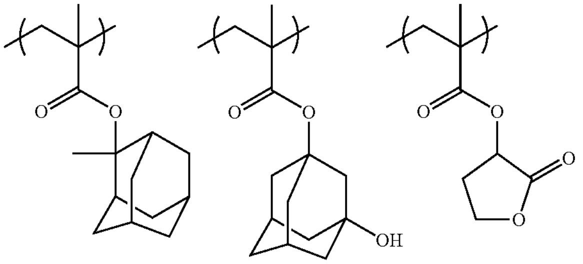
(5)
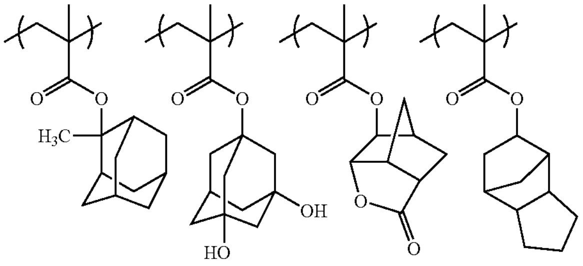
(6)
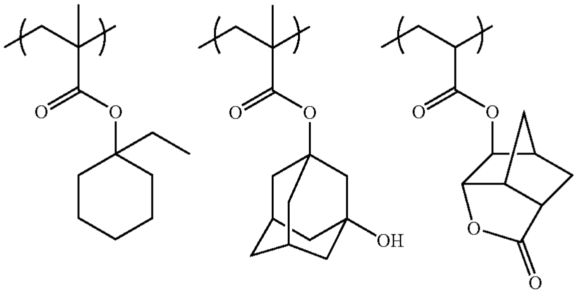
(7)
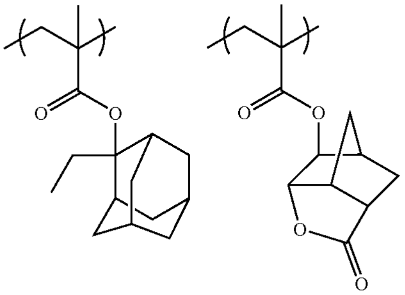
(8)
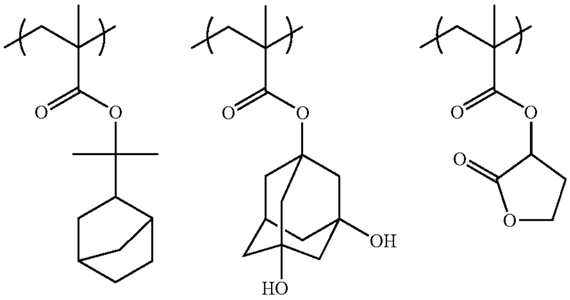
(9)
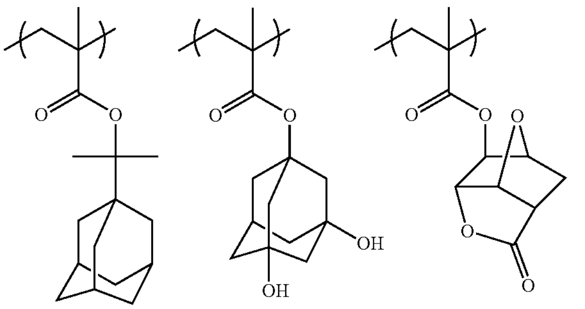
(10)
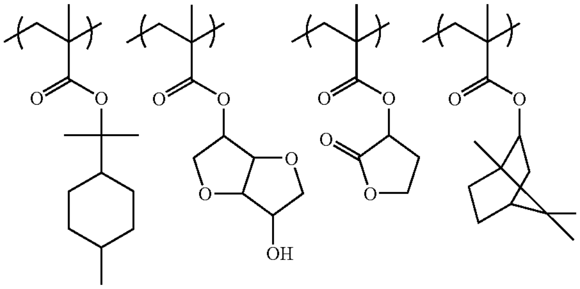
(11)
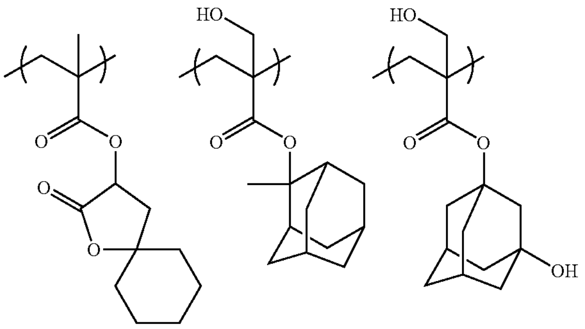
(12)
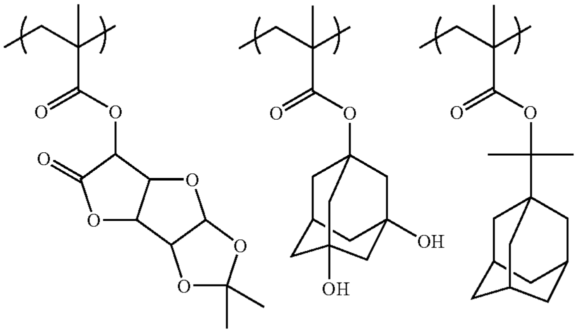

(13)
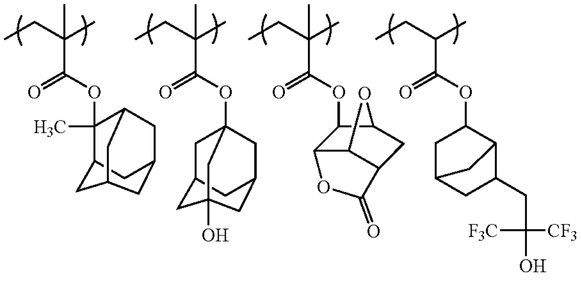
(14)
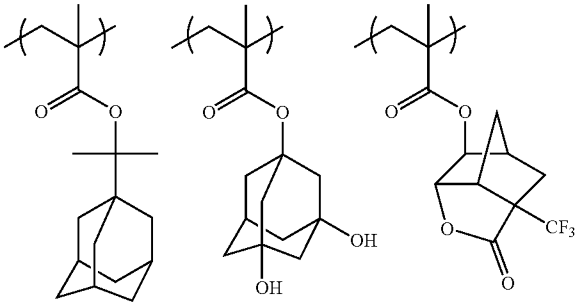
(15)
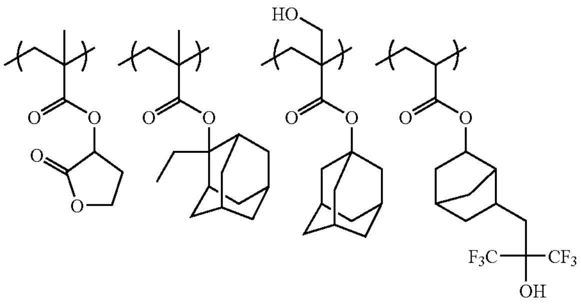
(16)
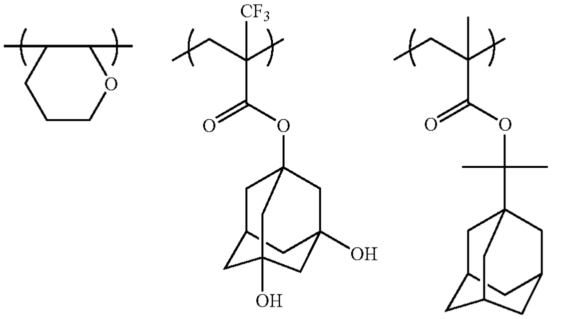
(17)
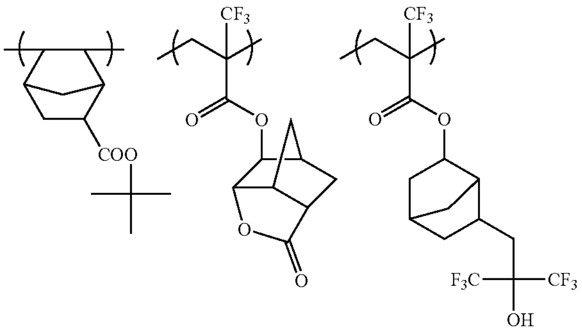
(18)
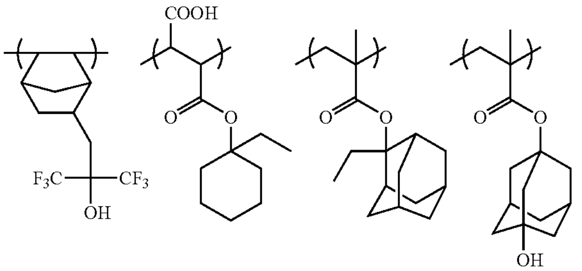
(19)
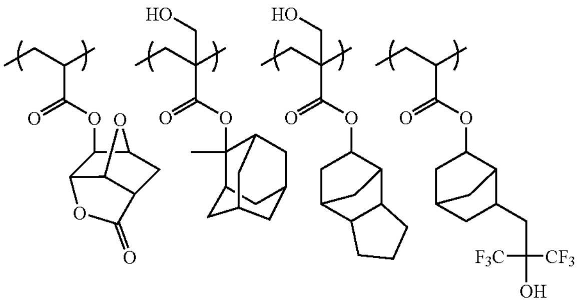
(20)
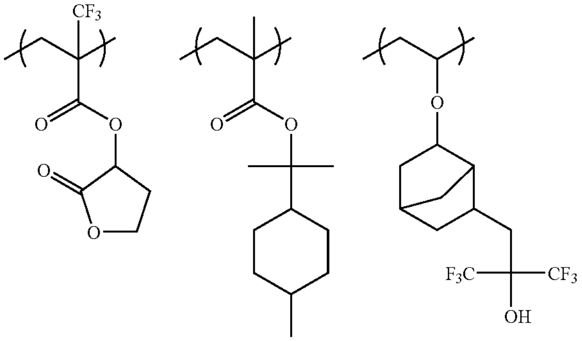
| Resin | Composition | Mw | Mw/Mn | Proportion of Mw of 1,000 or Less | Synthesis Method |
|---|---|---|---|---|---|
| 1 | (1) 39/21/41 | 9,800 | 1.9 | 35 | Synthesis Example 1 |
| 2 | (1) 41/20/39 | 10,600 | 1.4 | 10 | Synthesis Example 2 |
| 3 | (3) 30/21/39/10 | 10,200 | 1.5 | 12 | Synthesis Example 3 |

| | | | | | |
|---|---|---|---|---|---|
| 4 | (4) 49/21/30 | 9,100 | 1.4 | 8 | Synthesis Example 4 |
| 5 | (5) 40/20/29/11 | 13,200 | 1.3 | 10 | Synthesis Example 5 |
| 6 | (6) 39/22/39 | 18,800 | 1.5 | 7 | Synthesis Example 6 |
| 7 | (7) 39/61 | 7,000 | 1.3 | 4 | Synthesis Example 7 |
| 8 | (8) 30/19/51 | 10,200 | 1.4 | 5 | Synthesis Example 8 |
| 9 | (9) 35/16/49 | 12,300 | 1.3 | 6 | Synthesis Example 9 |
| 10 | (10) 40/10/39/11 | 16,800 | 1.4 | 5 | Synthesis Example 8 |
| 11 | (11) 38/40/22 | 15,200 | 1.5 | 14 | Synthesis Example 2 |
| 12 | (12) 39/20/41 | 9,800 | 1.3 | 4 | Synthesis Example 6 |
| 13 | (13) 40/12/38/10 | 26,500 | 1.4 | 16 | Synthesis Example 2 |
| 14 | (14) 42/16/42 | 32,000 | 1.4 | 7 | Synthesis Example 6 |
| 15 | (15) 39/25/31/5 | 10,400 | 1.4 | 11 | Synthesis Example 2 |
| 16 | (16) 40/30/30 | 8,500 | 1.6 | 16 | Synthesis Example 2 |
| 17 | (17) 31/29/40 | 7,200 | 1.4 | 18 | Synthesis Example 2 |
| 18 | (18) 30/11/20/39 | 6,700 | 1.5 | 15 | Synthesis Example 2 |
| 19 | (19) 40/10/39/11 | 14,200 | 1.4 | 10 | Synthesis Example 6 |
| 20 | (20) 31/29/40 | 22,000 | 1.3 | 10 | Synthesis Example 2 |
| 21 | (3) 30/20/39/11 | 10,600 | 1.6 | 40 | Synthesis Example 1 |
| 22 | (4) 50/20/30 | 7,200 | 2.0 | 25 | Synthesis Example 1 |
| 23 | (4) 49/21/30 | 5,000 | 1.3 | 30 | Synthesis Example 1 |
| 24 | (4) 51/18/31 | 60,000 | 1.4 | 25 | Synthesis Example 1 |
| 25 | (2)49/20/31 | 8,000 | 1.4 | 6 | Synthesis Example 10 |
| 26 | (12)41/18/41 | 7,000 | 1.4 | 5 | Synthesis Example 10 |

Each component shown in Table 2 below was dissolved in a solvent, and a solution having solid concentration of 5 mass % and a solution having solid concentration of 3.5 mass % were prepared, and filtered through a polyethylene filter having a pore size of 0.1 μm, whereby positive resist solutions were prepared. The obtained positive resist compositions were evaluated by the following manner, and the results obtained are shown in Table 2. When two or more components are used, the ratio is mass ratio.

Evaluation:

An organic anti-reflection film ARC29A (manufactured by Nissan Chemical Industries, Ltd.) was coated on a silicone wafer, and the coated film was baked at 205° C. for 60 seconds to form anti-reflection film having a thickness of 78 nm.

The prepared resist composition (solid concentration of 5%) was coated thereon, and baked at 115° C. for 60 seconds, whereby a resist film having a thickness of 150 nm was formed. The obtained wafer was subjected to immersion exposure with an ArF excimer laser scanner (NA 0.75). The wafer was heated at 120° C. for 60 seconds, and then subjected to development with a tetramethylammonium hydroxide aqueous solution (2.38 mass %) for 60 seconds, rinsing with pure water, and spin drying, thus a resist pattern was obtained.

For the sake of comparison, the wafer underwent dry exposure, and a resist pattern was obtained on the same condition as above.

Further, the solid concentration of the resist composition to be coated was changed to 3.5 mass % and the thickness was changed to 80 nm, and evaluated in the same manner as above (thin film immersion exposure).

Pattern Profile:

The profile of each pattern obtained was observed with a scanning electron microscope (S-4800, manufactured by Hitachi, Ltd.) and evaluated.

Pattern Collapse:

Those in which line and space pattern of 60 nm on condition that the thickness was 80 nm was formed not accompanied by collapse at all were graded A, those almost all were not collapsed were graded B, those partially collapsed were graded C, and those completely collapsed were graded D.

The resist compositions used in the evaluation and the results of evaluation are summarized in Table 2 below.

TABLE 2

| | | | | | Dry Exposure | | Immersion Exposure | | Thin Film Immersion Exposure | |
|---|---|---|---|---|---|---|---|---|---|---|
| Ex. No. | Resin | PAG | Solvent | Amine | Pattern Collapse | Profile | Pattern Collapse | Profile | Pattern Collapse | Profile |
| Comp. Ex. 1 | (1) | PAG-1 (20 mg) | SL-4/SL-5 (1/1) | N-1 (5 mg) | B | Rectangular | D | T-top | D | n.a. |
| Comp. Ex. 2 | (21) | PAG-1 (20 mg) | SL-4/SL-6 (3/2) | N-2 (8 mg) | B | Rectangular | D | T-top | D | n.a. |
| Comp. Ex. 3 | (22) | PAG-3 (30 mg) | SL-4/SL-6 (3/2) | N-3 (8 mg) | B | Rectangular | D | Taper | D | n.a. |
| Comp. Ex. 4 | (23) | PAG-3 (30 mg) | SL-4/SL-6 (3/2) | N-3 (8 mg) | B | Rectangular | D | T-top | D | n.a. |
| Comp. Ex. 5 | (24) | PAG-3 (30 mg) | SL-4/SL-6 (3/2) | N-3 (8 mg) | B | Rectangular | D | T-top | D | n.a. |
| Ex. 1 | (2) | PAG-1 (20 mg) | SL-4/SL-5 (1/1) | N-1 (5 mg) | B | Rectangular | B | Rectangular | B | Rectangular |
| Ex. 2 | (3) | PAG-5 (35 mg) | SL-4/SL-5 (1/1) | N-6 (5 mg) | B | Rectangular | B | Rectangular | B | Rectangular |
| Ex. 3 | (4) | PAG-6 (20 mg) | SL-4/SL-5 (1/1) | N-3 (8 mg) | B | Rectangular | B | Rectangular | B | Rectangular |
| Ex. 4 | (5) | PAG-8 (40 mg) | SL-4/SL-6 (3/2) | N-6 (8 mg) | B | Rectangular | B | Rectangular | B | Rectangular |
| Ex. 5 | (6) | PAG-2 (35 mg) | SL-4/SL-6 (3/2) | N-5 (8 mg) | B | Rectangular | B | Rectangular | B | A little bit T-top |

TABLE 2-continued

| | | | | | Dry Exposure | | Immersion Exposure | | Thin Film Immersion Exposure | |
|---|---|---|---|---|---|---|---|---|---|---|
| Ex. No. | Resin | PAG | Solvent | Amine | Pattern Collapse | Profile | Pattern Collapse | Profile | Pattern Collapse | Profile |
| Ex. 6 | (7) | PAG-1 (20 mg) | SL-4/SL-5 (1/1) | N-2 (5 mg) | B | Rectangular | C | Rectangular | C | Rectangular |
| Ex. 7 | (8) | PAG-2 (45 mg) | SL-4/SL-6 (3/2) | N-4 (10 mg) | B | Rectangular | B | Rectangular | B | A little bit T-top |
| Ex. 8 | (9) | PAG-8 (20 mg) PAG-5 (20 mg) | SL-2/SL-4 (1/4) | N-5 (8 mg) | B | Rectangular | B | Rectangular | B | Rectangular |
| Ex. 9 | (10) | PAG-1 (24 mg) | SL-4/SL-5/SL-7 (5/4/1) | N-2 (6 mg) | B | Rectangular | C | Rectangular | C | Rectangular |
| Ex. 10 | (11) | PAG-3 (20 mg) PAG-9 (10 mg) | SL-4 | N-5 (4 mg) | B | Rectangular | B | Rectangular | B | Rectangular |
| Ex. 11 | (12) | PAG-7 (30 mg) PAG-5 (10 mg) | SL-4/SL-5 (1/1) | N-S (10 mg) | B | Rectangular | B | Rectangular | A | Rectangular |
| Ex. 12 | (13) | PAG-8 (20 mg) | SL-4/SL-5/SL-9 (5/4/1) | N-1 (4 mg) | B | Rectangular | B | Rectangular | A | Rectangular |
| Ex. 13 | (14) | PAG-7 (30 mg) | SL-4/SL-6 (3/2) | N-S (8 mg) | B | Rectangular | B | Rectangular | A | Rectangular |
| Ex. 14 | (15) | PAG-3 (30 mg) PAG-10 (5 mg) | SL-4/SL-5 (1/1) | N-1 (3 mg) | B | Rectangular | B | Rectangular | A | Rectangular |
| Ex. 15 | (16) | PAG-4 (25 mg) | SL-4/SL-6 (3/2) | N-4 (5 mg) | B | Rectangular | C | Rectangular | C | Rectangular |
| Ex. 16 | (17) | PAG-4 (30 mg) | SL-4/SL-5 (1/1) | N-3 (10 mg) | B | Rectangular | C | Rectangular | C | Rectangular |
| Ex. 17 | (18) | PAG-3 (20 mg) PAG-6 (10 mg) | SL-4/SL-6 (3/2) | N-1 (6 mg) | B | Rectangular | B | Rectangular | B | Rectangular |
| Ex. 18 | (19) | PAG-7 (50 mg) | SL-4/SL-2 (4/1) | N-6 (8 mg) | B | Rectangular | B | Rectangular | A | Rectangular |
| Ex. 19 | (20) | PAG-6 (30 mg) | SL-4/SL-2 (1/1) | N-2 (5 mg) | B | Rectangular | C | Rectangular | C | Rectangular |
| Ex. 20 | (25) | PAG-1 (20 mg) | SL-4/SL-5 (1/1) | N-2 (8 mg) | B | Rectangular | B | Rectangular | B | Rectangular |
| Ex. 21 | (26) | PAG-3 (30 mg) | SL-4/SL-6 (3/2) | N-1 (5 mg) | B | Rectangular | B | Rectangular | B | Rectangular |

The abbreviations in Table 2 are as follows.

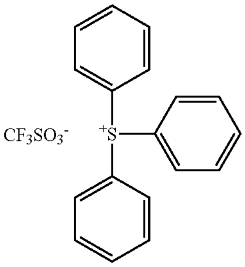

PAG-1

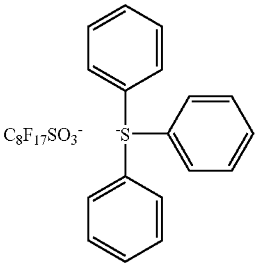

TABLE 2-continued
| | | | | | Dry Exposure | | Immersion Exposure | | Thin Film Immersion Exposure | |
|---|---|---|---|---|---|---|---|---|---|---|
| Ex. No. | Resin | PAG | Solvent | Amine | Pattern Collapse | Profile | Pattern Collapse | Profile | Pattern Collapse | Profile |
PAG-2
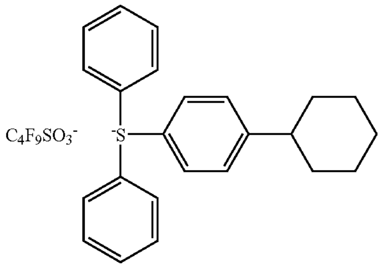
PAG-3
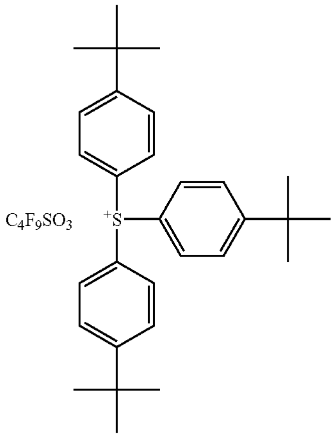
PAG-4
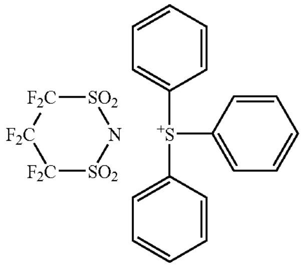
PAG-5
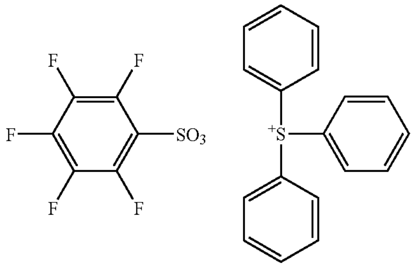

TABLE 2-continued

| | | | | | Dry Exposure | | Immersion Exposure | | Thin Film Immersion Exposure | |
|---|---|---|---|---|---|---|---|---|---|---|
| Ex. No. | Resin | PAG | Solvent | Amine | Pattern Collapse | Profile | Pattern Collapse | Profile | Pattern Collapse | Profile |

PAG-6

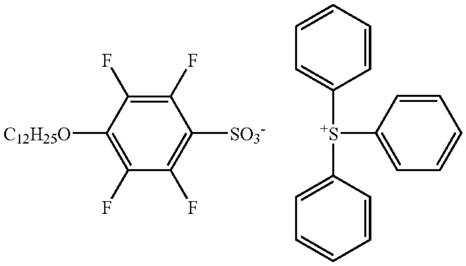

PAG-7

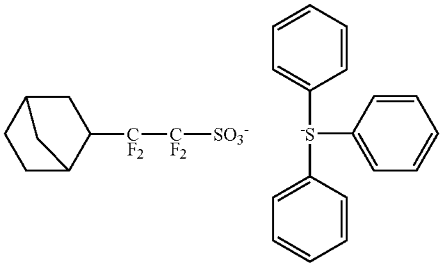

PAG-8

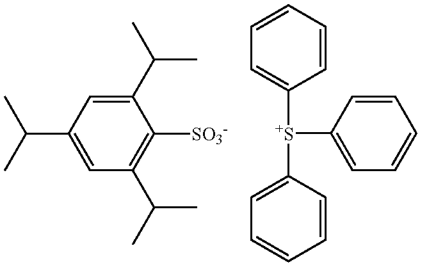

PAG-9

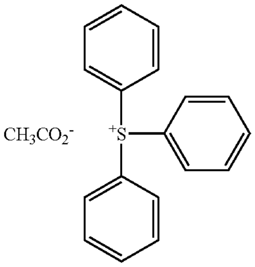

PAG-10

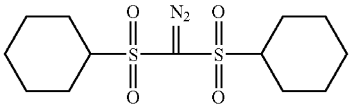

PAG-11

N-1: Dipropylaniline
N-2: Triethanolamine
N-3: Trioctylamine
N-4: Tris-2-[2-methoxy(ethoxy)]ethylamine
N-5: 2,6-Diisopropylaniline
N-6: Triphenylimidazole
SL-2: Cyclohexanone
SL-4: Propylene glycol monomethyl ether acetate
SL-5: Ethyl lactate
SL-6: Propylene glycol monomethyl ether When a plurality of resins and solvents are used, the ratio is mass ratio.

The invention can provide a resist suitable for immersion exposure extremely little in the deterioration of pattern profile and pattern collapse as compared with the time by dry exposure.

The entire disclosure of each and every foreign patent application from which the benefit of foreign priority has been claimed in the present application is incorporated herein by reference, as if fully set forth.

What is claimed is:

1. A positive resist composition for immersion exposure comprising:

(A) a resin having an alicyclic hydrocarbon structure, wherein the resin is capable of increasing a solubility of the resin (A) in an alkaline developer by an action of an acid; and (B) a compound capable of generating an acid upon irradiation with one of an actinic ray and radiation, wherein the resin (A) includes a component having a molecular weight of 1,000 or less in an area ratio of 20% or less to an entire area in a pattern area by gel permeation chromatography, wherein the resin (A) has a weight average molecular weight of from 7,000 to 50,000, and a degree of dispersion (weight average molecular weight/number average molecular weight) of 1.5 or less, wherein the resin (A) has a repeating unit having a lactone structure, and wherein the resist composition has a concentration of an entire solid content of from 2.0 to 6.0 mass %.

2. The positive resist composition according to claim 1, wherein the resin (A) is purified by a solvent fraction.

3. The positive resist composition according to claim 1, wherein the resin (A) is obtained by living radical polymerization.

4. The positive resist composition according to claim 1, wherein the resin (A) comprises (i) a repeating unit having a lactone group and (ii) a repeating unit capable of generating a leaving group having an alicyclic structure which is eliminated from the repeating unit (ii) by an action of an acid.

5. The positive resist composition according to claim 1, wherein the resin (A) comprises a fluorine atom.

6. The positive resist composition according to claim 1, which further comprises a basic compound having a structure represented by formula (A), (B), (C), (D) or (E):

(A)

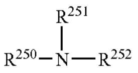

(B)

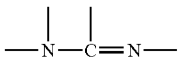

(C)

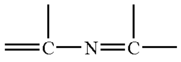

(D)

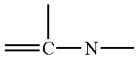

-continued (E)

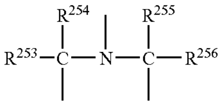

wherein in formulae (A) and (E), $R^{200}$, $R^{201}$ and $R^{202}$, which may be the same or different, each independently represents a hydrogen atom, an alkyl group having from 1 to 20 carbon atoms, a cycloalkyl group having from 1 to 20 carbon atoms or a substituted or unsubstituted aryl group having from 6 to 20 carbon atoms, and $R^{201}$ and $R^{202}$ may be bonded to each other to form a ring; and $R^{203}$, $R^{204}$, $R^{205}$ and $R^{206}$ each independently represents an alkyl group having from 1 to 6 carbon atoms or a cycloalkyl group having from 3 to 6 carbon atoms.

7. The positive resist composition according to claim 1, wherein the compound (B) capable of generating an acid has: an alkyl group having 4 or less carbon atoms substituted with a fluorine atom or an anionic structure containing an aromatic group substituted with a fluorine atom; and a triarylsulfonium cationic structure.

8. The positive resist composition according to claim 6, wherein a basic compound having a structure represented by formula (A), (B), (C), (D) or (E) does not comprise a hydroxyl group.

9. A pattern-forming method comprising:

forming a resist film with a resist composition according to claim 1;

immersion exposing the resist film, so as to form an exposed resist film; and developing the exposed resist film.

10. The positive resist composition according to claim 1, wherein the resin (A) has a repeating unit represented by formula (AII):

(AII)

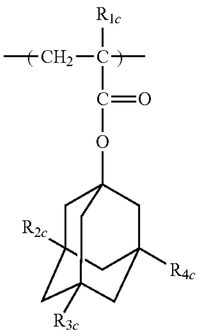

wherein $R_{1c}$ represents a hydrogen atom or a methyl group; and $R_{2c}$, $R_{3c}$ and $R_{4c}$ each independently represents a hydrogen atom or a hydroxyl group, provided that at least one of $R_{2c}$, $R_{3c}$ and $R_{4c}$ represents a hydroxyl group.

11. The positive resist composition according to claim 1, wherein the resin (A) has a repeating unit represented by any of formulae (IV), (V), (VI), (VII), (VIII) and (IX):

(IV)

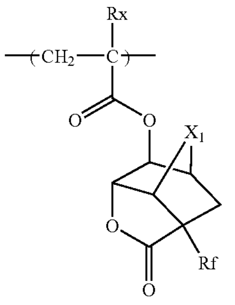

(V)

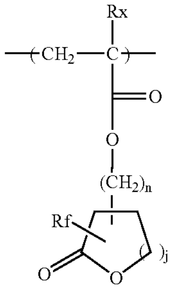

(VI)

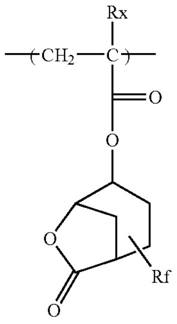

(VII)

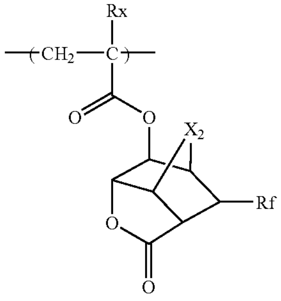

-continued (VIII)

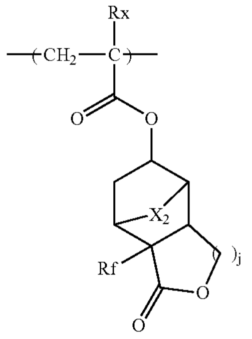

(IX)

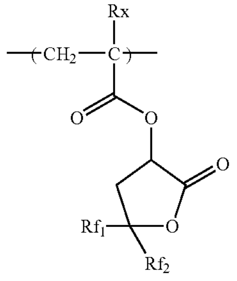

wherein $X_1$ represents an oxygen atom or a sulfur atom; $X_2$ represents a methylene group, an oxygen atom or a sulfur atom; Rx represents a hydrogen atom, a fluorine atom, a chlorine atom, a cyano group, an alkyl group, or $-L_3$-CRa, wherein $L_3$ represents an alkylene group, $-CH_2O-$, $-CH_2O(C{=}O)-$, and Ra represents a hydroxyl group, a lactone group or a fluoroalkyl group; Rf; $Rf_1$ and $Rf_2$ each independently represents a group having at least one or more fluorine atom, $Rf_1$ and $Rf_2$ may be bonded to each other to form a ring have $-(CF_2)_{n1}-$; $n_1$ represents an integer of 1 or more; and j represents an integer of 1 to 3.

12. The positive resist composition according to claim 1, wherein (i) the repeating unit having a lactone structure of resin (A) is a repeating unit represented by formula (AI):

(AI)

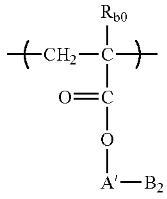

in formula (AI), $R_{b0}$ represents a hydrogen atom, a halogen atom, or a substituted or unsubstituted alkyl group having from 1 to 4 carbon atoms; A' represents a single bond, an ether group, an ester group, a carbonyl group, an alkylene group, or a divalent linking group obtained by combining these groups; and $B_2$ represents a group represented by any of formulae (LC1-1) to (LC1-12):

-continued

LC1-1

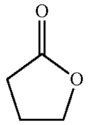

LC1-2

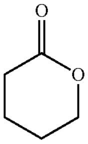

LC1-3

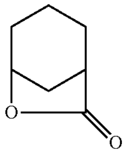

LC1-4

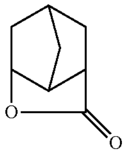

LC1-5

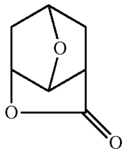

LC1-6

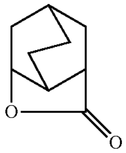

LC1-7

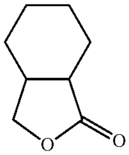

LC1-8

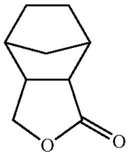

LC1-9

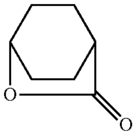

LC1-10

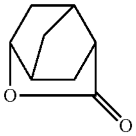

LC1-11

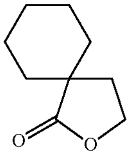

LC1-12

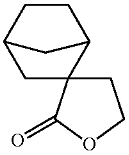

; and (ii) when $R_{b0}$ in formula (AI) represents a substituted alkyl group, the substituent of the substituted alkyl group is selected from the group consisting of an alkyl group having from 1 to 8 carbon atoms, a cycloalkyl group having from 4 to 7 carbon atoms, an alkoxyl group having from 1 to 8 carbon atoms, an alkoxycarbonyl group having from 1 to 8 carbon atoms, a carboxyl group and a cyano group.

* * * * *